US012713781B2

(12) United States Patent
Okazaki et al.

(10) Patent No.: US 12,713,781 B2
(45) Date of Patent: Aug. 18, 2026

(54) DISPLAY APPARATUS

(71) Applicant: SEMICONDUCTOR ENERGY LABORATORY CO., LTD., Atsugi (JP)

(72) Inventors: Kenichi Okazaki, Tokyo (JP); Daiki Nakamura, Atsugi (JP); Nozomu Sugisawa, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 428 days.

(21) Appl. No.: 18/567,650

(22) PCT Filed: Jun. 6, 2022

(86) PCT No.: PCT/IB2022/055233
§ 371 (c)(1),
(2) Date: Dec. 6, 2023

(87) PCT Pub. No.: WO2022/263969
PCT Pub. Date: Dec. 22, 2022

(65) Prior Publication Data

US 2024/0276789 A1 Aug. 15, 2024

(30) Foreign Application Priority Data

Jun. 18, 2021 (JP) ................................ 2021-101841

(51) Int. Cl.
*H10K 59/122* (2023.01)
*H10K 59/80* (2023.01)

(52) U.S. Cl.
CPC ..... *H10K 59/122* (2023.02); *H10K 59/80521* (2023.02); *H10K 59/873* (2023.02);
(Continued)

(58) Field of Classification Search
CPC .......... H10K 59/122; H10K 59/80521; H10K 59/876
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 109979969 A 7/2019
CN 112074894 A 12/2020
(Continued)

OTHER PUBLICATIONS

International Search Report (Application No. PCT/IB2022/055233) Dated Aug. 16, 2022.
(Continued)

*Primary Examiner* — Daniel P Shook
(74) *Attorney, Agent, or Firm* — Fish & Richardson P.C.

(57) ABSTRACT

A high-resolution display apparatus is provided. The display apparatus includes a first light-emitting device, a second light-emitting device positioned next to the first light-emitting device, a third light-emitting device positioned next to the second light-emitting device, a first insulating layer, and a second insulating layer. The first insulating layer includes a first region between the first light-emitting device and the second light-emitting device and a second region between the second light-emitting device and the third light-emitting device. The second insulating layer includes a region positioned over a lower electrode of the third light-emitting device. A thickness of a third organic compound layer of the third light-emitting device is different from a thickness of a first organic compound layer of the first light-emitting device. The thickness of the third organic compound layer of the third light-emitting device is different from a thickness
(Continued)

of a second organic compound layer of the second light-emitting device. In a cross-sectional view, the first insulating layer is provided so that a height from a bottom surface of the lower electrode of the third light-emitting device is equal to a height from a bottom surface of a lower electrode of the second light-emitting device.

8 Claims, 33 Drawing Sheets

(52) U.S. Cl.
CPC ....... *H10K 59/871* (2023.02); *H10K 59/8722* (2023.02); *H10K 59/876* (2023.02)

(56) References Cited

U.S. PATENT DOCUMENTS

| | | | |
|---|---|---|---|
| 8,969,861 | B2 | 3/2015 | Shiobara et al. |
| 9,006,755 | B2 | 4/2015 | Seo et al. |
| 9,472,601 | B2 | 10/2016 | Seo et al. |
| 10,741,619 | B2 | 8/2020 | Seo et al. |
| 11,587,981 | B2 | 2/2023 | Ikeda et al. |
| 2002/0072139 | A1 | 6/2002 | Kashiwabara |
| 2011/0148290 | A1 | 6/2011 | Oota |
| 2012/0205676 | A1 | 8/2012 | Seo et al. |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0001452 | A1 | 1/2014 | Shiobara et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2015/0221703 | A1 | 8/2015 | Seo et al. |
| 2016/0172595 | A1 | 6/2016 | Malinowski et al. |
| 2016/0315133 | A1 | 10/2016 | Sato |
| 2017/0025479 | A1 | 1/2017 | Seo et al. |
| 2017/0123268 | A1 | 5/2017 | Sasaki et al. |
| 2017/0141167 | A1 | 5/2017 | Naganuma |
| 2017/0256754 | A1 | 9/2017 | Defranco et al. |
| 2018/0190908 | A1 | 7/2018 | Ke et al. |
| 2020/0203662 | A1 | 6/2020 | Mollard et al. |
| 2021/0143227 | A1 | 5/2021 | Ikeda et al. |
| 2023/0209944 | A1 | 6/2023 | Ikeda et al. |

FOREIGN PATENT DOCUMENTS

| | | | | | |
|---|---|---|---|---|---|
| DE | 102018130137 | | | 6/2019 | |
| GB | 2570580 | | | 7/2019 | |
| GB | 2570580 | B | * | 4/2020 | ......... H01L 27/3258 |
| JP | 2000-036385 | A | | 2/2000 | |
| JP | 2003-059663 | A | | 2/2003 | |
| JP | 2008-098106 | A | | 4/2008 | |
| JP | 2008-147072 | A | | 6/2008 | |
| JP | 2008-251270 | A | | 10/2008 | |
| JP | 2012-182125 | A | | 9/2012 | |
| JP | 2014-011083 | A | | 1/2014 | |
| JP | 2014-120218 | A | | 6/2014 | |
| JP | 2014-135251 | A | | 7/2014 | |
| JP | 2014-232568 | A | | 12/2014 | |
| JP | 2015-115178 | A | | 6/2015 | |
| JP | 2016-197494 | A | | 11/2016 | |
| JP | 2016-225318 | A | | 12/2016 | |
| JP | 2017-107181 | A | | 6/2017 | |
| JP | 2019-050198 | A | | 3/2019 | |
| JP | 2019-121604 | A | | 7/2019 | |
| JP | 2019-179696 | A | | 10/2019 | |
| JP | 2020-160305 | A | | 10/2020 | |
| JP | 2021-015297 | A | | 2/2021 | |
| KR | 2014-0048088 | A | | 4/2014 | |
| KR | 2018-0083955 | A | | 7/2018 | |
| KR | 2019-0073618 | A | | 6/2019 | |
| KR | 2019-0079268 | A | | 7/2019 | |
| KR | 2021-0006409 | A | | 1/2021 | |
| TW | 201303818 | | | 1/2013 | |
| TW | 201619670 | | | 6/2016 | |
| TW | 201701030 | | | 1/2017 | |
| TW | 201807467 | | | 3/2018 | |
| WO | WO-2012/108482 | | | 8/2012 | |
| WO | WO-2019/215538 | | | 11/2019 | |

OTHER PUBLICATIONS

Written Opinion (Application No. PCT/IB2022/055233) Dated Aug. 16, 2022.
Zakhidov.A et al., "Orthogonal processing: A new strategy for organic electronics", Chem. Sci. (Chemical Science), Apr. 7, 2011, vol. 2, No. 6, pp. 1178-1182.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos. N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.
Lamprecht.B et al., "Organic optoelectronic device fabrication using standard UV photolithography", Phys. Stat. Sol. (RRL) (Physica Status Solidi. Rapid Research Letters.), Oct. 30, 2007, vol. 2, No. 1, pp. 16-18.

* cited by examiner 100
120
118a
Ha
115
118b
Hb
Hc
118c
Da
Db
Dc
103
102
101
113a
130a
111a
W
113b
130b
111b
W
127
113c
130c
111c 100
120
118a
Ha
115
118b
Hb
118c
Hc
Da
Db
Dc
103o
102
101
113a
130a
111a
W
113b
130b
111b
127
Wb
Wc
113c
130c
111c 100
104
X1
X2
Y
X
110a
110b
110c
103
110
Y1
Y2
140

FIG. 32A
FIG. 32B
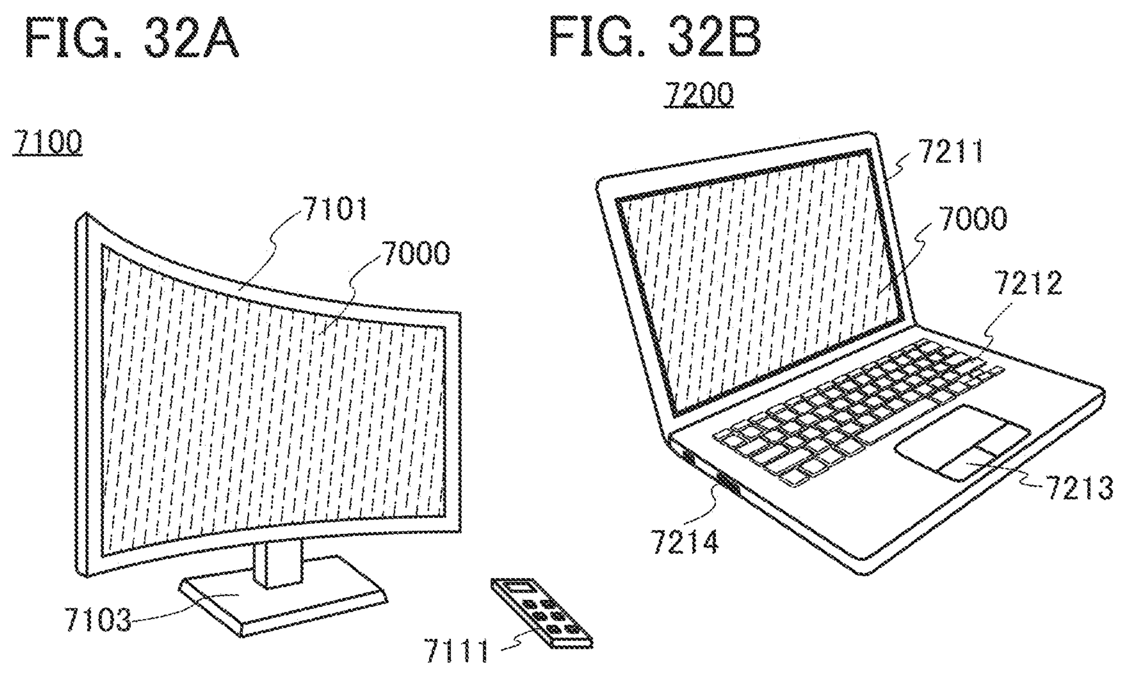
FIG. 32C
FIG. 32D
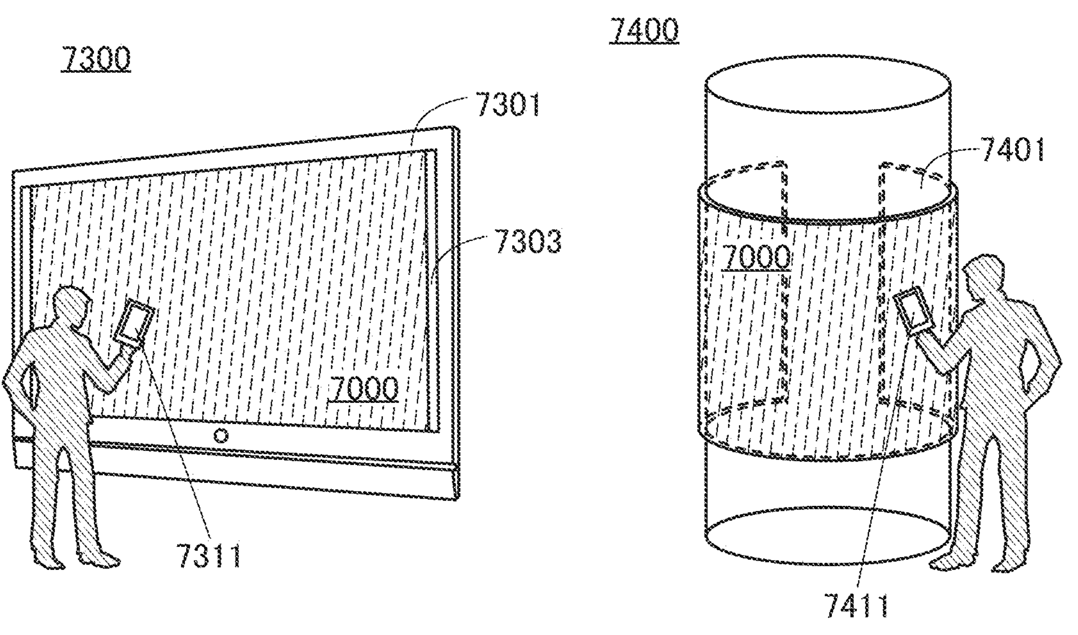

FIG. 33A
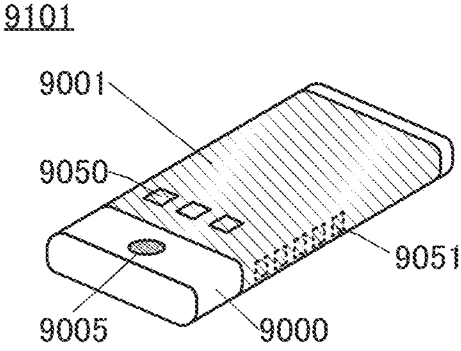
FIG. 33D
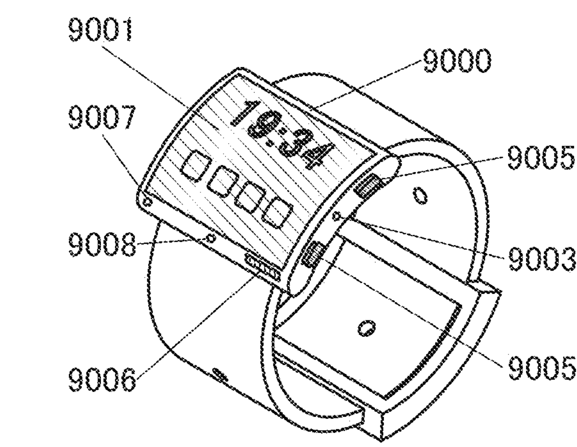
FIG. 33B
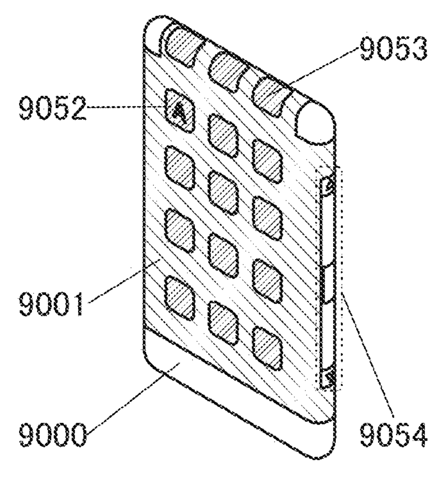
FIG. 33E
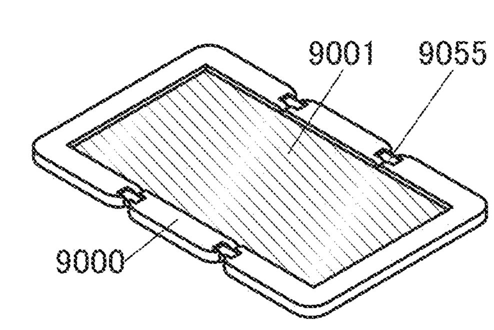
FIG. 33F
FIG. 33C
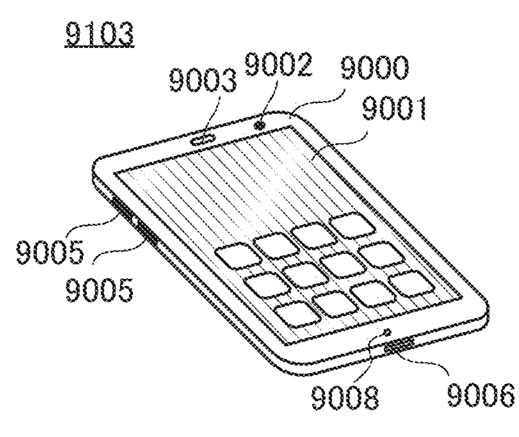
FIG. 33G
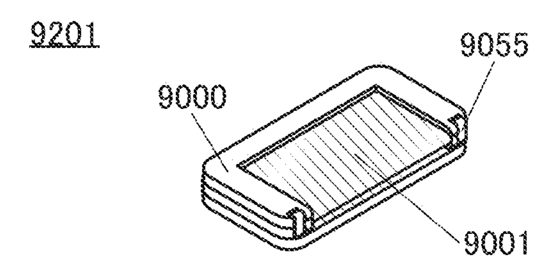

DISPLAY APPARATUS

CROSS REFERENCE TO RELATED APPLICATIONS

This application is a U.S. National Phase Application under 35 U.S.C. § 371 of International Application PCT/IB2022/055233, filed on Jun. 6, 2022, which is incorporated by reference and claims the benefit of a foreign priority application filed in Japan on Jun. 18, 2021, as Application No. 2021-101841.

TECHNICAL FIELD

One embodiment of the present invention relates to a display apparatus.

Note that one embodiment of the present invention is not limited to the above technical field. Examples of the technical field of the present invention include a semiconductor device, a light-emitting apparatus, a power storage device, a memory device, an electronic device, a lighting device, an input device (e.g., a touch sensor), and an input/output device (e.g., a touch panel). Examples of the present invention further include a method for driving any of the above devices and a method for manufacturing any of the above devices.

BACKGROUND ART

In recent years, devices for virtual reality (VR), augmented reality (AR), substitutional reality (SR), and mixed reality (MR) have been actively developed. A display apparatus mounted on any of the above devices is required to have high resolution.

Usage examples of a large display apparatus include a television device for home use (also referred to as a TV or a television receiver), digital signage, and a PID (Public Information Display).

Usage examples of a small display apparatus include a portable information terminal device such as a smartphone including a touch panel and a tablet terminal including a touch panel.

As light-emitting elements mounted on the above display apparatuses, light-emitting elements utilizing an electroluminescence (hereinafter referred to as EL) phenomenon have been developed. Light-emitting elements utilizing an EL phenomenon are suitable for a reduction in thickness and weight of display apparatuses.

As a structure of a light-emitting element, Patent Document 1 discloses a microcavity structure.

As a method for fabricating a light-emitting element, Non-Patent Document 1 discloses a fabrication method using standard UV photolithography.

REFERENCES

Patent Document

[Patent Document 1] Japanese Published Patent Application No. 2017-107181

Non-Patent Document

[Non-Patent Document 1] B. Lamprecht et al., "Organic optoelectronic device fabrication using standard UV photolithography" phys. stat. sol. (RRL) 2, No. 1, p. 16-18 (2008)

SUMMARY OF THE INVENTION

Problems to be Solved by the Invention

Patent Document 1 described above also describes formation of a light-emitting layer or the like included in a light-emitting element with use of a fine metal mask. However, with use of a fine metal mask, a deviation from the designed shape and position of a light-emitting layer might occur and thus design is made in consideration of the deviation, so that it is difficult to increase the resolution of a display apparatus.

The causes of the occurrence of the deviation are, for example, low dimensional accuracy of a fine metal mask, a misalignment of a fine metal mask, a warp of a fine metal mask, and the expansion of an outline of a deposited light-emitting layer or the like. The manufacturing yield of a display apparatus might be reduced because of deformation of a fine metal mask due to heat in evaporation. Because of the expansion of an outline of a deposited light-emitting layer or the like, the thickness of an end portion of the light-emitting layer or the like is reduced and the film thickness of the light-emitting layer is varied, which might reduce reliability of a display apparatus.

It is difficult to increase the resolution of a display apparatus by the method of Non-Patent Document 1 described above, and a reduction in reliability and yield of the display apparatus is also concerned.

In view of the above, an object of one embodiment of the present invention is to provide a high-resolution display apparatus. An object of one embodiment of the present invention is to provide a highly reliable display apparatus.

Note that the description of these objects does not preclude the existence of other objects. These objects should be construed as being independent of one another and one embodiment of the present invention does not need to achieve all the objects. Other objects can be derived from the description of the specification, the drawings, and the claims, which are the present specification and the like.

Means for Solving the Problems

One embodiment of the present invention is a display apparatus including a first light-emitting device, a second light-emitting device, a third light-emitting device, an first insulating layer including a first region between the first light-emitting device and the second light-emitting device and a second region between the second light-emitting device and the third light-emitting device, and a second insulating layer including a region positioned over a lower electrode of the third light-emitting device. A thickness of a third organic compound layer of the third light-emitting device is different from a thickness of a first organic compound layer of the first light-emitting device. The thickness of the third organic compound layer of the third light-emitting device is different from a thickness of a second organic compound layer of the second light-emitting device. In a cross-sectional view, the first insulating layer is positioned in a region where a height from a bottom surface of the lower electrode of the third light-emitting device is equal to a height from a bottom surface of a lower electrode of the second light-emitting device. That is, in the display apparatus, heights of formation surfaces of the first insulating layer are substantially equal to each other.

One embodiment of the present invention is a display apparatus including a first light-emitting device, a second light-emitting device, a third light-emitting device, an first insulating layer including a first region between the first light-emitting device and the second light-emitting device and a second region between the second light-emitting device and the third light-emitting device, and a second insulating layer including a region overlapping with a lower electrode of the third light-emitting device. A thickness of a third organic compound layer of the third light-emitting device is smaller than a thickness of a first organic compound layer of the first light-emitting device. The thickness of the third organic compound layer of the third light-emitting device is smaller than a thickness of a second organic compound layer of the second light-emitting device. In a cross-sectional view, the first insulating layer is positioned in a region where a height from a bottom surface of the lower electrode of the third light-emitting device is equal to a height from a bottom surface of a lower electrode of the second light-emitting device. That is, in the display apparatus, heights of formation surfaces of the first insulating layer are substantially equal to each other.

Any of the embodiments of the present invention preferably includes a first sacrificial layer selectively provided over the first organic compound layer, a second sacrificial layer selectively provided over the second organic compound layer, and a third sacrificial layer selectively provided over the third organic compound layer.

One embodiment of the present invention is a display apparatus including a first conductive layer and a second conductive layer each provided over a first layer, a first organic compound layer including a region overlapping with the first conductive layer, a first insulating layer including a region overlapping with the second conductive layer, a second organic compound layer including a region overlapping with the second conductive layer and the first insulating layer, a first sacrificial layer including a region overlapping with the first organic compound layer, a second sacrificial layer including a region overlapping with the second organic compound layer, a second insulating layer including a region overlapping with the first sacrificial layer and the second sacrificial layer, and a third conductive layer including a region overlapping with the second insulating layer. A distance between the second conductive layer and the third conductive layer is different from a distance between the first conductive layer and the third conductive layer. Between the first conductive layer and the second conductive layer, the first layer includes a first depressed portion and a second depressed portion deeper than the first depressed portion. The first insulating layer overlaps with the second depressed portion. The second insulating layer overlaps with the first depressed portion and the second depressed portion.

One embodiment of the present invention is a display apparatus including a first conductive layer and a second conductive layer each provided over a first layer, a first organic compound layer including a region overlapping with the first conductive layer, a first insulating layer including a region overlapping with the second conductive layer, a second organic compound layer including a region overlapping with the second conductive layer and the first insulating layer, a first sacrificial layer including a region overlapping with the first organic compound layer, a second sacrificial layer including a region overlapping with the second organic compound layer, a second insulating layer including a region overlapping with the first sacrificial layer and the second sacrificial layer, and a third conductive layer including a region overlapping with the second insulating layer. A distance between the second conductive layer and the third conductive layer is shorter than a distance between the first conductive layer and the third conductive layer. Between the first conductive layer and the second conductive layer, the first layer includes a first depressed portion and a second depressed portion deeper than the first depressed portion. The first insulating layer overlaps with the second depressed portion. The second insulating layer overlaps with the first depressed portion and the second depressed portion.

Any of the embodiments of the present invention preferably includes a protective layer over the third conductive layer.

Effect of the Invention

With one embodiment of the present invention, a high-resolution display apparatus can be provided. With one embodiment of the present invention, a highly reliable display apparatus can be provided.

Note that the description of these effects does not preclude the existence of other effects. These effects should be construed as being independent of one another and one embodiment of the present invention does not need to have all the effects. Other effects can be derived from the description of the specification, the drawings, and the claims, which are the present specification and the like.

BRIEF DESCRIPTION OF THE DRAWINGS

FIG. 9A to FIG. 9C are diagrams illustrating a method for manufacturing a display apparatus of one embodiment of the present invention.

FIG. 11A to FIG. 1C are diagrams illustrating a method for manufacturing a display apparatus of one embodiment of the present invention.

FIG. 16A and FIG. 16B are diagrams illustrating a method for manufacturing a display apparatus of one embodiment of the present invention.

FIG. 17 is a diagram illustrating a method for manufacturing a display apparatus of one embodiment of the present invention.

FIG. 23 is a cross-sectional view of a display apparatus of one embodiment of the present invention.

FIG. 25 is a cross-sectional view of a display apparatus of one embodiment of the present invention.

FIG. 32A to FIG. 32D are diagrams illustrating electronic devices of embodiments of the present invention.

FIG. 33A to FIG. 33G are diagrams illustrating electronic devices of embodiments of the present invention.

MODE FOR CARRYING OUT THE INVENTION

Figures 1A, 1B:
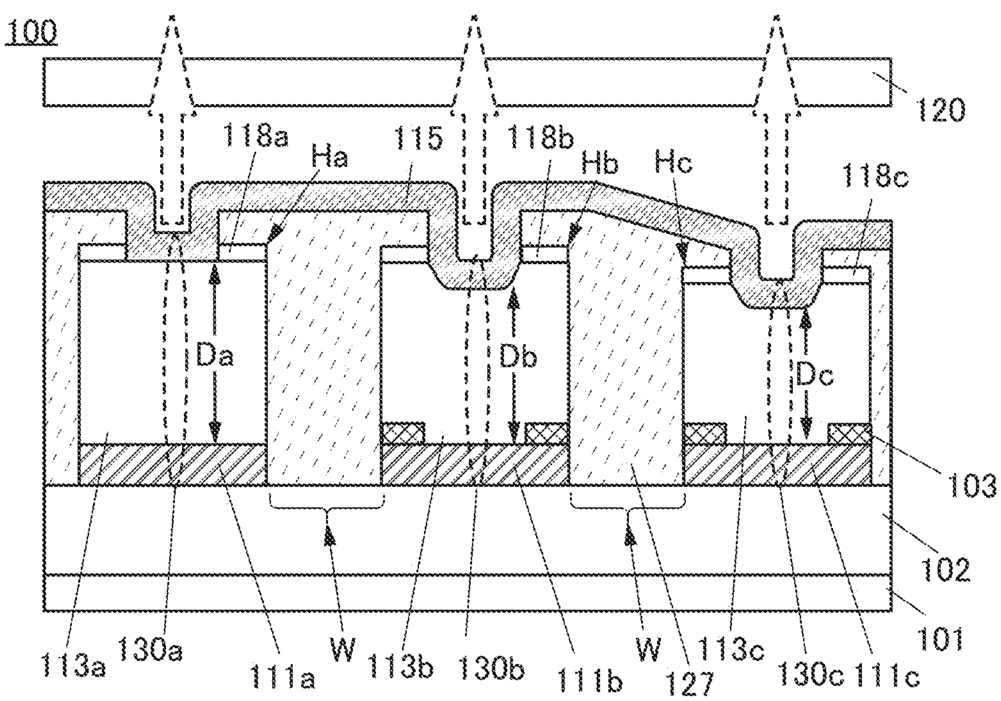
FIG. 1A and FIG. 1B are cross-sectional views of a display apparatus of one embodiment of the present invention.

In this specification and the like, components are classified based on their functions and the components are described using independent blocks in a diagram in some cases; however, it is difficult to classify actual components based on their functions, and one component may have a plurality of functions.

In this specification and the like, the terms "source" and "drain" of a transistor interchange with each other depending on the polarity of the transistor or the levels of potentials applied to the terminals. In general, in an n-channel transistor, a terminal to which a lower potential is supplied is called a source, and a terminal to which a higher potential is supplied is called a drain. In a p-channel transistor, a terminal to which a lower potential is supplied is called a drain, and a terminal to which a higher potential is supplied is called a source. In this specification and the like, for the sake of convenience, the connection relationship of a transistor is sometimes described assuming that the source and the drain are fixed; in reality, the names of the source and the drain interchange with each other according to the above relationship of the potentials.

In this specification and the like, a "source" of a transistor means a source region that is part of a semiconductor layer functioning as an active layer or means a source electrode connected to the semiconductor layer. Similarly, a drain of a transistor means a drain region that is part of the semiconductor film or a drain electrode connected to the semiconductor film. Moreover, a gate of a transistor means a gate electrode.

In this specification and the like, a state where transistors are connected in series means, for example, a state where only one of a source and a drain of a first transistor is connected to only one of a source and a drain of a second transistor. In addition, a state where transistors are connected in parallel means a state where one of a source and a drain of a first transistor is connected to one of a source and a drain of a second transistor and the other of the source and the drain of the first transistor is connected to the other of the source and the drain of the second transistor.

In this specification and the like, connection is sometimes referred to as electrical connection and may refer to a state where a current, a voltage, or a potential can be supplied or transmitted. Accordingly, connection may refer to connection via an element such as a wiring, a resistor, a diode, or a transistor. Electrical connection may refer to direct connection without via an element such as a wiring, a resistor, a diode, or a transistor.

In this specification and the like, a first electrode and a second electrode are used for description of a source and a drain of a transistor in some cases; when one of the first electrode and the second electrode refers to a source, the other thereof refers to a drain.

In this specification and the like, a conductive layer sometimes has a plurality of functions such as those of a wiring and an electrode.

In this specification and the like, a light-emitting element is sometimes referred to as a light-emitting device. A light-emitting device has a structure in which an organic compound layer is interposed between a pair of electrodes. The pair of electrodes consist of an anode and a cathode, and at least one of layers in the organic compound layer is a light-emitting layer.

In this specification and the like, a light-emitting device including an organic compound layer formed using a metal mask (MM) is sometimes referred to as a light-emitting device having a metal mask (MM) structure.

A metal mask is sometimes referred to as a fine metal mask (FMM, a high-resolution metal mask) depending on the minuteness of its opening portions.

In this specification and the like, a light-emitting device including an organic compound layer formed without using a metal mask or a fine metal mask is sometimes referred to as a light-emitting device having a metal maskless (MML) structure.

In this specification and the like, light-emitting devices exhibiting, for example, red, green, and blue are sometimes referred to as a red light-emitting device, a green light-emitting device, and a blue light-emitting device, respectively.

In this specification and the like, a structure in which light-emitting layers of light-emitting devices are separately formed is sometimes referred to as an SBS (Side By Side) structure. For example, fabrication of a red light-emitting device, a green light-emitting device, and a blue light-emitting device with an SBS structure enables a full-color display apparatus.

In this specification and the like, a light-emitting device capable of emitting white light is sometimes referred to as a white light-emitting device. Note that a combination of white light-emitting devices with coloring layers (e.g., color filters) enables a full-color display apparatus.

Light-emitting devices can be classified roughly into a single structure and a tandem structure. A single structure is a structure including one light-emitting unit between a pair of electrodes. The light-emitting unit refers to a stack, which is an organic compound layer including one or more light-emitting layers.

A white light-emitting device with a single structure is obtained when two light-emitting layers are included in a light-emitting unit, and the emission colors of the light-emitting layers are complementary colors. The two or more light-emitting layers may be in contact with each other in the light-emitting unit. A white light-emitting device can be obtained also when a light-emitting unit includes three light-emitting layers. In the case where the three light-emitting layers are included, upper and lower light-emitting layers adjacent to each other may be in contact with each other in the light-emitting unit.

A tandem structure is a structure including two or more light-emitting units between a pair of electrodes. Each of the two or more light-emitting units preferably includes one or more light-emitting layers. In the tandem structure, an intermediate layer such as a charge-generation layer is suitably provided between the plurality of light-emitting units. In other words, the tandem structure preferably includes a first light-emitting unit, a charge-generation layer, and a second light-emitting unit between the pair of electrodes.

To obtain a white light-emitting device having a tandem structure, the light-emitting device is configured to obtain white light emission by combining light from light-emitting layers of two or more light-emitting units. Note that in the combination of light-emitting layers capable of white light emission, light of complementary colors is emitted as in the single structure.

When the above white light-emitting device (having a single structure or a tandem structure) and the light-emitting device having an SBS structure are compared to each other, the light-emitting device having an SBS structure can have lower power consumption than the white light-emitting device (having a single structure or a tandem structure). That is, the light-emitting device having an SBS structure is suitable for the case where the power consumption is required to be low. Meanwhile, the manufacturing process of the white light-emitting device (having a single structure or a tandem structure) is simpler than that of a light-emitting device having an SBS structure, so that the manufacturing cost can be reduced or the manufacturing yield can be improved. That is, in order to reduce the manufacturing cost or improve the manufacturing yield, the white light-emitting device (having a single structure or a tandem structure) is suitably used.

Next, embodiments are described in detail with reference to the drawings. Note that the present invention is not limited to the following description, and it will be readily understood by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, a display apparatus of one embodiment of the present invention will be described. Note that a structure including a light-emitting device is described as a display apparatus, and is sometimes referred to as a light-emitting apparatus.

Structure Example 1

FIG. 1A illustrates a cross-sectional view of a display apparatus 100. The display apparatus 100 includes a layer 102 over a substrate 101. The layer 102 is preferably a layer including a transistor. With the transistor, a light-emitting device can be controlled. A structure in which transistors for controlling light-emitting devices are provided in the layer 102 or the like is referred to as an active display apparatus. Note that the layer 102 is not necessarily provided with a transistor.

The display apparatus 100 includes a light-emitting device 130*a*, a light-emitting device 130*b*, and a light-emitting device 130*c* over the layer 102. As each of the light-emitting device 130*a*, the light-emitting device 130*b*, and the light-emitting device 130*c*, an OLED (Organic Light Emitting Diode), a QLED (Quantum-dot Light Emitting Diode), or the like is preferably used.

In this embodiment, the light-emitting device 130*a* to the light-emitting device 130*c* are formed employing the SBS structure and emit red, green, and blue, respectively. For example, the light-emitting device 130*a* can emit red, the light-emitting device 130*b* positioned next to the light-emitting device 130*a* can emit green, and the light-emitting device 130*c* positioned next to the light-emitting device 130*b* can emit blue. Note that when the light-emitting devices do not need to be distinguished from each other and are collectively denoted, the term "light-emitting device 130" may be used.

The light-emitting device 130 includes a lower electrode and an upper electrode as a pair of electrodes and includes an organic compound layer between the pair of electrodes. The display apparatus 100 includes a conductive layer 111*a*, a conductive layer 111*b*, and a conductive layer 111*c* as lower electrodes. Note that when the conductive layers do not need to be distinguished from each other and are collectively denoted, the term "conductive layer 111" may be used.

In the case where the top surface of the layer 102 is the formation surface of the conductive layer 111, the top surface of the layer 102 preferably has high planarity. The top surface of the conductive layer 111 formed in a region with high planarity can maintain planarity. An organic compound layer 113 is preferably formed over the conductive layer 111 maintaining planarity, in which case the organic compound layer 113 is not cut. Cutting due to a step in a formation surface is sometimes called disconnection.

The conductive layer 111 is formed over the layer 102 so as to be electrically connected to the transistor. Here, when an opening portion is formed in the layer 102, the top surface of the conductive layer 111 may have a depressed portion along the opening portion. To improve planarity, an insulating layer that fills the depressed portion may be provided.

When the depressed portion is flattened, the planarity of the top surface of the conductive layer 111 overlapping with the depressed portion is also ensured. Therefore, as described above, disconnection of the organic compound layer formed over the conductive layer 111 can be suppressed.

The display apparatus 100 includes a conductive layer 115 as the upper electrode. The conductive layer 115 does not need to be divided for each light-emitting device. Therefore, the conductive layer 115 can be shared by the light-emitting devices. A layer that can be shared by the light-emitting devices is referred to as a common layer in some cases. The conductive layer 115 has a function of an electrode and thus is referred to as a common electrode in some cases. Needless to say, the conductive layer 115 may be divided for each light-emitting device. When divided conductive layers are distinguished from each other, a, b, and c are added to the reference numerals.

Although a conductive layer is described as an example of a common layer, an insulating layer can be a common layer. Alternatively, one or two or more layers selected from layers in the organic compound layer can be a common layer.

One of the lower electrode and the upper electrode functions as an anode of the light-emitting device and the other functions as a cathode of the light-emitting device.

The light-emitting device 130*a* to the light-emitting device 130*c* include an organic compound layer 113*a*, an organic compound layer 113*b*, and an organic compound layer 113*c*, respectively. When the organic compound layers do not need to be distinguished from each other and are collectively denoted, the term "organic compound layer 113" may be used.

The organic compound layer 113 includes at least a light-emitting layer. The organic compound layer 113 is preferably a stack of a light-emitting layer and other functional layers. Other functional layers include one or two or more layers selected from a hole-injection layer, a hole-transport layer, an electron-transport layer, and an electron-injection layer.

The display apparatus 100 includes a substrate 120. The substrate 120 is referred to as a counter substrate in some cases. As indicated by the arrow in FIG. 1A, light from the light-emitting device 130 can be extracted from the substrate 120 side. The structure in which extraction is performed on the substrate 120 side is referred to as a top-emission structure in some cases. In the display apparatus 100, light from the light-emitting device 130 may be extracted from the substrate 101 side. The structure in which extraction is performed on the substrate 101 side is referred to as a bottom-emission structure in some cases.

The light-emitting device of one embodiment of the present invention preferably has a microcavity structure. The microcavity structure is a structure in which a specific wavelength λ is resonated between an electrode on the side from which light is extracted and an electrode counter to the aforementioned electrode. For example, a conductive material having a light-transmitting property and a light-reflecting property is used for the electrode on the side on which extraction is performed. Such an electrode may be referred to as a transflective electrode, which can employ a structure in which a reflective electrode and a transparent electrode are stacked. A conductive material having a light-reflecting property can be used for the counter electrode, and such an electrode may be referred to as a reflective electrode. The counter electrode may also employ a structure in which a reflective electrode and a transparent electrode are stacked. Light passing through the transparent electrode is reflected by the reflective electrode, whereby a microcavity structure can be obtained. In the case of a top-emission structure, for example, the upper electrode is an electrode on the side on which extraction is performed and the lower electrode is an electrode counter to the upper electrode.

The specific wavelength λ corresponds to the wavelength λ of light extracted from the light-emitting device. Since the specific wavelength λ is different between the light-emitting devices, the distance between the electrodes varies in the display apparatus having a microcavity structure. Note that the distance between the electrodes corresponds to the distance between surfaces that reflect light. In the case where the counter electrode employs a stacked-layer structure of a reflective electrode and a transparent electrode, for example, a surface that reflects light is the surface of the reflective electrode. Therefore, the top surface of the reflective electrode is used as a starting point or an ending point of the distance between the electrodes. Since such a structure is employed, the thickness of the organic compound layer is different between the light-emitting devices in the display apparatus having a microcavity structure.

The wavelength λ is resonated when it is satisfied that the distance between the electrodes, i.e., the optical distance is $n\lambda/2$ (note that n is an integer greater than or equal to 1 and λ is the wavelength of a color desired to be resonated, e.g., the wavelength of blue). In the above formula, the value of n is a given integer and the value of n may be different between the light-emitting devices. The distance in the red light-emitting device or the green light-emitting device may be calculated with n of 1 and the distance in the blue light-emitting device may be calculated with n of 2. When the value of n is small, the film thickness of the organic compound layer of the blue light-emitting device might be extremely small. In the case where the film thickness of the organic compound layer of the blue light-emitting device is made large, the value of n used for the blue light-emitting device is preferably set larger than the value of n used for the red or blue light-emitting device.

In a microcavity structure, light with a wavelength that is not resonated is attenuated. Therefore, light with a small half width, i.e., a small spectrum half width can be extracted from the light-emitting device. Light with a small half width has high directivity and is preferable, and light with high color purity can be extracted from the light-emitting device.

In FIG. 1A, the light-emitting device 130 employs the microcavity structure. Therefore, a thickness Da of the organic compound layer 113*a* is different from a thickness Db of the organic compound layer 113*b*. The thickness Db is different from a thickness Dc of the organic compound layer 113*c*. FIG. 1A exemplifies the organic compound layers 113 having the relation of the thickness Da>the thickness Db>the thickness Dc.

The thickness Da of the organic compound layer corresponds to the distance between the top surface of the conductive layer 111*a* and the bottom surface of the conductive layer 115. The thickness Db of the organic compound layer corresponds to the distance between the top surface of the conductive layer 111*b* and the bottom surface of the conductive layer 115. The thickness Dc of the organic compound layer corresponds to the distance between the top surface of the conductive layer 111*c* and the bottom surface of the conductive layer 115.

In one embodiment of the present invention, patterning is performed by a lithography method or the like to shorten the interval between adjacent organic compound layers. As the lithography method, a photolithography method can be employed. Photolithography is a method in which light exposure is performed on a photosensitive substance to draw a desired pattern thereon and then a pattern is formed from an exposed portion and a non-exposed portion. As the light exposure, reduction exposure with use of a stepper can be employed.

In the manufacturing method of one embodiment of the present invention, the organic compound layer can be patterned by a photolithography method. Specifically, according to the manufacturing method of one embodiment of the present invention, the interval between adjacent organic compound layers 113 (e.g., the interval indicated by W in FIG. 1A) can be less than 10 μm, less than or equal to 5 μm, less than or equal to 3 μm, less than or equal to 2 μm, or less than or equal to 1 μm, and a high-resolution display apparatus can be provided.

Furthermore, in the manufacturing method of one embodiment of the present invention, a light-exposure apparatus for LSI (large scale integration) can also be used. With use of the light-exposure apparatus, the interval (e.g., the interval indicated by W in FIG. 1A) can be less than or equal to 500 nm, less than or equal to 200 nm, less than or equal to 100 nm, or less than or equal to 50 nm.

Meanwhile, by a method in which the organic compound layer is patterned with use of a fine metal mask in vacuum evaporation, it is difficult to shorten the interval between adjacent organic compound layers. Typically, making the interval between adjacent organic compound layers less than or equal to 10 μm is difficult with use of a fine metal mask.

Note that the manufacturing method of one embodiment of the present invention may employ a combination of a patterning method employing a photolithography method and a patterning method using a metal mask (including a fine metal mask or a rough metal mask).

Patterning employing a photolithography method or the like may be simply referred to as processing. The side surface of the processed organic compound layer 113 often rises perpendicularly or substantially perpendicularly to the substrate 101 or the like as illustrated in FIG. 1A. In other words, according to the manufacturing method of one embodiment of the present invention, the outline of the organic compound layer 113 does not expand.

The organic compound layer 113 of one embodiment of the present invention has a shape rising perpendicularly or substantially perpendicularly to the substrate 101 or the like, so that disconnection of a common layer is concerned. As the common layer, the above-described conductive layer 115 is given. Disconnection of the conductive layer 115 causes non-light emission of the light-emitting device, leading to a defect of the display apparatus 100.

In view of the above, in the display apparatus 100 of one embodiment of the present invention, an insulating layer 127 is provided between the organic compound layers 113 to reduce a step at the side surface of the organic compound layer 113. For example, when the insulating layer 127 positioned between the organic compound layers 113 is included, disconnection of a common layer can be suppressed.

The insulating layer 127 contains an inorganic material or an organic material. In the case of an organic material, the interval indicated by W in FIG. 1A is easily filled though being short, which is preferable. In the case of using an organic material, the viscosity of the organic material may be adjusted with use of a diluent. In the case of using a photosensitive (negative or positive) organic material, an end portion of the insulating layer 127 can be provided with a tapered shape depending on light exposure conditions. The end portion of the insulating layer 127 is one of regions where a common layer is most easily disconnected, but formation of a common layer along the tapered shape can suppress disconnection, which is preferable. Furthermore, the insulating layer 127 preferably has a flat top surface.

The insulating layer 127 has either a single-layer structure or a stacked-layer structure. In the case of a stacked-layer structure, an organic material is preferably used for an insulating layer positioned on the upper side.

With the insulating layer 127, peeling of the light-emitting device 130, e.g., the organic compound layer 113 can also be suppressed.

With the insulating layer 127, a short circuit between the conductive layer 115 and the conductive layer 111 can also be suppressed.

To obtain the above-described effect, the insulating layer 127 is positioned between the organic compound layers 113. In the case where the insulating layer 127 is positioned between the organic compound layers 113, for example, even if the insulating layer 127 does not exist and a gap is observed in a portion between the organic compound layers 113 in a cross-sectional view, it is allowable as long as any one of the above-described effects can be obtained.

Even if the top surface of the insulating layer 127 has an uneven shape, it is allowable as long as any one of the above-described effects can be obtained.

To employ the photolithography method of one embodiment of the present invention, the light-emitting devices 130 preferably include a sacrificial layer 118*a*, a sacrificial layer 118*b*, and a sacrificial layer 118*c* as illustrated in FIG. 1A. When the sacrificial layers do not need to be distinguished from each other and are collectively denoted, the term "sacrificial layer 118" may be used. The sacrificial layer 118 is formed over a surface to be processed of the organic compound layer 113 and can suppress unnecessary processing of the organic compound layer 113. Needless to say, processing of the organic compound layer 113 by a photolithography method can also be performed without the sacrificial layer 118.

The sacrificial layer 118 has either a single-layer structure or a stacked-layer structure. In the case of a stacked-layer structure, a metal material is preferably used for a sacrificial layer positioned on the upper side. A sacrificial layer containing a metal material can be used as a hard mask.

The sacrificial layer 118 can be positioned between the top surface of the organic compound layer 113 and the insulating layer 127. In the case of using a photosensitive substance for the insulating layer 127, the organic compound layer 113 in contact with the insulating layer 127 might disappear; however, as an effect of the above-described placement, the disappearance can be partly suppressed. Needless to say, the insulating layer 127 is also in contact with the side surface of the organic compound layer 113, so that in addition to the sacrificial layer, an insulating layer or the like is preferably provided between the organic compound layer 113 and the insulating layer 127 in order to suppress disappearance of the organic compound layer 113.

Furthermore, since the organic compound layer 113 is processed by a photolithography method or the like after the sacrificial layer 118 is formed, damage to the organic compound layer 113 in the manufacturing process of the display apparatus can be reduced, resulting in an increase in reliability of the light-emitting device.

Note that in the case of processing the organic compound layer by a photolithography method or the like without providing a sacrificial layer, the organic compound layer, e.g., the light-emitting layer is damaged by the processing, which might significantly degrade the reliability of the display apparatus. In the manufacturing method of one embodiment of the present invention, the sacrificial layer 118 is preferably formed, in which case processing damage can be suppressed as described above. In order to further suppress processing damage, processing is preferably performed in a state where a functional layer such as an electron-transport layer or a hole-transport layer is stacked over the light-emitting layer. The sacrificial layer 118 is preferably positioned over the functional layer. In the case of processing the organic compound layer by a photolithography method or the like in this state, processing damage to the light-emitting layers is suppressed; thus, a highly reliable display panel can be provided.

Note that the sacrificial layer 118 in a light-emitting region of the light-emitting device 130 is removed as appropriate after the processing of the organic compound layer 113. That is, in order to ensure the light-emitting region, part of the sacrificial layer 118 overlapping with the organic compound layer 113 is removed. In a top view after the removal, an opening portion is formed in the sacrificial layer 118 and the organic compound layer 113 is exposed in the opening portion. Needless to say, the sacrificial layer 118 over the organic compound layer 113 may be completely removed. Since wet etching can be employed for removing the sacrificial layer 118, processing does not damage the organic compound layer, e.g., the light-emitting layer.

As a mask for removing the sacrificial layer 118, the insulating layer 127 can be used. In this case, an end portion of the sacrificial layer 118 on the light-emitting region side includes a region aligned or substantially aligned with the end portion of the insulating layer 127.

As already described above, since the light-emitting device 130 of one embodiment of the present invention has a microcavity structure, the thickness is different between the organic compound layers 113. Therefore, the uppermost surface, which is the formation surface of the sacrificial layer 118, of the organic compound layer 113*a* is positioned at a height different from those of the uppermost surfaces, which are the formation surfaces of the sacrificial layers 118, of the organic compound layer 113*b* and the organic compound layer 113*c*. This state may be referred to as "the organic compound layers 113 have different heights". When the sacrificial layer 118 is formed and the insulating layer 127 is formed over the sacrificial layer 118 under the situation where the organic compound layers 113 have different heights, a defect such as peeling from the end portion of the insulating layer 127 (simply referred to as a defect of the insulating layer 127) has been likely to occur. The present inventors consider that the defect is caused because the height of the formation surface of the insulating layer 127 is different between the organic compound layers.

When a defect is caused in the insulating layer 127, the above-described effect cannot be obtained. For example, when a defect is caused in the insulating layer 127, the conductive layer 115, which is a common layer, might be in contact with the light-emitting layers of the organic compound layers. In addition, the conductive layer 115 might be in contact with the conductive layer 111. Such a contact makes the light-emitting device not emit light. In view of the above, the present inventors consider that forming the insulating layer 127 according to the design leads to an improvement in the manufacturing yield of the display apparatus.

In view of the above, in one embodiment of the present invention, the heights of the formation surfaces of the insulating layer 127, i.e., the formation surfaces of the end portion of the insulating layer 127 are made equal to each other to suppress a defect of the insulating layer 127. Note that "heights are equal to each other" includes a structure in which heights from reference surfaces are equal to or substantially equal to each other. The structure in which heights are substantially equal to each other include a structure in which a height difference is less than or equal to 100 nm, preferably less than or equal to 50 nm, further preferably less than or equal to 30 nm. That is, the structure in which heights are substantially equal to each other includes a structure in which a height difference is small enough to suppress a defect of the insulating layer 127. The formation surface of the insulating layer 127 is, for example, the top surface of the sacrificial layer 118, which is illustrated as a height Ha of the sacrificial layer 118*a*, a height Hb of the sacrificial layer 118*b*, and a height He of the sacrificial layer 118*c* in FIG. 1A. In FIG. 1A, the reference surfaces of the height Ha, the height Hb, and the height He can be the bottom surface of the respective lower electrodes. Since the thickness of the lower electrode might be different between the light-emitting devices, the reference surface is preferably the bottom surface of the lower electrode. Note that when the bottom surface of the lower electrode is the reference surface, the planarity of the surface of the layer 102 is preferably ensured. When the surface of the layer 102 is not flat, the reference surface can be the top surface of the substrate 101 in FIG. 1A.

The display apparatus 100 of one embodiment of the present invention has a structure in which the heights of the formation surfaces of the insulating layer 127 are equal to each other while a microcavity structure is satisfied. Note that the heights of at least parts of the formation surfaces of the insulating layer 127 need to be equal to each other. As compared with the insulating layer 127 that is formed in a state where the height of the formation surface is different between the organic compound layers, a defect is suppressed in the insulating layer 127 that is formed in a state where the heights of parts of the formation surfaces are equal to each other. Suppression of a defect can improve the manufacturing yield of the display apparatus 100.

FIG. 1A illustrates a structure in which the height He of the sacrificial layer 118*c* is made large as a structure example in which the heights of the formation surfaces of the insulating layer 127 are made equal to each other. In the case of not employing the present invention, the height He is smaller than the height Ha and the height Hb.

To increase the height Hc, a layer is added under the sacrificial layer 118*c*. For example, in FIG. 1A, an insulating layer 103 is formed to increase the height Hc. When the insulating layer 103 is formed to overlap with part of the conductive layer 111*c*, the height He is increased. An end portion of the insulating layer 103 includes a region overlapping with an end portion of the conductive layer 111*c*.

Note that as long as the insulating layer 103 overlaps with the conductive layer 111*c*, the position of the end portion is not limited. Although not illustrated in FIG. 1A, the end portion of the insulating layer 103 may extend beyond the end portion of the conductive layer 111*c*. An extended region is preferably positioned outside the conductive layer 111*c*. With such a structure, at least the periphery of the conductive layer 111*c* is covered with the insulating layer 103 and a short circuit between the conductive layer 111*c* and the conductive layer 115 can be further suppressed.

The insulating layer 103 can contain an inorganic material or an organic material and has either a single-layer structure or a stacked-layer structure. When containing an inorganic material, the insulating layer 103 preferably has a thickness greater than or equal to 10 nm and less than or equal to 200 nm, preferably greater than or equal to 10 nm and less than or equal to 100 nm, further preferably greater than or equal to 10 nm and less than or equal to 60 nm. When containing an organic material, the insulating layer 103 preferably has a thickness greater than or equal to 0.1 μm and less than or equal to 1 μm, preferably greater than or equal to 0.1 μm and less than or equal to 0.5 μm.

The structure in which the heights of the formation surfaces of the insulating layer 127 are substantially equal to each other includes a structure in which a height difference is less than or equal to 100 nm, preferably less than or equal to 50 nm, further preferably less than or equal to 30 nm, but the height difference is preferably smaller than the thickness of the insulating layer 103.

The insulating layer 103 makes the height He large and makes the height He equal to the height Hb, whereby a defect of the insulating layer 127 can be suppressed.

Since the insulating layer 103 is selectively provided in a non-light-emitting region, the thickness Dc can be adjusted in the light-emitting region. That is, the display apparatus 100 can employ a microcavity structure without being affected by the insulating layer 103.

The thickness Dc of the organic compound layer 113*c* is smaller than the thicknesses of the organic compound layers of the other light-emitting devices, and it is considered that a defect is likely to be caused in the insulating layer 127 in the vicinity of the organic compound layer 113*c*. By increasing the height He in the vicinity of the organic compound layer 113*c* where a defect is most likely to be caused, the defect can be suppressed.

Although not illustrated in FIG. 1A, the organic compound layer 113*c* also includes a region adjacent to the organic compound layer 113*a*. The height He is increased, so that a difference between the height He and the height Ha is reduced. This can also suppress a defect of the insulating layer 127.

Structure Example 2

Although FIG. 1A illustrates the example in which the insulating layer 103 is provided for the light-emitting device 130*c*, the present invention is not limited thereto. The display apparatus 100 illustrated in FIG. 1B has a structure in which the insulating layer 103 is provided for the light-emitting device 130*b* and the light-emitting device 130*c*.

The insulating layer 103 is selectively formed over the conductive layer 111*b* and the conductive layer 111*c*. The height Hb is increased and the height Hb is made equal to the height Ha, whereby a defect of the insulating layer 127 can be suppressed.

Since the insulating layer 103 is selectively provided in a non-light-emitting region, the thickness Db and the thickness Dc can be adjusted in the light-emitting region. That is, the display apparatus 100 can employ a microcavity structure without being affected by the insulating layer 103.

The height Hb is increased and the height Hb is made equal to the height Ha, whereby a defect of the insulating layer 127 can be suppressed. The height He is increased and a difference between the height Hb and the height Ha is made small, whereby a defect of the insulating layer 127 can be suppressed.

Structure Example 3

A structure different from FIG. 1A and FIG. 1B is described. The display apparatus 100 illustrated in FIG. 2 includes a first insulating layer 103*a* and a second insulating layer 103*b* that have different film thicknesses. The second insulating layer 103*b* has a larger film thickness than the first insulating layer 103*a*. For example, the film thickness of the second insulating layer 103*b* is preferably greater than or equal to 1.5 times and less than or equal to 3 times, further preferably greater than or equal to 1.8 times and less than or equal to 2.2 times the film thickness of the first insulating layer 103*a*. The film thickness of the second insulating layer 103*b* is preferably greater than or equal to 0.5 times and less than or equal to 2 times, further preferably greater than or equal to 0.8 times and less than or equal to 1.2 times a difference between the thickness Db and the thickness Dc.

The first insulating layer 103*a* is selectively formed in the light-emitting device 130*b*, and the second insulating layer 103*b* is selectively formed in the light-emitting device 130*c*. The height Ha, the height Hb, and the height He are equal to each other, whereby a defect of the insulating layer 127 can be suppressed.

Since the first insulating layer 103*a* and the second insulating layer 103*b* are each selectively provided in a non-light-emitting region, the thickness Da, the thickness Db, and the thickness Dc can be adjusted in the light-emitting region. That is, the display apparatus 100 can employ a microcavity structure without being affected by the first insulating layer 103*a* and the second insulating layer 103*b*.

Such a structure makes the heights of the formation surfaces of the insulating layer 127 positioned between the light-emitting devices equal to each other, whereby a defect of the insulating layer 127 can be suppressed.

Structure Example 4

Figure 2:
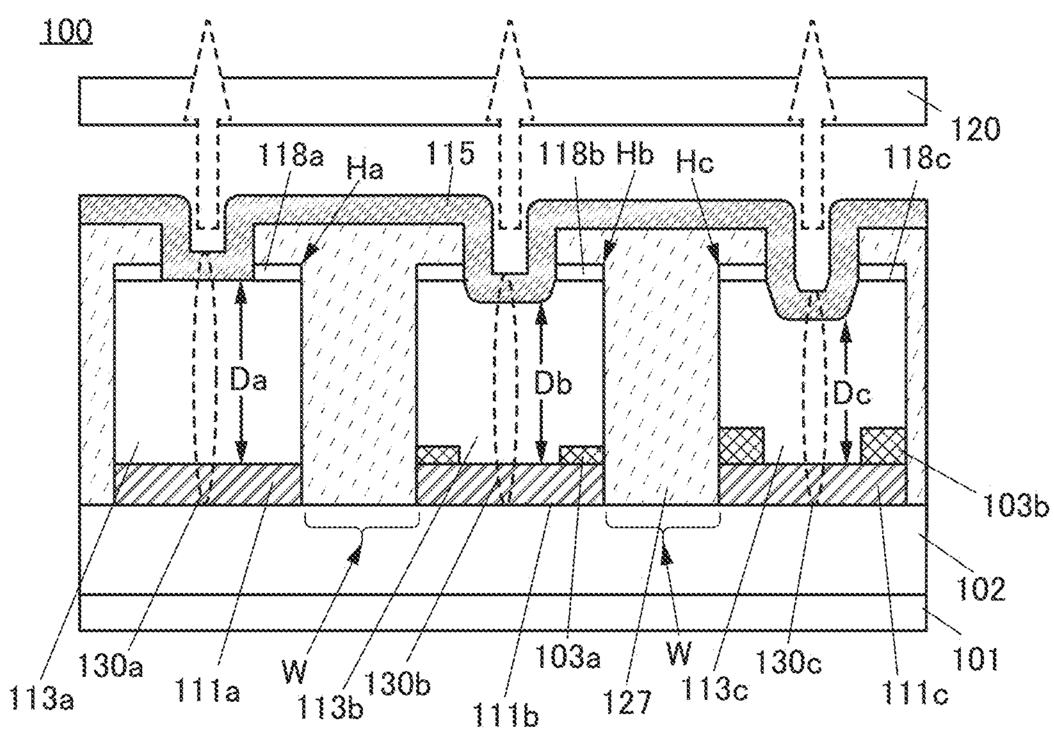
FIG. 2 is a cross-sectional view of a display apparatus of one embodiment of the present invention.
Figure 3:
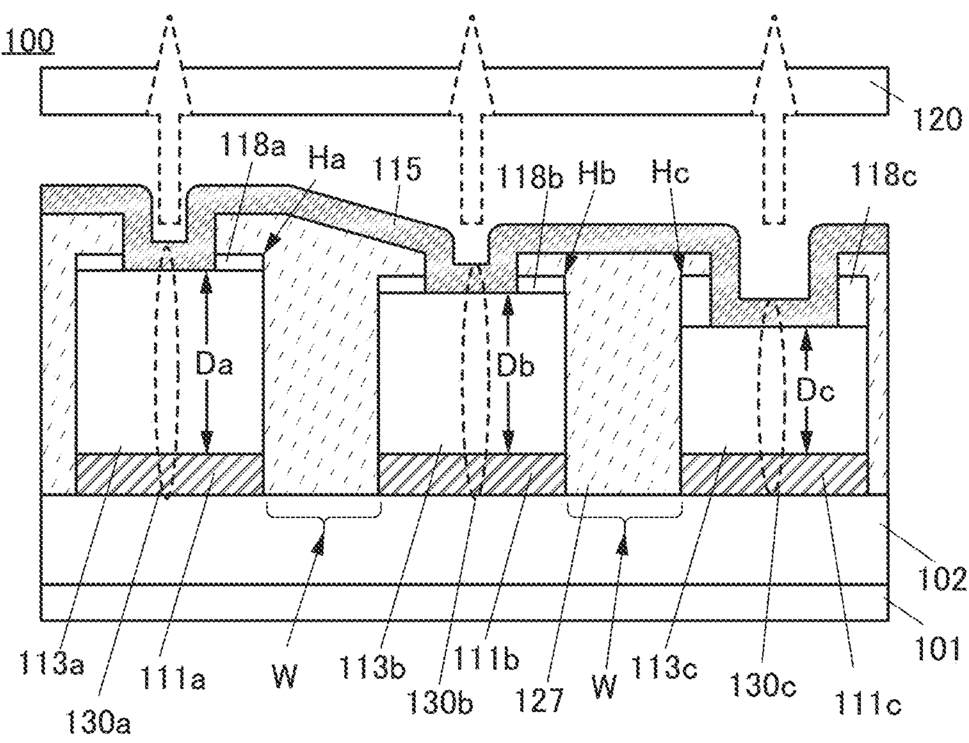
FIG. 3 is a cross-sectional view of a display apparatus of one embodiment of the present invention.

A structure different from FIG. 1A, FIG. 1B, and FIG. 2 is described. FIG. 3 illustrates a structure in which the height He of the sacrificial layer 118*c* is made equal to the height Hb of the sacrificial layer 118*b* by not providing the insulating layer 103 but adjusting the thickness of the sacrificial layer 118*c*.

Such a structure makes the heights of the formation surfaces of the insulating layer 127 positioned between the light-emitting devices equal to each other, whereby a defect of the insulating layer 127 can be suppressed.

Structure Example 5

Figure 4:
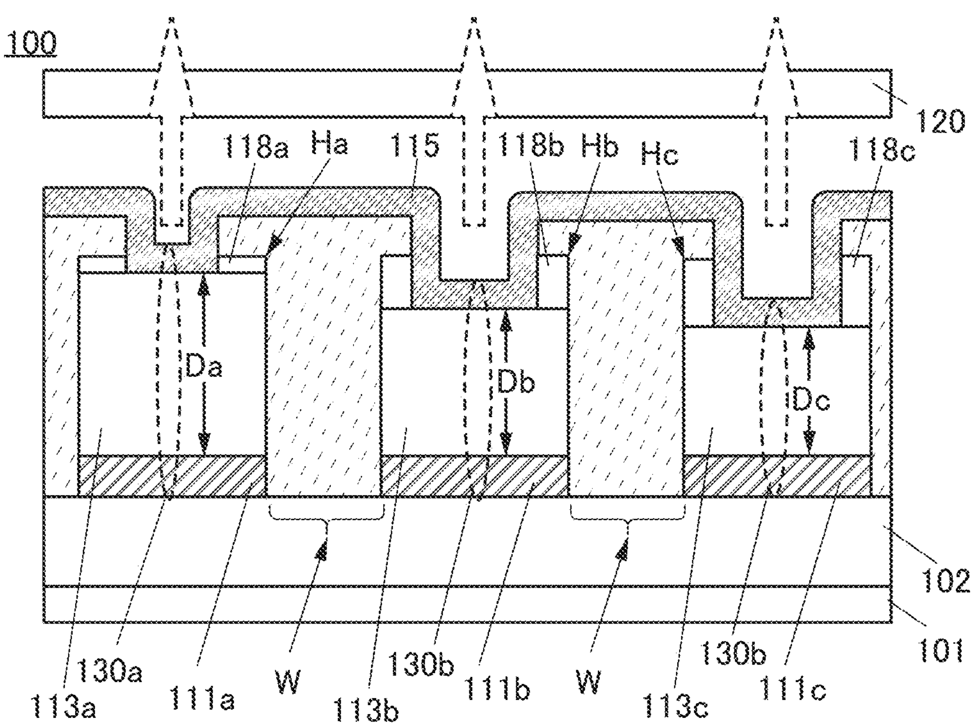
FIG. 4 is a cross-sectional view of a display apparatus of one embodiment of the present invention.

A structure different from FIG. 1A, FIG. 1B, FIG. 2, and FIG. 3 is described. FIG. 4 illustrates a structure in which the height He of the sacrificial layer 118*c* is made equal to the height Ha of the sacrificial layer 118*a* and the height Hb of the sacrificial layer 118*b* is made equal to the height Ha of the sacrificial layer 118*a* by not providing the insulating layer 103 but adjusting the thicknesses of the sacrificial layer 118*b* and the sacrificial layer 118*c*.

Such a structure makes the heights of the formation surfaces of the insulating layer 127 positioned between the light-emitting devices equal to each other, whereby a defect of the insulating layer 127 can be suppressed.

Structure Example 6

Figures 5A, 5B:
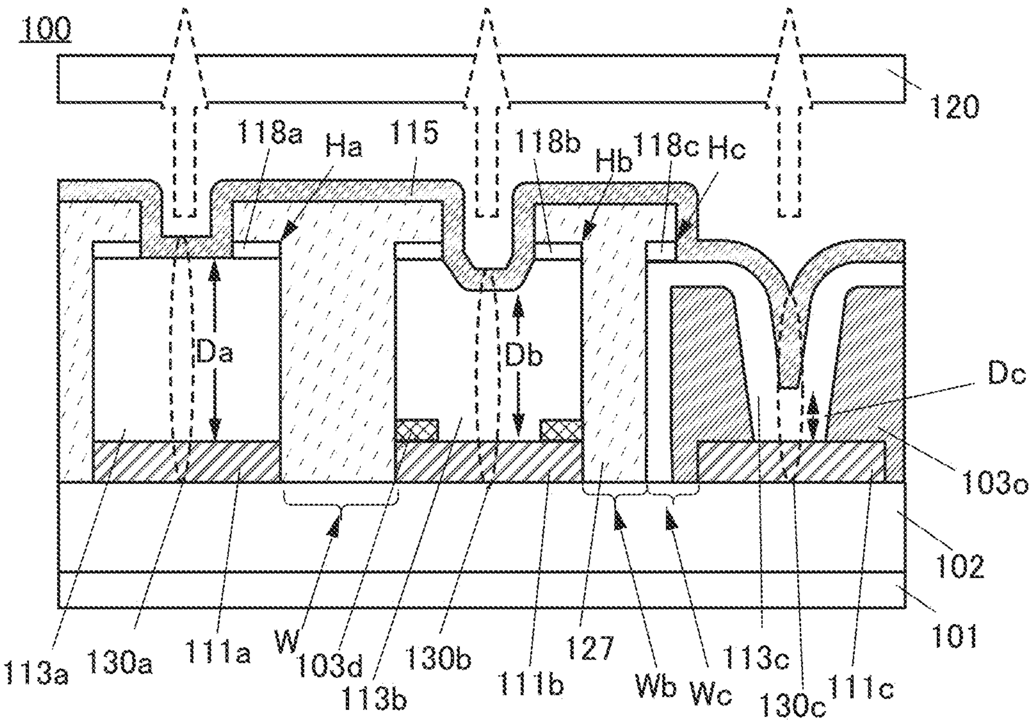
FIG. 5A and FIG. 5B are cross-sectional views of a display apparatus of one embodiment of the present invention.

A structure different from FIG. 1A, FIG. 1B, FIG. 2, FIG. 3, and FIG. 4 is described. FIG. 5A is a structure example in which an organic material is used for an insulating layer 103*o* covering part of the conductive layer 111*c*. Owing to the provision of the insulating layer 103*o*, the insulating layer 127 corresponding to the light-emitting device 130*c* can be omitted. For example, between the light-emitting device 130*b* and the light-emitting device 130*c*, the insulating layer 127 is omitted and the insulating layer 103*o* is provided in a region corresponding to Wc. In addition, between the light-emitting device 130*b* and the light-emitting device 130*c*, the insulating layer 127 is provided in a region corresponding to Wb. That is, between the light-emitting device 130*b* and the light-emitting device 130*c*, the insulating layer 127 and the insulating layer 103*o* are included.

The insulating layer 127 may be provided to be in contact with the insulating layer 103*o* and an insulating layer or the like may be positioned between them.

A photosensitive (negative or positive) organic material can be used for the insulating layer 103*o*, and an end portion of the insulating layer 103*o* can be provided with a tapered shape.

With the insulating layer 103*o*, peeling of the light-emitting device 130 can also be suppressed.

With the insulating layer 103*o*, a short circuit between the conductive layer 115 and the conductive layer 111 can also be suppressed.

The insulating layer 103*o* is provided before the organic compound layer 113 is formed, so that heat treatment can be sufficiently performed without considering the heat resistance of the organic compound layer 113, which is preferable. By the heat treatment, moisture or the like of the insulating layer 103*o* can be reduced and deterioration of the organic compound layer 113 due to moisture or the like can be suppressed.

The insulating layer 127 is partly omitted in such a structure, whereby a defect of the insulating layer 127 can be suppressed.

Structure Example 7

A structure different from FIG. 1A, FIG. 1B, FIG. 2, FIG. 3, FIG. 4, and FIG. 5A is described. FIG. 5B is a structure example in which an organic material is used for the insulating layer 103*o* covering part of the conductive layer 111*c* and an inorganic material is used for an insulating layer 103*d* covering part of the conductive layer 111*b*. Owing to the provision of the insulating layer 103*o*, the insulating layer 127 corresponding to the light-emitting device 130*c* can be omitted. The structure in which the insulating layer 103*d* makes the height Hb equal to the height Ha is described.

The insulating layer 127 is partly omitted in such a structure, whereby a defect of the insulating layer 127 can be suppressed.

This embodiment can be combined with the other embodiments as appropriate. In the case where a plurality of structure examples are described in one embodiment in this specification, the structure examples can be combined as appropriate.

Embodiment 2

In this embodiment, a display apparatus of one embodiment of the present invention and a manufacturing method thereof are described.

<Top View of Pixel Portion 104>

Figures 6A, 6B:
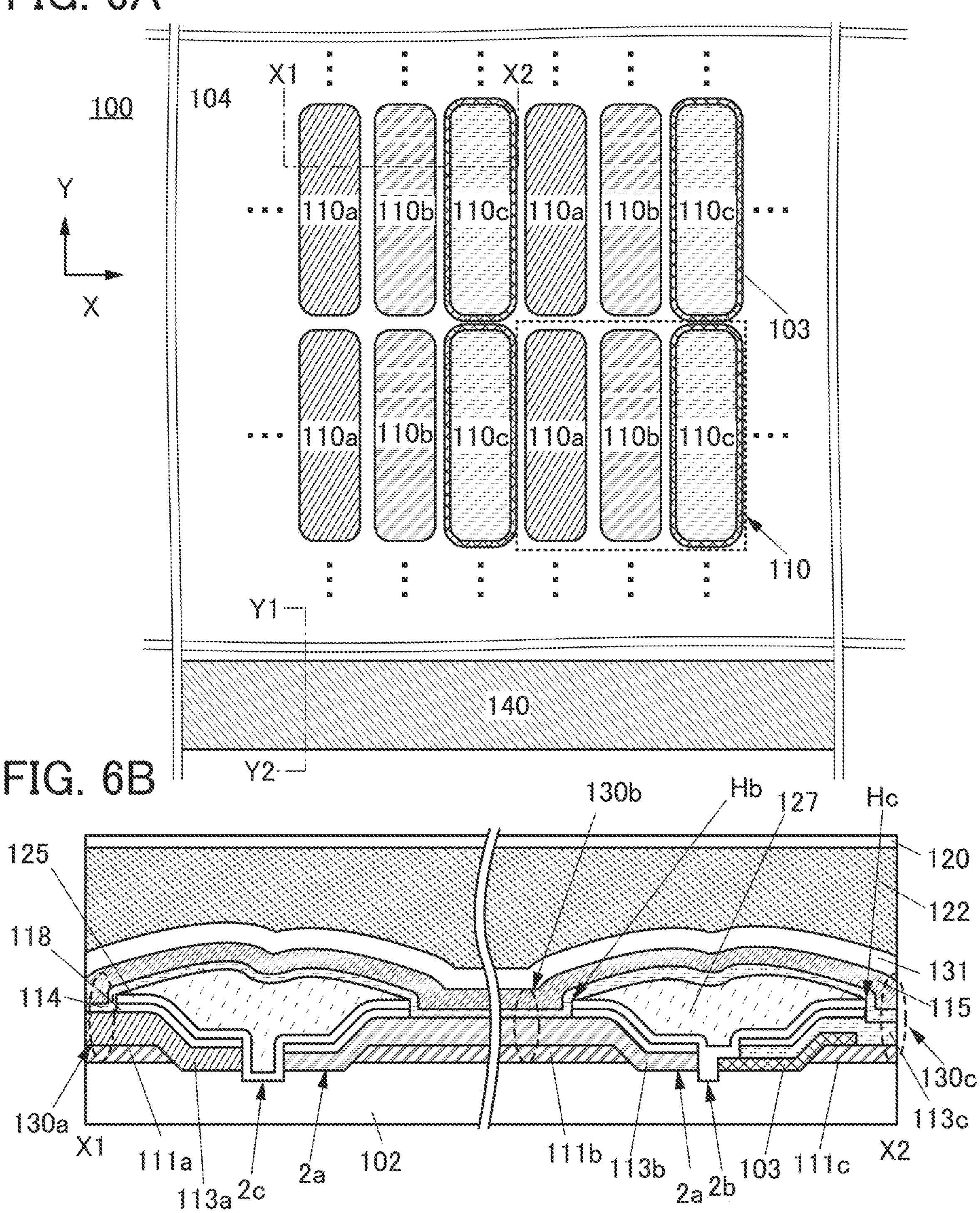
FIG. 6A is a plan view of a display apparatus of one embodiment of the present invention.
FIG. 6B is a cross-sectional view of the display apparatus of one embodiment of the present invention.

FIG. 6A illustrates atop view of a pixel portion 104 of the display apparatus 100. The pixel portion 104 may also be referred to as a pixel region. In the pixel portion 104, a state where a plurality of light-emitting devices are arranged can be observed. By employing the SBS structure for each of the light-emitting devices, different colors can be emitted. FIG. 6A illustrates light-emitting regions of the light-emitting devices as a subpixel 110*a*, a subpixel 110*b*, and a subpixel 1/0*c*. The subpixels of the same color are denoted by the same reference numeral. For example, the subpixel 110*a* can emit red, the subpixel 110*b* positioned next to the subpixel 110*a* can emit green, and the subpixel 110*c* positioned next to the subpixel 110*b* can emit blue. Although the light-emitting regions are shown by rectangles in FIG. 6A, the present invention is not limited to rectangles.

When the subpixel 110*a*, the subpixel 110*b*, and the subpixel 110*c* do not need to be distinguished from each other, the term "subpixel" may be used.

In FIG. 6A, according to Structure example 1 in the above embodiment, the insulating layer 103 is provided in a region corresponding to the subpixel 110*c*. The insulating layer 103 can be rephrased as the insulating layer 103*o*.

It is preferable that the subpixel 110*a* correspond to a red (sometimes referred to as R) light-emitting region, the subpixel 110*b* correspond to a green (sometimes referred to as G) light-emitting region, and the subpixel 110*c* correspond to a blue (sometimes referred to as B) light-emitting region. It is also possible that the subpixel 110*a* corresponds to a yellow (sometimes referred to as Y) light-emitting region, the subpixel 110*b* corresponds to a cyan (sometimes referred to as C) light-emitting region, and the subpixel 110*c* corresponds to a magenta (sometimes referred to as M) light-emitting region.

The above-described structure including at least the subpixel 110*a*, the subpixel 110*b*, and the subpixel 110*c* enables full-color display. A minimum unit capable of full-color display is referred to as a pixel 110. The pixel 110 includes at least the subpixel 110*a*, the subpixel 110*b*, and the subpixel 110*c*.

Note that the display apparatus 100 of one embodiment of the present invention is not limited to the above-described emission colors. The display apparatus 100 of one embodiment of the present invention may include a white light-emitting region in addition to the red, green, and blue light-emitting regions. The display apparatus 100 of one embodiment of the present invention may include a region other than a light-emitting region, for example, a light-receiving region.

The above-described subpixels are preferably arranged in a matrix. The matrix is a structure that is arrangement with given regularity. A state where the subpixels are arranged in a matrix is described with use of the X axis and the Y axis intersecting the X axis, which are added to FIG. 6A. First, the subpixel 110*a*, the subpixel 110*b*, and the subpixel 110*c* are arranged in this order in the X-axis direction. In such arrangement, the subpixel 110*a* is adjacent to the subpixel 110*b* or the subpixel 110*c*. In the display apparatus 100 of one embodiment of the present invention illustrated in FIG. 6A, adjacent light-emitting devices in the X-axis direction emit different colors.

In the Y-axis direction, a plurality of subpixels 110*a* are arranged, a plurality of subpixels 110*b* are arranged, and a plurality of subpixels 110*c* are arranged. Arrangement satisfying such arrangement is called stripe arrangement. In the display apparatus 100 of one embodiment of the present invention illustrated in FIG. 6A, adjacent light-emitting devices in the Y-axis direction emit the same color.

The display apparatus 100 includes, in addition to the pixel portion 104, a connection portion 140, for example. The connection portion 140 may also be referred to as a cathode contact portion. The connection portion 140 is preferably positioned outside the pixel portion 104, and this position corresponds to a non-light-emitting region of the display apparatus 100.

<Cross-Sectional View of Pixel Portion 104>

FIG. 6B illustrates a cross-sectional view along X1-X2 in FIG. 6A.

<Layer 102>

Although a substrate or the like is omitted in FIG. 6B, the layer 102 is provided over the substrate or the like. The substrate may be flexible. The layer 102 is preferably a layer including a transistor.

<Lower Electrode>

The lower electrode of the light-emitting device is provided over the layer 102. The lower electrode functions as one of the anode and the cathode of the light-emitting device. According to Structure example 1 described above, FIG. 6B illustrates the conductive layer 111*a*, the conductive layer 111*b*, and the conductive layer 111*c* as the lower electrodes. The conductive layer 111*a*, the conductive layer 111*b*, and the conductive layer 111*c* can each be electrically connected to a transistor. A conductive layer electrically connected to a transistor may be referred to as a pixel electrode.

An end portion of the conductive layer 111 preferably has a tapered shape. A shape where film thickness is gradually reduced toward the outside is also the tapered shape. In processing of the conductive layer 111, a depressed portion 2*a* may be formed in the layer 102. The depressed portion 2*a* is sometimes referred to as an over-etched region. In the case where formation of the depressed portion 2*a* is not desired, a layer of an inorganic material is preferably placed on the outermost surface of the layer 102. When a layer of an organic material is positioned on the outermost surface of the layer 102, the depressed portion 2*a* is likely to be formed.

The organic compound layer 113 is formed in a region overlapping with the top surface and the side surface of the conductive layer 111 and the depressed portion 2*a*. In a region where the conductive layer 111 has a tapered shape, the organic compound layer 113 is inclined and thus disconnection of the organic compound layer 113 is suppressed.

In the case where the lower electrode functions as the anode, a material having a large work function is preferably used.

<Upper Electrode>

The upper electrode functions as the other of the anode and the cathode of the light-emitting device. In FIG. 6B, according to Structure example 1 described above, the conductive layer 115 is included as the upper electrode. The conductive layer 115 is a common layer that can be shared by the light-emitting devices.

In the case where the upper electrode functions as the cathode, a material having a small work function is preferably used for the conductive layer 115.

<Organic Compound Layer>

The organic compound layer can include a hole-injection layer, a hole-transport layer, a light-emitting layer, an electron-transport layer, and an electron-injection layer. The organic compound layer is a stack of functional layers selected from the above-described layers and includes at least a light-emitting layer.

Alternatively, the organic compound layer may have a structure in which a first light-emitting unit, a charge-generation layer (also referred to as an intermediate layer) over the first light-emitting unit, and a second light-emitting unit over the charge-generation layer are stacked.

The light-emitting layer is a layer containing a light-emitting substance. The light-emitting layer can contain one or more kinds of light-emitting substances. As the light-emitting substance, a substance that exhibits an emission color of blue, violet, bluish violet, green, yellowish green, yellow, orange, red, or the like is appropriately used. A substance that emits near-infrared light can also be used as the light-emitting substance.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compound layers (sometimes referred to as a host material, an assist material, or the like) in addition to the light-emitting substance (sometimes referred to as a guest material). As one or more kinds of organic compound layers, one or both of the hole-transport material and the electron-transport material can be used. As one or more kinds of organic compound layers, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (corresponding to a phosphorescent material). When a combination is selected so as to form an exciplex that exhibits light emission whose wavelength overlaps with the wavelength of a lowest-energy-side absorption band of the light-emitting substance, energy can be smoothly transferred and light emission can be efficiently obtained. With this structure, high efficiency, low-voltage driving, and a long lifetime of the light-emitting device can be achieved at the same time.

In addition to the light-emitting layer, the organic compound layer 113 may further include a layer containing any of a substance having a high hole-injection property, a substance having a high hole-transport property, a hole-blocking material, a substance having a high electron-transport property, a substance having a high electron-injection property, an electron-blocking material, a substance having a bipolar property (a substance having a high electron-transport property and a high hole-transport property), and the like.

Either a low molecular compound or a high molecular compound can be used for the organic compound layer 113, and an inorganic compound may also be included. Each of the layers included in the organic compound layer 113 can be formed by an evaporation method (including a vacuum evaporation method), a transfer method, a printing method, an ink-jet method, a coating method, or the like.

For example, the organic compound layer 113 can include, in addition to the light-emitting layer, one or more of a hole-injection layer, a hole-transport layer, a hole-blocking layer, an electron-blocking layer, an electron-transport layer, and an electron-injection layer.

In the organic compound layer 113, one or more of a hole-injection layer, a hole-transport layer, a hole-blocking layer, an electron-blocking layer, an electron-transport layer, and an electron-injection layer can be used as a layer shared by the light-emitting devices of different colors. These are sometimes referred to as common layers. In FIG. 6B, an electron-injection layer 114 is used as a common layer.

Note that all the layers in the organic compound layer 113 may be separately formed for the light-emitting devices. That is, the organic compound layer 113 does not necessarily include a common layer.

The organic compound layers 113 each preferably include a light-emitting layer and a carrier-transport layer over the light-emitting layer. Accordingly, the light-emitting layer is inhibited from being exposed on the outermost surface in the process of manufacturing the display apparatus 100, so that damage to the light-emitting layer can be reduced. As the carrier-transport layer, a hole-transport layer or an electron-transport layer is given. Thus, the reliability of the light-emitting device can be increased.

A hole-injection layer, which is one of the layers in the organic compound layer 113, is a layer injecting holes from an anode to a hole-transport layer, and a layer containing a material with a high hole-injection property. Examples of the material with a high hole-injection property include an aromatic amine compound and a composite material containing a hole-transport material and an acceptor material (electron-accepting material).

The hole-transport layer, which is one of the layers in the organic compound layer 113, is a layer transporting holes, which are injected from an anode by a hole-injection layer, to a light-emitting layer. The hole-transport layer is a layer containing a hole-transport material. As the hole-transport material, a substance having a hole mobility greater than or equal to $1\times10^{-6}$ $cm^2/Vs$ is preferable. Note that other substances can also be used as long as they have a property of transporting more holes than electrons. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-transport layer, which is one of the layers in the organic compound layer 113, is a layer transporting electrons, which are injected from a cathode by an electron-injection layer, to a light-emitting layer. The electron-transport layer is a layer containing an electron-transport material. As the electron-transport material, a substance having an electron mobility greater than or equal to $1\times10^{-6}$ $cm^2/Vs$ is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer, which is one of the layers in the organic compound layer 113 or common layers, is a layer injecting electrons from a cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

As the electron-injection layer, for example, an alkali metal, an alkaline earth metal, or a compound thereof, such as lithium, cesium, ytterbium, lithium fluoride (LiF), cesium fluoride (CsF), calcium fluoride ($CaF_x$, X is a given number), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate can be used. The electron-injection layer may have a stacked-layer structure of two or more layers. In the stacked-layer structure, for example, lithium fluoride can be used for the first layer and ytterbium can be used for the second layer.

In the case of manufacturing a tandem light-emitting device, a charge-generation layer (sometimes referred to as an intermediate layer) is provided between two light-emitting units in the organic compound layer 113. The intermediate layer has a function of injecting electrons into one of the two light-emitting units and injecting holes into the other when voltage is applied between the pair of electrodes.

The charge-generation layer includes at least a charge-generation region. The charge-generation region preferably contains an acceptor material, which may be the same as the acceptor material contained in the hole-injection layer.

The charge-generation region preferably contains a composite material or the like containing an acceptor material and a hole-transport material, which may be the same as the hole-transport material contained in the hole-injection layer or the hole-transport layer. Note that for the composite material containing an acceptor material and a hole-transport material, a stacked-layer structure of a layer containing an acceptor material and a layer containing a hole-transport material may be used or a layer in which an acceptor material and a hole-transport material are mixed may be used. The mixed layer is obtained by, for example, co-evaporating the acceptor material and the hole-transport material.

Note that the charge-generation layer may contain a donor material instead of an acceptor material, and a layer containing an electron-transport material and a donor material is used.

The charge-generation layer preferably includes a layer containing a material having a high electron-injection property. The layer can also be referred to as an electron-injection buffer layer. The electron-injection buffer layer is preferably provided between the charge-generation region and the electron-transport layer. By provision of the electron-injection buffer layer, an injection barrier between the charge-generation region and the electron-transport layer can be lowered; thus, electrons generated in the charge-generation region can be easily injected into the electron-transport layer.

The electron-injection buffer layer preferably contains an alkali metal or an alkaline earth metal, and for example, can contain an alkali metal compound or an alkaline earth metal compound. Specifically, the electron-injection buffer layer preferably contains an inorganic compound containing an alkali metal and oxygen or an inorganic compound containing an alkaline earth metal and oxygen, further preferably contains an inorganic compound containing lithium and oxygen (e.g., lithium oxide ($Li_2O$)). Alternatively, a material that can be used for the electron-injection layer can be suitably used for the electron-injection buffer layer.

A boundary between the charge-generation region and the electron-injection buffer layer is sometimes unclear. When a very thin charge-generation layer is analyzed by time-of-flight secondary ion mass spectrometry (referred to as TOF-SIMS), for example, both an element contained in the charge-generation region and an element contained in the electron-injection buffer layer may be detected. In the case of using lithium oxide for the electron-injection buffer layer, lithium may be detected not only in the electron-injection buffer layer but also in the whole charge-generation layer because an alkali metal such as lithium has high diffusibility. Thus, a region where lithium is detected by TOF-SIMS can be regarded as the charge generation layer.

The charge-generation layer preferably includes a layer containing a material having a high electron-transport property. The layer can also be referred to as an electron-relay layer. The electron-relay layer is preferably provided between the charge-generation region and the electron-injection buffer layer. In the case where the charge-generation layer does not include an electron-injection buffer layer, the electron-relay layer is preferably provided between the charge-generation region and the electron-transport layer. The electron-relay layer has a function of preventing interaction between the charge-generation region and the electron-injection buffer layer (or the electron-transport layer) and smoothly transferring electrons.

For the electron-relay layer, an electron-transport material can be suitably used. For the electron-relay layer, a phthalocyanine-based material such as copper(II) phthalocyanine (abbreviation: CuPc) can be suitably used. Moreover, for the electron-relay layer, a metal complex having a metal-oxygen bond and an aromatic ligand can be suitably used.

Note that the charge-generation region, the electron-injection buffer layer, and the electron-relay layer cannot be clearly distinguished from each other in some cases on the basis of the cross-sectional shapes, the characteristics, or the like.

Note that the charge-generation layer may contain a donor material instead of an acceptor material. For example, the charge-generation layer may include a layer containing an electron-transport material and a donor material, which can be used for the electron-injection layer.

When the light-emitting units are stacked, provision of a charge-generation layer between two light-emitting units can suppress an increase in driving voltage.

<Microcavity Structure>

The light-emitting device 130 preferably employs a microcavity structure.

Each of the light-emitting device 130_a_, the light-emitting device 130_b_, and the light-emitting device 130_c_ employing a microcavity structure has a film thickness corresponding to a wavelength of emitted light (emission color), so that the film thickness is different between at least the organic compound layer 113_a_, the organic compound layer 113_b_, and the organic compound layer 113_c_.

<Insulating Layer 103>

In order to reduce the difference in the film thickness, the light-emitting device 130_c_ includes the insulating layer 103 overlapping with part of the conductive layer 111_c_. In the case where the end portion of the conductive layer 111_c_ has a tapered shape, the insulating layer 103 overlapping with the end portion is also inclined. The end portion of the insulating layer 103 preferably extends beyond the end portion of the conductive layer 111_c_. When extending, the conductive layer 103 is also formed in the depressed portion 2_a_ of the layer 102.

The insulating layer 103 can contain an inorganic material or an organic material and has either a single-layer structure or a stacked-layer structure. When containing an inorganic material, the insulating layer 103 preferably has a thickness greater than or equal to 10 nm and less than or equal to 200 nm, preferably greater than or equal to 10 nm and less than or equal to 100 nm, further preferably greater than or equal to 10 nm and less than or equal to 60 nm. When containing an organic material, the insulating layer 103 preferably has a thickness greater than or equal to 0.1 μm and less than or equal to 1 μm, preferably greater than or equal to 0.1 μm and less than or equal to 0.5 μm.

An inorganic material contained in the insulating layer 103 preferably contains one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

An organic material contained in the insulating layer 103 preferably contains an organic resin such as a polyimide resin, a polyamide resin, an acrylic resin, a siloxane resin, a silicone resin, an epoxy resin, or a phenol resin.

Note that a material in which an impurity element such as lanthanum (La), nitrogen, zirconium (Zr), or the like is added to the above inorganic material or the above organic material may be used.

In the case where the insulating layer 103 has a stacked-layer structure, it is preferable that a lower layer be an inorganic material and an upper layer be an organic material.

In the insulating layer 103 formed with an organic material, an upper end portion of an opening portion is rounded in some cases. Being rounded is sometimes described as having a curvature. Note that in the case where the insulating layer 103 has a stacked-layer structure, at least an upper end portion of an upper layer has a curvature. A lower end portion of the insulating layer 103 can have a curvature.

The end portion of the insulating layer 103 preferably has a tapered shape.

In processing of the insulating layer 103, a depressed portion 2_b_ may be formed in the layer 102. The depressed portion 2_b_ is deeper than the depressed portion 2_a_ formed in the processing of the conductive layer 111.

<Photolithography Method>

The organic compound layer 113 is processed by a photolithography method. Thus, the sacrificial layer 118 is preferably provided over the organic compound layer 113.

In the processing of the organic compound layer 113 by a photolithography method, a depressed portion 2_c_ may be formed in the layer 102. In the processing of the organic compound layer 113 by a photolithography method, the depressed portion 2_b_ formed in the layer 102 may become deeper. The depressed portion 2_b_ and the depressed portion 2_c_ are deeper than the depressed portion 2_a_ formed in the processing of the conductive layer 111.

<Insulating Layer 125>

The display apparatus 100 preferably includes an insulating layer 125. The side surface of the organic compound layer 113 starts to be exposed to the air immediately after being processed and thus easily deteriorates. Deterioration of the side surface leads to lateral leakage current between the light-emitting devices 130. Thus, the insulating layer 125 may be provided to cover an end portion of the organic compound layer 113.

In the organic compound layer 113, the hole-injection layer, the electron-injection layer, the charge-generation layer, or the like is often a layer having relatively high conductivity. In view of this, in order to ensure the insulating property of the end portion of the organic compound layer 113, the insulating layer 125 is preferably formed.

The insulating layer 125 covering the end portion of the organic compound layer 113 is preferably formed by an ALD method or the like. Furthermore, as the insulating layer 125, a dense insulating layer with high density is preferably used, and an aluminum oxide film formed by an ALD method is preferably used, for example. With the insulating layer 125, the reliability of the light-emitting device can be increased.

<Insulating Layer 127>

The display apparatus 100 preferably includes the insulating layer 127. For the insulating layer 127, an organic material is preferably used, and an organic material with few moisture is further preferably used. With the insulating layer 103, the heights of the formation surfaces of the insulating layer 127, for example, the height Hb and the height He can be equal to each other. A defect of the insulating layer 127 can be suppressed.

The top surface of the insulating layer 127 might be uneven. As the causes of the generation of the unevenness, the depressed portion 2*a* and the depressed portion 2*b* are given.

<Common Layer>

Although only the conductive layer 115 is a common layer in Structure example 1 described above, one of the layers in the organic compound layer and the conductive layer 115 can be common layers in the display apparatus 100. As one of the layers in the organic compound layer, the electron-injection layer 114 is used.

<Protective Layer 131 or the Like>

The display apparatus 100 preferably includes a protective layer 131 covering the light-emitting device 130. The substrate 120 is bonded to the protective layer 131. In FIG. 6B, a solid sealing structure is employed and thus the substrate 120 is bonded with a resin layer 122.

Although this embodiment describes the top view and the cross-sectional view of the pixel portion 104 employing Structure example 1 described above, examples other than Structure example 1 can be employed.

<Connection Portion 140>

Figure 7A:
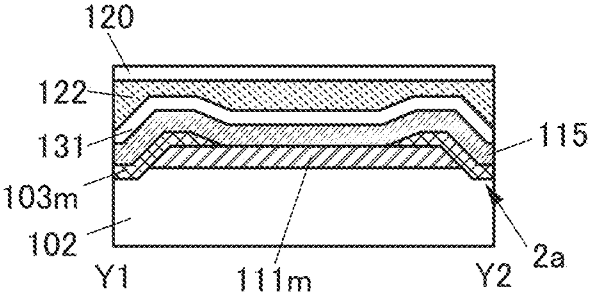
FIG. 7A to FIG. 7C are cross-sectional views of a connection portion of a display apparatus of one embodiment of the present invention.

FIG. 7A illustrates a cross-sectional view of the connection portion 140 along Y1-Y2 in FIG. 6A. The connection portion 140 is preferably formed at the same time as the pixel portion 104. Specifically, the connection portion 140 is a region where the conductive layer 115 is electrically connected to an external signal of a flexible printed circuit (referred to as FPC) or the like. Thus, a variety of structures can be employed.

As an example of the connection portion 140, FIG. 7A illustrates a structure in which the conductive layer 115 is electrically connected to a conductive layer 111*m*. Through the same process as that for the conductive layer 111 of the pixel portion 104, the conductive layer 111*m* is formed over the layer 102. As in the pixel portion 104, the depressed portion 2*a* is formed in the layer 102. Like the conductive layer 111 in the pixel portion 104, an end portion of the conductive layer 111*m* has a tapered shape.

Through the same process as that for the insulating layer 103 of the pixel portion 104, an insulating layer 103*m* is formed over the conductive layer 111*m*. In the insulating layer 103*m*, an opening portion in which the conductive layer 111*m* is exposed is formed.

The protective layer 131 is formed over the conductive layer 115. Then, the substrate 120 can be bonded to the protective layer 131 with the resin layer 122 therebetween. The conductive layer 111*m* includes a region extending beyond an end portion of the substrate 120, and can be electrically connected to an FPC or the like through the region.

Figure 7B:
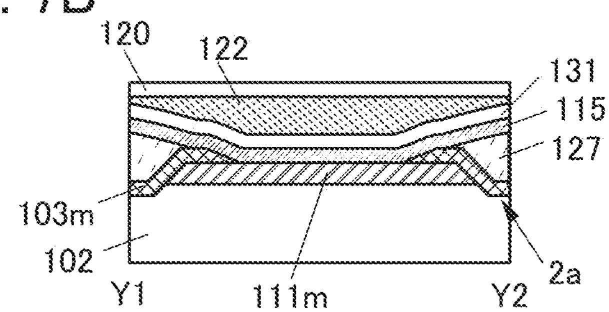

As an example of the connection portion 140, FIG. 7B illustrates a structure in which the insulating layer 127 is added to the structure in FIG. 7A.

Through the same process as that for the insulating layer 127 of the pixel portion 104, the insulating layer 127 is formed over the insulating layer 103*m*. In the insulating layer 127, an opening portion in which the conductive layer 111*m* is exposed is formed.

Through the same process as that for the conductive layer 115 of the pixel portion 104, the conductive layer 115 is formed over the insulating layer 127 and the insulating layer 103*m*. The conductive layer 115 can be electrically connected to the conductive layer 111*m* through the opening portion in the insulating layer 103*m* and the opening portion in the insulating layer 127.

Figure 7C:
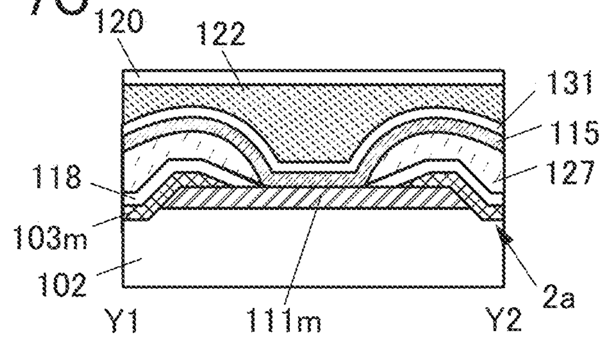

As an example of the connection portion 140, FIG. 7C illustrates a structure in which the sacrificial layer 118 is added to the structure in FIG. 7B.

Through the same process as that for the sacrificial layer 118 of the pixel portion 104, the sacrificial layer 118 is formed over the insulating layer 103*m*. The insulating layer 127 is formed over the sacrificial layer 118. An opening portion in which the conductive layer 111*m* is exposed is formed in the sacrificial layer 118 and the insulating layer 127. The conductive layer 115 can be electrically connected to the conductive layer 111*m* through the opening portion in the insulating layer 103*m*, the opening portion in the sacrificial layer 118, and the opening portion in the insulating layer 127.

In this manner, the connection portion 140 can be formed at the same time as the pixel portion 104.

<Manufacturing Method 1>

Figures 8A, 8B, 8C:
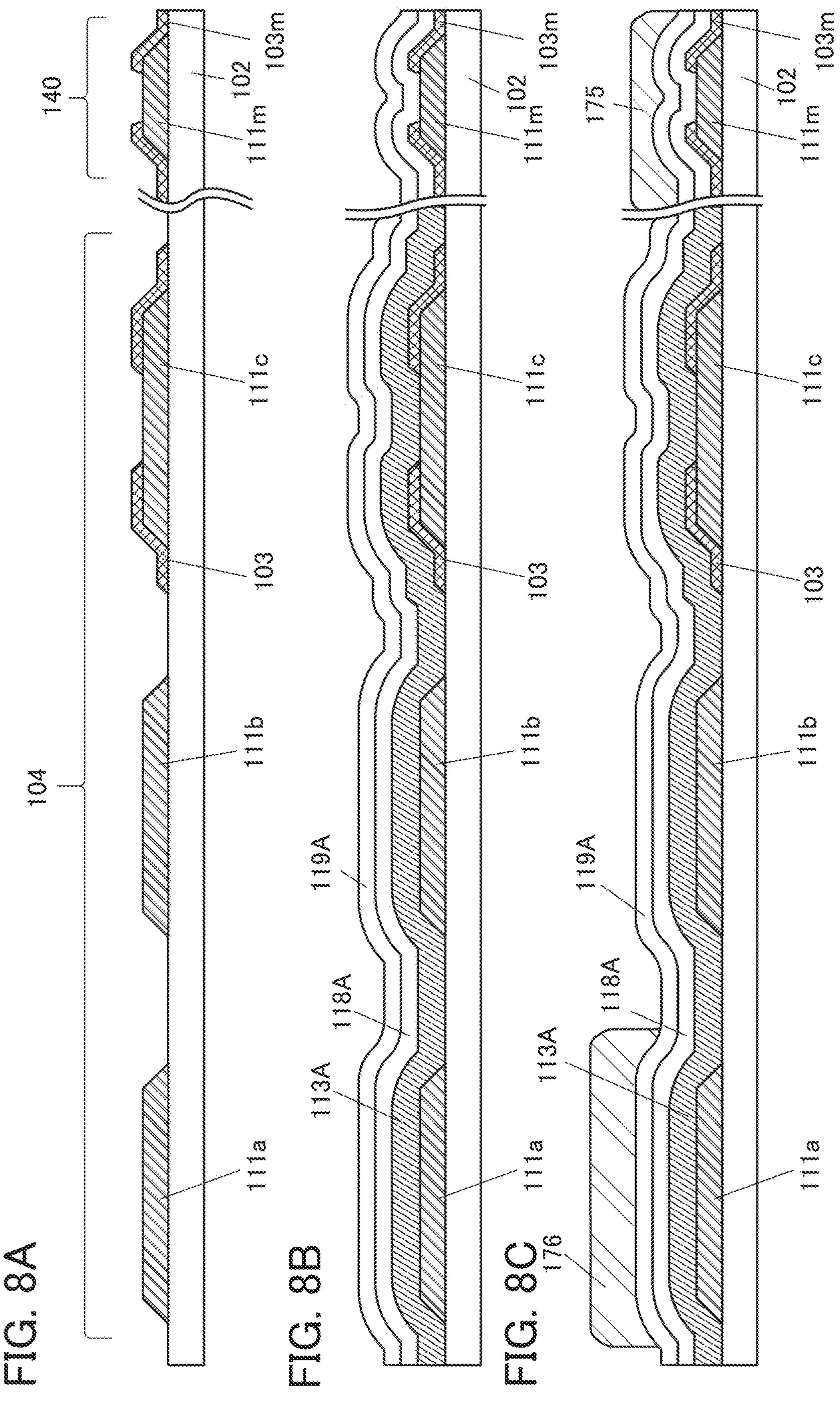
FIG. 8A to FIG. 8C are diagrams illustrating a method for manufacturing a display apparatus of one embodiment of the present invention.

FIG. 8A illustrates Manufacturing method 1 of the display apparatus of one embodiment of the present invention.

As illustrated in FIG. 8A, in the display apparatus 100, the conductive layer 111*a*, the conductive layer 111*b*, and the conductive layer 111*c* are formed over the layer 102 and the conductive layer 111*m* is formed in the connection portion 140.

For the conductive layer 111, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La); and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) and an alloy containing an appropriate combination of any of these. It is also preferable to use an element belonging to Group 1 or Group 2 of the periodic table, which is not exemplified above (e.g., lithium (Li), cesium (Cs), magnesium (Mg), calcium (Ca), or strontium (Sr)), a rare earth metal such as europium (Eu) or ytterbium (Yb), or an alloy containing an appropriate combination of any of these. For example, an alloy of silver and magnesium (sometimes referred to as MgAg) or an alloy of lithium and aluminum (sometimes referred to as AlLi) can be used. Moreover, graphene or the like can be used.

As materials selected from above, a stacked-layer structure of a layer containing titanium (referred to as a titanium layer), a layer containing aluminum (an aluminum layer) thereover, a titanium layer thereover, and a layer containing ITSO (an ITSO layer) thereover is preferably used to form a conductive layer. At least the ITSO layer functions as a transparent electrode and the titanium layer functions as a reflective electrode.

A continuous conductive layer having the stacked-layer structure is formed over the layer 102 and then processed into a predetermined shape, whereby the conductive layer 111*a*, the conductive layer 111*b*, the conductive layer 111*c*, and the conductive layer 111*m* are obtained. In the processing, a depressed portion may be formed in the layer 102 (FIG. 8A does not illustrate the depressed portion). In the case where a layer containing an inorganic material, for example, a layer containing silicon nitride or a layer containing silicon oxide is placed on the outermost surface of the layer 102, formation of a depressed portion is suppressed or a depressed portion is shallow even when being formed. The layer 102 may have a stacked-layer structure; for example, a layer containing silicon nitride and a layer containing silicon oxide thereover may be placed.

For the processing of the conductive layer 111, wet etching or dry etching can be employed. In the case of wet etching, an oxalic acid-based aqueous solution whose temperature is adjusted to be higher than or equal to 20° C. and lower than or equal to 50° C. is preferably used. In dry etching, it is preferable that the substrate temperature be set to be higher than or equal to 30° C. and lower than or equal to 70° C. and a gas containing $CH_4$ and Ar, a gas containing $H_2$ and Ar, or a gas containing $O_2$ be used.

In the case where the conductive layer 111 has a stacked-layer structure, processing is preferably performed employing a combination of wet etching and dry etching.

The conductive layer 111 includes a region formed in a contact hole for electrical connection with the transistor. In this region, the surface of the conductive layer 111 may have a depressed portion along the shape of the contact hole.

An insulating layer or a conductive layer is preferably embedded in the depressed portion of the conductive layer 111. When the depressed portion of the conductive layer 111 is flattened, unevenness of the formation surface of the organic compound layer 113 can be reduced and coverage can be improved.

The insulating layer 103 is formed over the conductive layer 111*c* in the pixel portion 104, and the insulating layer 103*m* is formed over the conductive layer 111*m* in the connection portion 140. As already described above, the insulating layer 103 can contain an inorganic material or an organic material and has either a single-layer structure or a stacked-layer structure.

In FIG. 8A, the insulating layer 103 and the insulating layer 103*m* each containing an inorganic material are formed to have a film thickness of greater than or equal to 10 nm and less than or equal to 200 nm, preferably greater than or equal to 10 nm and less than or equal to 100 nm, further preferably greater than or equal to 10 nm and less than or equal to 60 nm. The inorganic material contained in each of the insulating layer 103 and the insulating layer 103*m* preferably contains one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

As illustrated in FIG. 8B, an organic compound layer 113A that can emit red light is formed in the entire pixel portion 104 so as to obtain the organic compound layer 113*a*. The organic compound layer 113A is not formed in the connection portion 140. For example, it is preferable that a metal mask (sometimes referred to as a rough metal mask) having an opening in a region corresponding to the pixel portion 104 be used and, in a state where the rough metal mask covers at least the connection portion 140, the organic compound layer 113A be deposited by a vacuum evaporation method.

The organic compound layer 113A is preferably a stack including the conductive layer 111 and at least a hole-injection layer, a hole-transport layer, an electron-blocking layer, a red light-emitting layer, a first electron-transport layer, and a second electron-transport layer in this order. An electron-injection layer is one of the layers in the organic compound layer, and the electron-injection layer is a common layer. Thus, the electron-injection layer is formed later.

The second electron-transport layer is a layer to be exposed to processing process for obtaining the processed organic compound layer 113*a*. Therefore, a material having high heat resistance is preferably used for the second electron-transport layer. As the material having high heat resistance, a material whose glass transition point is higher than or equal to 110° C. and lower than or equal to 165° C. is preferably used, for example.

In addition to the second electron-transport layer, the first electron-transport layer also preferably contains a material having high heat resistance. As the material having high heat resistance, a material whose glass transition point is higher than or equal to 110° C. and lower than or equal to 165° C. is preferably used, for example. Since the first electron-transport layer is covered with the second electron-transport layer, a material whose glass transition point is lower than that of the material for the second electron-transport layer may be used for the first electron-transport layer.

A sacrificial layer 118A is formed over the organic compound layer 113A. In this embodiment, a sacrificial layer has a stacked-layer structure; thus, a sacrificial layer 119A is formed over the sacrificial layer 118A. Note that the sacrificial layer 118A and the sacrificial layer 119A are formed also in the connection portion 140.

As one or both of the sacrificial layer 118A and the sacrificial layer 119A, a material that is highly resistant to the process conditions for the organic compound layer 113A, specifically, a material having high etching selectivity with the organic compound layer 113A is used.

As a method for forming one or both of the sacrificial layer 118A and the sacrificial layer 119A, a sputtering method, an ALD method (a thermal ALD method and a PEALD method), a CVD method, or a vacuum evaporation method can be employed, for example. The sacrificial layer 118A, which is formed in contact with the organic compound layer 113A, is preferably formed by a formation method that causes less damage to the organic compound layer 113A than a formation method for the sacrificial layer 119A. For example, the sacrificial layer 118A is preferably formed by an ALD method or a vacuum evaporation method rather than a sputtering method.

One or both of the sacrificial layer 118A and the sacrificial layer 119A are preferably formed at a temperature lower than the allowable temperature limit of the organic compound layer 113A. The typical substrate temperatures in formation of one or both of the sacrificial layer 118A and the sacrificial layer 119A are each lower than or equal to 200° C., preferably lower than or equal to 150° C., further preferably lower than or equal to 120° C., still further preferably lower than or equal to 100° C., yet still further preferably lower than or equal to 80° C.

For one or both of the sacrificial layer 118A and the sacrificial layer 119A, a material that can be removed by a wet etching method is preferably used. The use of a wet etching method can reduce damage to the organic compound layer 113A in processing of the sacrificial layer 118A and the sacrificial layer 119A, compared to the case of using a dry etching method.

For the sacrificial layer 118A, a film having high etching selectivity with the sacrificial layer 119A is preferably used.

Although this embodiment shows an example in which the sacrificial layer is formed with a two-layer structure of the sacrificial layer 118A and the sacrificial layer 119A, the sacrificial layer may have a single-layer structure or a stacked-layer structure of three or more layers.

As one or both of the sacrificial layer 118A and the sacrificial layer 119A, it is preferable to use an inorganic film such as a metal film, an alloy film, a metal oxide film, a semiconductor film, or an inorganic insulating film, for example.

For one or both of the sacrificial layer 118A and the sacrificial layer 119A, it is preferable to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials, for example. It is particularly preferable to use a low-melting-point material such as aluminum or silver. The use of a metal material capable of blocking ultraviolet light for one or both of the sacrificial layer 118A and the sacrificial layer 119A is preferable, in which case the organic compound layer 113A can be inhibited from being irradiated with ultraviolet light and the organic compound layer 113A can be inhibited from deteriorating.

For one or both of the sacrificial layer 118A and the sacrificial layer 119A, a metal oxide such as In—Ga—Zn oxide can be used. As one or both of the sacrificial layer 118A and the sacrificial layer 119A, an In—Ga—Zn oxide film can be formed by a sputtering method, for example. It is also possible to use indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon, or the like can also be used.

Note that an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium described above. Specifically, M is preferably one or more kinds selected from gallium, aluminum, and yttrium.

As one or both of the sacrificial layer 118A and the sacrificial layer 119A, an inorganic insulating film can be used. For example, an inorganic material such as aluminum oxide, hafnium oxide, or silicon oxide can be used for one or both of the sacrificial layer 118A and the sacrificial layer 119A. Among inorganic insulating films, an oxide insulating film is preferable because its adhesion to the organic compound layer 113A is higher than that of a nitride insulating film, so that an oxide insulating film is preferably used as the sacrificial layer 118A. As one or both of the sacrificial layer 118A and the sacrificial layer 119A, for example, an aluminum oxide film formed by an ALD method can be used. The ALD method is preferably used because damage to the organic compound layer 113A can be reduced.

For example, an inorganic insulating film (e.g., an aluminum oxide film) formed by an ALD method can be used as the sacrificial layer 118A, and an inorganic film (e.g., an In—Ga—Zn oxide film, an aluminum film, or a tungsten film) formed by a sputtering method can be used as the sacrificial layer 119A. When a tungsten film is used as the sacrificial layer 119A and an aluminum oxide film is used as the sacrificial layer 118A, the tungsten film can be a hard mask and the aluminum oxide film can be processed using the hard mask. In addition, the film thickness of the sacrificial layer 119A including the tungsten film is preferably larger than the film thickness of the sacrificial layer 118 including the aluminum oxide film.

A material dissolvable in a solvent that is chemically stable with respect to a film located on the outermost surface of the organic compound layer 113A may be used for one or both of the sacrificial layer 118A and the sacrificial layer 119A. Specifically, a material that will be dissolved in water or alcohol can be suitably used. In depositing a film of such a material, it is preferable to apply the material dissolved in a solvent such as water or alcohol by a wet process and then perform heat treatment for evaporating the solvent. At this time, the heat treatment is preferably performed in a reduced-pressure atmosphere, in which case the solvent can be removed at a low temperature in a short time and thermal damage to the organic compound layer 113A can be reduced accordingly.

One or both of the sacrificial layer 118A and the sacrificial layer 119A are preferably formed by a wet process such as spin coating, dipping, spray coating, ink-jetting, dispensing, screen printing, offset printing, doctor blade coating, slit coating, roll coating, curtain coating, or knife coating.

For one or both of the sacrificial layer 118A and the sacrificial layer 119A, an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin is preferably used.

As illustrated in FIG. 8C, a mask 176 is formed over the sacrificial layer 119A and a mask 175 is formed in the connection portion 140. The mask 175 and the mask 176 can each be formed by application of a photosensitive resin (photoresist), light exposure, and development. The mask 175 and the mask 176 are each formed using either a positive resist material or a negative resist material.

The mask 176 is provided at a position overlapping with a region to be the light-emitting device 130*a*, for example, the conductive layer 111*a*. The mask 176 preferably covers a region beyond an end portion of the conductive layer 111*a*.

Figures 9A, 9B, 9C:
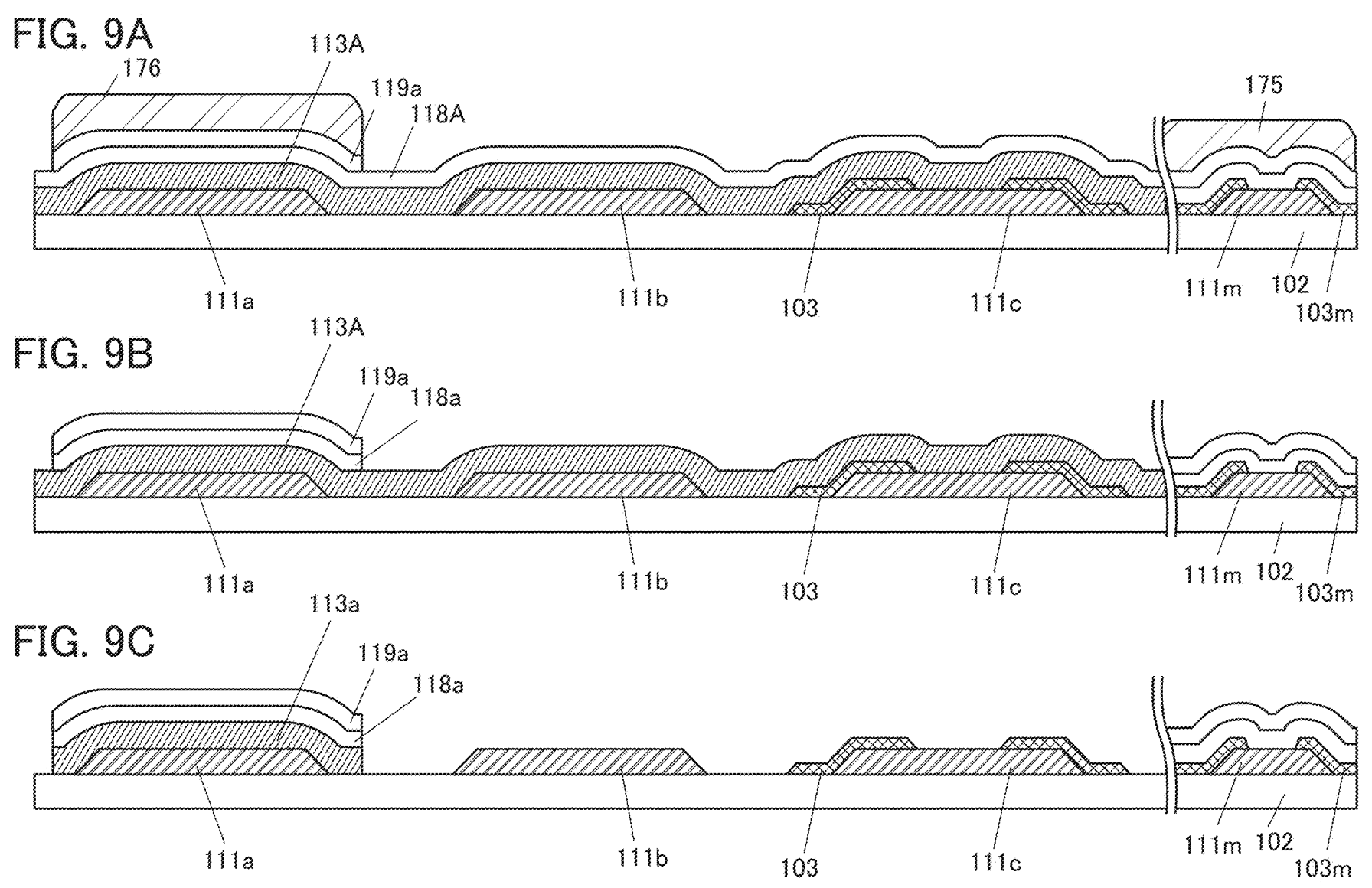

As illustrated in FIG. 9A, the sacrificial layer 119A is etched using the mask 176 to form a processed sacrificial layer 119*a*. In etching the sacrificial layer 119A, an etching condition with high selectivity is preferably employed so that the sacrificial layer 118A is not removed by the etching. In etching the sacrificial layer 119A, the sacrificial layer 118A is positioned on the outermost surface and the organic compound layer 113A is not exposed, so that the range of choices for etching conditions for the sacrificial layer 119A is wider than that for etching conditions for the sacrificial layer 118A. Although the organic compound layer 113A might deteriorate when exposed to oxygen gas, a gas containing oxygen can be used in etching the sacrificial layer 119A.

As illustrated in FIG. 9B, the mask 175 and the mask 176 are removed. The mask 175 and the mask 176 can be removed by ashing or the like using oxygen plasma, for example. Alternatively, an oxygen gas and any of $CF_4$, $C_4F_8$, $SF_6$, $CHF_3$, $Cl_2$, $H_2O$, $BCl_3$, and a rare gas such as He may be used. Alternatively, the mask 175 and the mask 176 may be removed by wet etching. At this time, the sacrificial layer 118A is positioned on the outermost surface and the organic compound layer 113A is not exposed; thus, oxygen plasma can be used for removing the mask 175 and the mask 176. When the sacrificial layer 118A is positioned on the outermost surface, the organic compound layer 113A can be inhibited from being damaged in the step of removing the mask 176. In addition, the range of choices of the method for removing the mask is widened.

Next, part of the sacrificial layer 118A is removed using the processed sacrificial layer 119*a* as a mask (also referred to as a hard mask), so that the sacrificial layer 118*a* is formed.

Etching conditions for the sacrificial layer 118A and the sacrificial layer 119A are described. One or both of the sacrificial layer 118A and the sacrificial layer 119A can be processed by a wet etching method or a dry etching method. One or both of the sacrificial layer 118A and the sacrificial layer 119A are preferably etched by anisotropic etching.

The use of a wet etching method can reduce damage to the organic compound layer 113A in processing of one or both of the sacrificial layer 118A and the sacrificial layer 119A, as compared with the case of using a dry etching method. In the case of using a wet etching method, it is preferable to use a developer, a tetramethylammonium hydroxide aqueous solution (TMAH), dilute hydrofluoric acid, oxalic acid, phosphoric acid, acetic acid, nitric acid, or a chemical solution containing a mixed solution of any of these acids, for example.

In the case of using a dry etching method, deterioration of the organic compound layer 113A can be inhibited by not using a gas containing oxygen as the etching gas. In the case of using a dry etching method, it is preferable to use $CF_4$, $C_4F_8$, $SF_6$, $CHF_3$, $Cl_2$, $H_2O$, $BCl_3$, or a gas containing a rare gas such as He as the etching gas, for example. Note that in etching the sacrificial layer 119A, the sacrificial layer 118A is positioned on the outermost surface and the organic compound layer 113A is not exposed, so that the sacrificial layer 119A can be etched using a gas containing oxygen.

For example, when an aluminum oxide film formed by an ALD method is used as the sacrificial layer 118A, the sacrificial layer 118A can be etched by a dry etching method using $CHF_3$ and He. In the case where an In—Ga—Zn oxide film formed by a sputtering method is used as the sacrificial layer 119A, the sacrificial layer 119A can be etched by a wet etching method using diluted phosphoric acid. Alternatively, etching may be performed by a dry etching method using $CH_4$ and Ar. Alternatively, the sacrificial layer 119A can be etched by a wet etching method using diluted phosphoric acid. When a tungsten film formed by a sputtering method is used as the sacrificial layer 119A, the sacrificial layer 119A can be etched by a dry etching method using a combination of $SF_6$, $CF_4$, and $O_2$ or a combination of $CF_4$, $Cl_2$, and $O_2$.

As illustrated in FIG. 9C, the organic compound layer 113A is processed to form the organic compound layer 113*a*. For example, part of the organic compound layer 113A is removed using the sacrificial layer 119*a* and the sacrificial layer 118*a* as a hard mask, whereby the organic compound layer 113*a* is formed. On the outermost surface of the organic compound layer 113A, the second electron-transport layer having high heat resistance is preferably positioned. It is further preferable that the first electron-transport layer having high heat resistance be positioned below the second electron-transport layer having high heat resistance.

The organic compound layer 113A is preferably processed by anisotropic etching. In particular, anisotropic dry etching is preferable. Alternatively, wet etching may be used.

In the case of using a dry etching method, deterioration of the organic compound layer 113A can be suppressed by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Thus, damage to the organic compound layer 113A can be inhibited. Furthermore, a defect such as attachment of a reaction product generated at the etching can be inhibited.

In the case of using a dry etching method, it is preferable to use a gas containing one or two or more selected from $H_2$, $CF_4$, $C_4F_8$, $SF_6$, $CHF_3$, $Cl_2$, $H_2O$, $BCl_3$, a rare gas (He or Ar), and the like as the etching gas, for example. For example, a gas containing $H_2$ and Ar or a gas containing $CF_4$ and He can be used as the etching gas. Alternatively, a gas containing a selected gas and oxygen is preferably used as the etching gas. For example, a gas containing $CF_4$, He, and oxygen can be used as the etching gas. Alternatively, an oxygen gas may be used alone as the etching gas.

As described above, in one embodiment of the present invention, the mask 176 is formed over the sacrificial layer 119A and part of the sacrificial layer 119A is removed using the mask 176, so that the sacrificial layer 119*a* is formed. After that, part of the organic compound layer 113A is removed using the sacrificial layer 119*a* as a hard mask, so that the organic compound layer 113*a* is formed. As described above, the organic compound layer 113A is processed by a photolithography method, so that the organic compound layer 113*a* can be obtained.

Note that in addition to the sacrificial layer 119A, a sacrificial layer 118B and the organic compound layer 113A may be etched using the mask 176. After that, the mask 176 is removed.

Figures 10A, 10B, 10C:
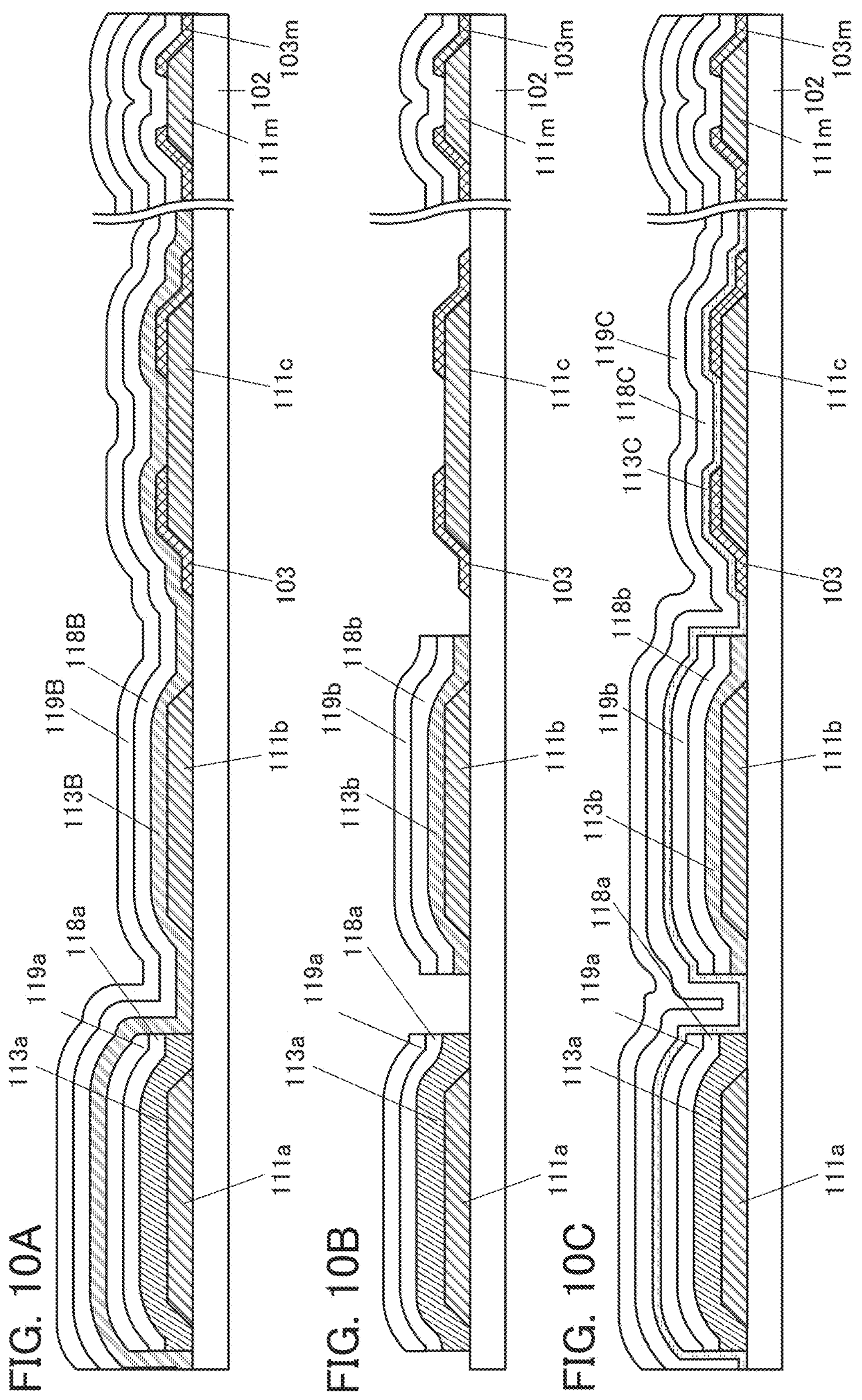
FIG. 10A to FIG. 10C are diagrams illustrating a method for manufacturing a display apparatus of one embodiment of the present invention.

As illustrated in FIG. 10A, an organic compound layer 113B, the sacrificial layer 118B, and a sacrificial layer 119B are formed. The formation surface of the organic compound layer 113B is preferably hydrophobic. Thus, hydrophobic treatment may be performed. For example, the hydrophobic treatment can be performed by plasma treatment using a $CF_4$ gas.

Before the organic compound layer 113B is formed, heat treatment is preferably performed in vacuum at a temperature higher than or equal to 70° C. and lower than or equal to 90° C. for longer than or equal to 15 minutes and shorter than or equal to 60 minutes. Surface adsorption water or the like on the formation surface of the organic compound layer 113B can be removed.

The film thickness of the organic compound layer 113B is different from the film thickness of the organic compound layer 113A. For example, the film thickness of the organic compound layer 113B is smaller than the film thickness of the organic compound layer 113A. This is for forming a microcavity structure.

As illustrated in FIG. 10B, etching is performed according to the steps illustrated in FIG. 8C to FIG. 9C, whereby the organic compound layer 113*b*, the sacrificial layer 118*b*, and a sacrificial layer 119*b* that are processed are formed.

As illustrated in FIG. 10C, an organic compound layer 113C, a sacrificial layer 118C, and a sacrificial layer 119C are formed. The formation surface of the organic compound layer 113C is preferably hydrophobic. Thus, hydrophobic treatment may be performed. For example, the hydrophobic treatment can be performed by plasma treatment using a $CF_4$ gas.

Before the organic compound layer 113C is formed, heat treatment is preferably performed in vacuum at a temperature higher than or equal to 70° C. and lower than or equal to 90° C. for longer than or equal to 15 minutes and shorter than or equal to 60 minutes. Surface adsorption water on the formation surface of the organic compound layer 113C can be removed.

The film thickness of the organic compound layer 113C is different from the film thickness of the organic compound layer 113A and the film thickness of the organic compound layer 113B. For example, the film thickness of the organic compound layer 113C is smaller than the film thickness of the organic compound layer 113A and the film thickness of the organic compound layer 113B. This is for forming a microcavity structure.

Figures 11A, 11B, 11C:
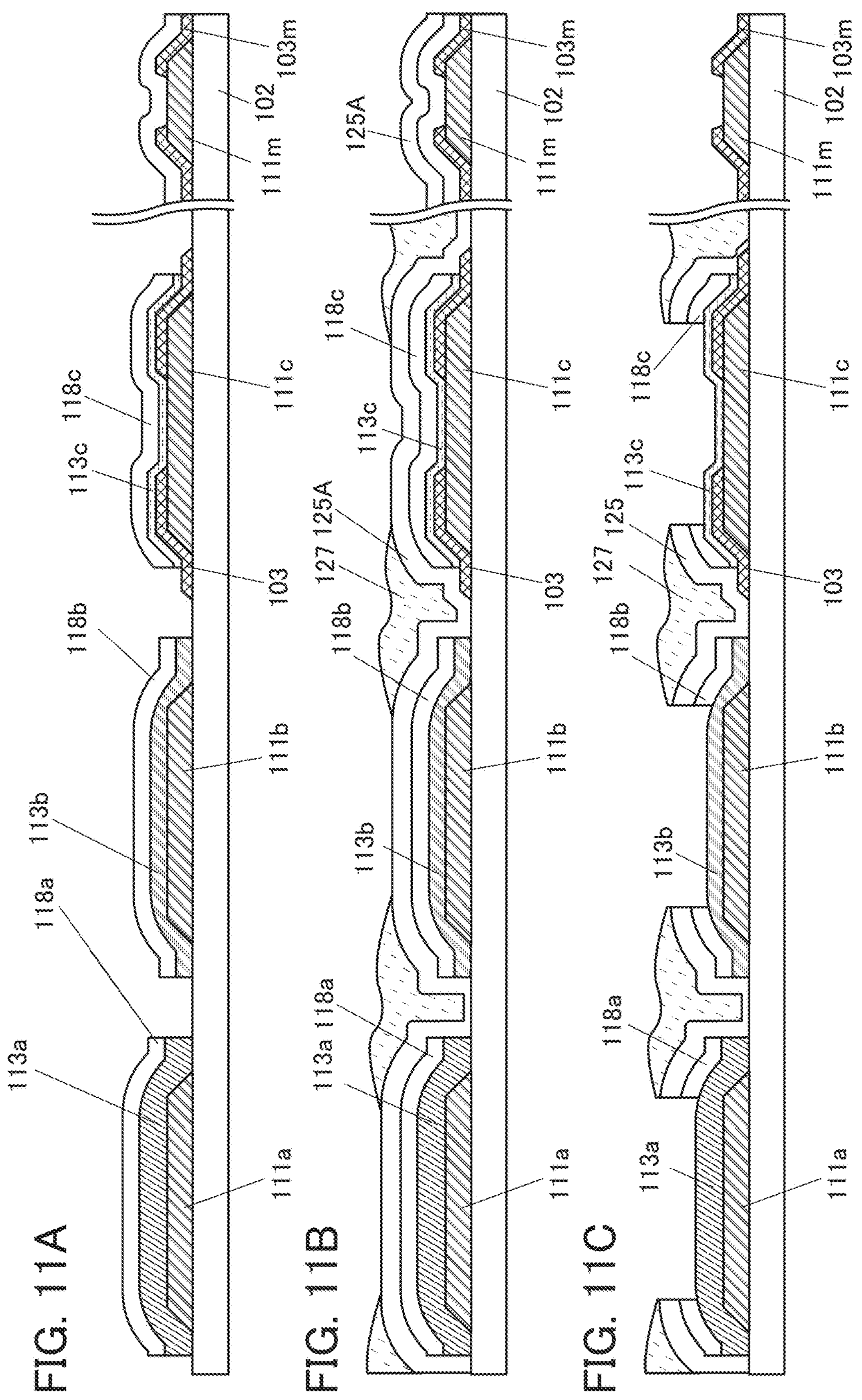

As illustrated in FIG. 11A, etching is performed according to the steps illustrated in FIG. 8C to FIG. 9C, whereby the organic compound layer 113*c*, the sacrificial layer 118*c*, and a sacrificial layer 119*c* that are processed are formed. After that, the sacrificial layer 119*a*, the sacrificial layer 119*b*, the sacrificial layer 119*c*, and a sacrificial layer 119 in the connection portion 140 are removed.

As illustrated in FIG. 11B, an insulating layer 125A to be the insulating layer 125 later is formed to cover the organic compound layer 113 and the sacrificial layer 118. The insulating layer 125A is formed also in the connection portion 140.

As the insulating layer 125A, an insulating film is preferably formed under a condition where the substrate temperature is higher than or equal to 60° C., higher than or equal to 80° C., higher than or equal to 100° C., or higher than or equal to 120° C. and lower than or equal to 200° C., lower than or equal to 180° C., lower than or equal to 160° C., lower than or equal to 150° C., or lower than or equal to 140° C. to have a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

As the insulating layer 125A, for example, an aluminum oxide film is preferably formed by an ALD method.

Next, the insulating layer 127 is formed over the insulating layer 125A. In the connection portion 140, the insulating layer 127 is not formed. For the insulating layer 127, a material having photosensitivity can be used, and for example, a photosensitive resin can be used. It is preferable to use a starting material of a material having photosensitivity, which is diluted greater than or equal to 2 times and less than or equal to 10 times, preferably greater than or equal to 2 times and less than or equal to 4 times with a dilute solution. When an undiluted solution of the starting material is used, the film thickness of the insulating layer 127 is greater than or equal to 0.8 μm and less than or equal to 1.2 μm. When the starting material diluted 2 times with a dilute solution is used, the film thickness of the insulating layer 127 is greater than or equal to 0.4 m and less than or equal to 0.6 μm. When the starting material diluted 3 times with a dilute solution is used, the film thickness of the insulating layer 127 is greater than or equal to 0.5 m and less than or equal to 0.7 μm. When the diluted starting material is used, the film thickness can be small and the amount of gas released from the insulating layer 127 can be reduced. The viscosity of the starting material with which the film thickness can be small is higher than or equal to 3 cP and lower than or equal to 10 cP, preferably higher than or equal to 5 cP and lower than or equal to 7 cP.

The insulating layer 127 can be formed by, for example, a wet process such as spin coating, dipping, spray coating, ink-jetting, dispensing, screen printing, offset printing, doctor blade coating, slit coating, roll coating, curtain coating, or knife coating. Specifically, the organic insulating film to be the insulating layer 127 is preferably formed by spin coating.

After the insulating layer 127 is formed, heat treatment is preferably performed in the air at a temperature higher than or equal to 85° C. and lower than or equal to 120° C. for longer than or equal to 45 minutes and shorter than or equal to 100 minutes. The insulating layer 127 can be dehydrated or degassed.

The insulating layer 125A and the insulating layer 127 are preferably deposited by a formation method by which the organic compound layer 113 is less damaged. In particular, the insulating layer 125A, which is formed in contact with the side surface of the organic compound layer 113, is preferably deposited by a formation method that causes less damage to the organic compound layer 113 than the method of forming the insulating layer 127. The insulating layer 125A and the insulating layer 127 are each formed at a temperature lower than the upper temperature limit of the organic compound layer 113. The typical substrate temperatures in formation of the insulating layer 125A and the insulating layer 127 are each lower than or equal to 200° C., preferably lower than or equal to 180° C., further preferably lower than or equal to 160° C., still further preferably lower than or equal to 150° C., yet still further preferably lower than or equal to 140° C. As the insulating layer 125A, an aluminum oxide film can be formed by an ALD method, for example. The use of an ALD method is preferable, in which case damage by the deposition is reduced and a film with good coverage can be deposited.

In the case where a material having photosensitivity is used for the insulating layer 127, exposure and development are performed, whereby the processed insulating layer 127 can be formed. The surface of the processed insulating layer 127 may have an uneven shape. Etching may be performed so that the surface level of the processed insulating layer 127 is adjusted. The insulating layer 127 is processed by ashing using oxygen plasma, so that the surface level can be adjusted.

As illustrated in FIG. 1C, at least part of the insulating layer 125A is removed to form the insulating layer 125. Part of the insulating layer 125A can be removed using the insulating layer 127 as a mask. After that, the sacrificial layer 118 is removed. For the insulating layer 125A and the sacrificial layer 118, layers containing the same material are preferably selected. The removal step illustrated in this drawing is simplified. For example, the insulating layer 125A and the sacrificial layer 118 are each preferably formed using a film containing aluminum oxide.

By this removal step, at least part of the top surface of the organic compound layer 113 and at least part of the top surface of the conductive layer 111*m* in the connection portion 140 are exposed.

The insulating layer 125A is preferably processed by a dry etching method. The insulating layer 125A is preferably processed by anisotropic etching. The insulating layer 125A can be processed using an etching gas that can be used for processing the sacrificial layers.

For the removal of the sacrificial layer 118, a wet etching method is preferably employed. With this method, damage to the organic compound layer 113 in removal of the sacrificial layer can be reduced as compared to the case where the sacrificial layer is removed by a dry etching method, for example.

The sacrificial layer 118 may be removed by being dissolved in a solvent such as water or alcohol. Examples of alcohol include ethyl alcohol, methyl alcohol, isopropyl alcohol (IPA), and glycerin.

In the case where layers containing the same material are used as the insulating layer 125A and the sacrificial layer 118, the same etching conditions can be selected.

After the sacrificial layer 118 is removed, drying treatment may be performed to remove water included in the organic compound layer 113 and water adsorbed on the surface of the organic compound layer. For example, heat treatment in an inert gas atmosphere or a reduced-pressure atmosphere can be performed. The heat treatment can be performed with a substrate temperature higher than or equal to 60° C. and lower than or equal to 150° C., preferably higher than or equal to 70° C. and lower than or equal to 120° C. Employing a reduced-pressure atmosphere is preferable, in which case drying at a lower temperature is possible.

Figures 12A, 12B:
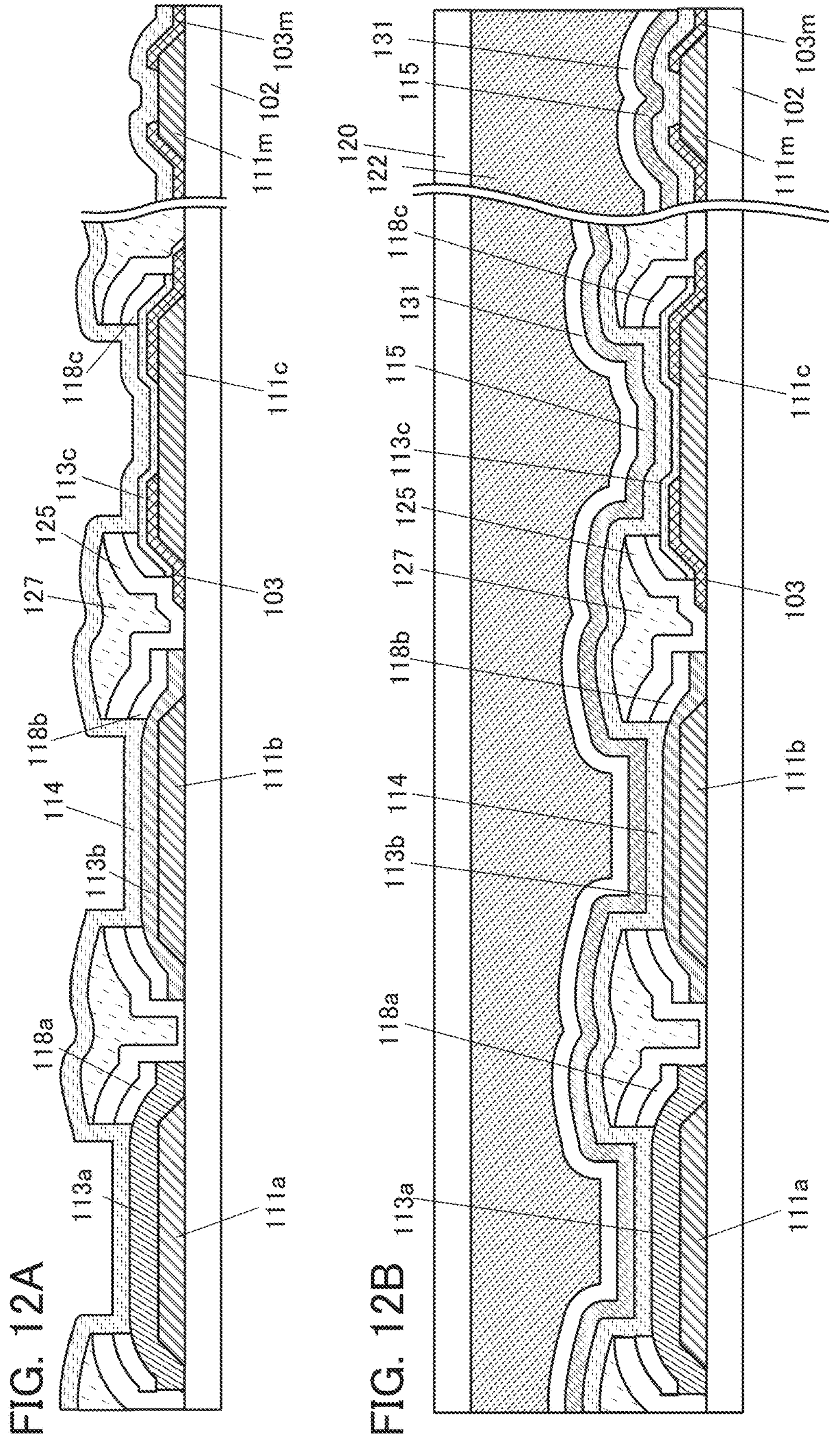
FIG. 12A and FIG. 12B are diagrams illustrating a method for manufacturing a display apparatus of one embodiment of the present invention.

As illustrated in FIG. 12A, the electron-injection layer 114 is formed over the insulating layer 125, the insulating layer 127, and the organic compound layer 113 and over the conductive layer 111*m* in the connection portion 140. The electron-injection layer 114 is one of common layers. The electron-injection layer 114 can be formed by a vacuum evaporation method, a transfer method, a printing method, an inkjet method, a coating method, or the like.

Before the electron-injection layer 114 is formed, heat treatment is preferably performed in vacuum at a temperature higher than or equal to 70° C. and lower than or equal to 90° C. for longer than or equal to 45 minutes and shorter than or equal to 120 minutes. Surface adsorption water on the formation surface of the electron-injection layer 114 can be removed.

As illustrated in FIG. 12B, the conductive layer 115 is formed over the electron-injection layer 114. The conductive layer 115 can be formed by a sputtering method or a vacuum evaporation method, for example. Alternatively, a film formed by an evaporation method and a film formed by a sputtering method may be stacked.

A conductive film that transmits visible light is used as the electrode through which light is extracted among the conductive layer 111 and the conductive layer 115. A conductive film that reflects visible light is preferably used as the electrode through which light is not extracted.

As a material that forms the pair of electrodes (the conductive layer 111 and the conductive layer 115) of the light-emitting device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La); and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) and an alloy containing an appropriate combination of any of these. It is also possible to use an element belonging to Group 1 or Group 2 of the periodic table, which is not exemplified above (e.g., lithium (Li), cesium (Cs), calcium (Ca), or strontium (Sr)), a rare earth metal such as europium (Eu) or ytterbium (Yb), an alloy containing an appropriate combination of any of these, graphene, or the like.

The light-emitting devices employ a microcavity structure. Therefore, one of the pair of electrodes of the light-emitting devices is preferably an electrode having a visible-light-transmitting property and a visible-light-reflecting property (a semi-transmissive and semi-reflective electrode), and the other is preferably an electrode having a visible-light-reflecting property (a reflective electrode).

Note that the semi-transmissive and semi-reflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting devices. The semi-transmissive and semi-reflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 1000%. These electrodes preferably have a resistivity lower than or equal to $1\times10^{-2}$ Ωcm.

After that, the protective layer 131 is formed over the conductive layer 115. Providing the protective layer 131 can enhance the reliability of the light-emitting device. The protective layer 131 may have either a single-layer structure or a stacked-layer structure of two or more layers. Examples of the deposition method of the protective layer 131 include a vacuum evaporation method, a sputtering method, a CVD method, and an ALD method. The protective layer 131 may have either a single-layer structure or a stacked-layer structure.

There is no limitation on the conductivity of the protective layer 131. As the protective layer 131, at least one type of insulating films, semiconductor films, and conductive films can be used.

The protective layer 131 containing an inorganic material can inhibit deterioration of the light-emitting devices by preventing oxidation of the conductive layer 115 and inhibiting entry of impurities (e.g., moisture and oxygen) into the light-emitting device 130, for example; thus, the reliability of the display apparatus can be improved.

As the protective layer 131, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

The protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the conductive layer 115. The inorganic film may further contain nitrogen.

When light emitted from the light-emitting device is extracted through the protective layer 131, the protective layer 131 preferably has a high visible-light-transmitting property. For example, ITO, IGZO, and aluminum oxide are preferable because they are inorganic materials having a high visible-light-transmitting property.

The protective layer 131 can have, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (e.g., water and oxygen) into the EL layer.

Furthermore, the protective layer 131 may include an organic film. For example, the protective layer 131 may include both an organic film and an inorganic film.

The protective layer 131 may have a stacked-layer structure of two layers which are formed by different deposition methods. Specifically, the first layer and the second layer of the protective layer 131 may be formed by an ALD method and a sputtering method, respectively.

Furthermore, the substrate 120 is bonded to the protective layer 131 with the resin layer 122, whereby the display apparatus 100 illustrated in FIG. 6B or the like can be manufactured.

As the resin layer 122, any of a variety of curable adhesives such as a reactive curable adhesive, a thermosetting curable adhesive, an anaerobic adhesive, and a photo-curable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

A light-blocking layer may be provided on the surface of the substrate 120 on the resin layer 122 side. A variety of optical members can be arranged on the outer surface of the substrate 120. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film suppressing the attachment of stain, a hard coat film inhibiting generation of a scratch caused by the use, an impact-absorbing layer, or the like may be arranged on the outer surface of the substrate 120.

For the substrate 120, glass, quartz, ceramics, sapphire, a resin, a metal, an alloy, a semiconductor, or the like can be used. The substrate on the side from which light from the light-emitting device is extracted is formed using a material that transmits the light. When the substrate 120 is formed using a flexible material, the flexibility of the display apparatus can be increased. Furthermore, a polarizing plate may be used as the substrate 120.

For the substrate 120, any of the following can be used: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for the substrate 120.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefn polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

In this manner, the display apparatus 100 can be manufactured.

<Manufacturing Method 2>

Figures 13A, 13B, 13C:
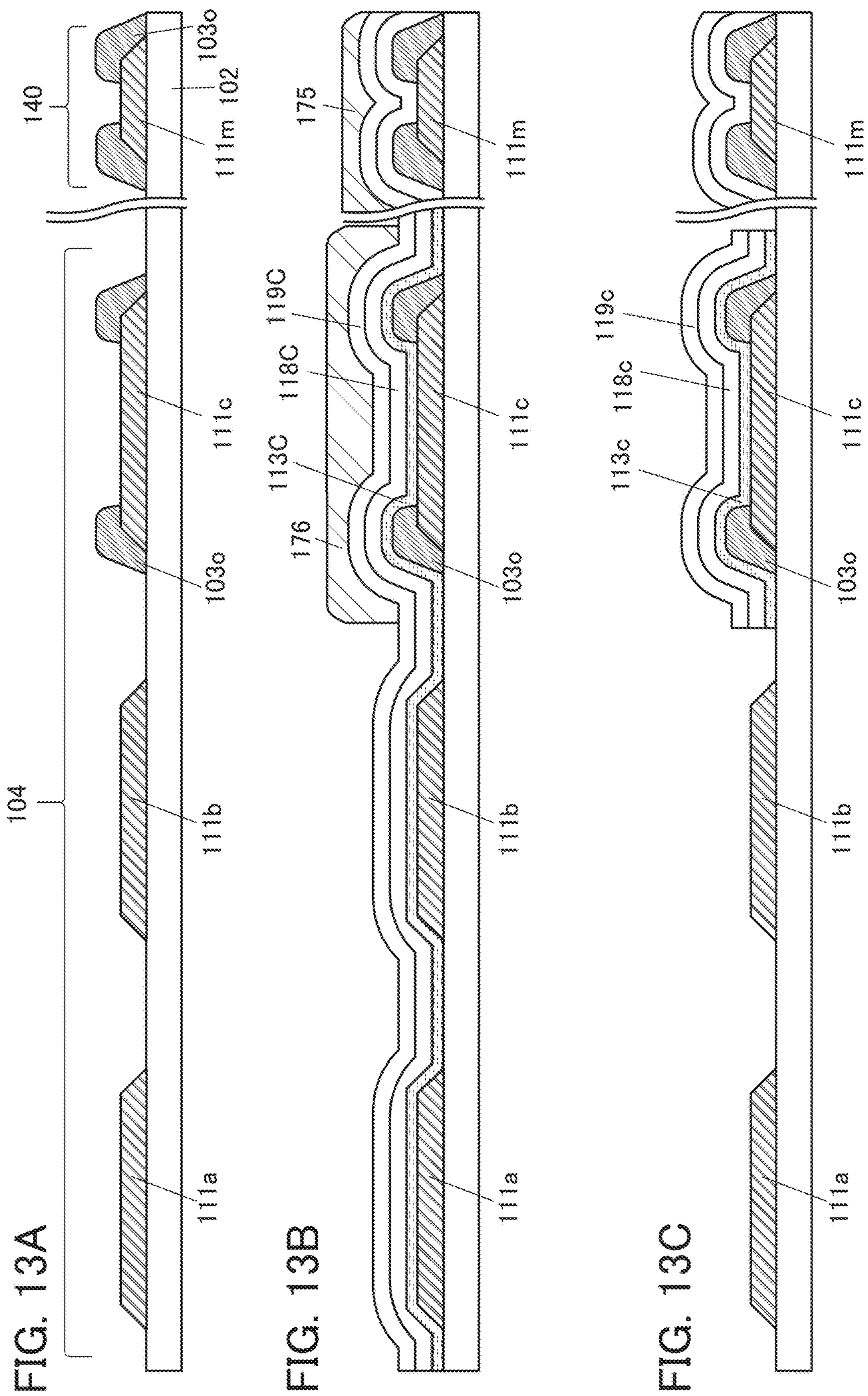
FIG. 13A to FIG. 13C are diagrams illustrating a method for manufacturing a display apparatus of one embodiment of the present invention.

FIG. 13A illustrates Manufacturing method 2 of the display apparatus of one embodiment of the present invention.

As illustrated in FIG. 13A, in a step similar to that in FIG. 8A, the conductive layer 111*a*, the conductive layer 111*b*, and the conductive layer 111*c* are formed over the layer 102 and the conductive layer 111*m* is formed in the connection portion 140.

The insulating layer 103*o* is formed over the conductive layer 111*c*. As already described above, the insulating layer 103*o* can contain an inorganic material or an organic material and has either a single-layer structure or a stacked-layer structure.

In FIG. 13A, the insulating layer 103*o* containing an organic material is formed in the pixel portion 104 and the connection portion 140, and the film thickness is greater than or equal to 0.1 μm and less than or equal to 1 μm, preferably greater than or equal to 0.1 μm and less than or equal to 0.5 μm. An organic material contained in the insulating layer 103*o* preferably contains an organic resin such as a polyimide resin, a polyamide resin, an acrylic resin, a siloxane resin, a silicone resin, an epoxy resin, or a phenol resin.

As illustrated in FIG. 13B, in Manufacturing method 2, the organic compound layer of the light-emitting device 130*c* is formed first. This is for preventing unintended processing of the insulating layer 103*o*. For example, in a step similar to that in FIG. 10C, the organic compound layer 113C, the sacrificial layer 118C, and the sacrificial layer 119C are formed.

The mask 176 is formed over the sacrificial layer 119C, and the mask 175 is formed over the sacrificial layer 119C also in the connection portion 140.

As illustrated in FIG. 13C, through steps similar to those in FIG. 8C to FIG. 9C, the sacrificial layer 119C is processed using the mask 176 to form the sacrificial layer 119*c*. After that, the mask 175 and the mask 176 are removed. Then, using the sacrificial layer 119*c* as a hard mask, the sacrificial layer 118C is processed to form the sacrificial layer 118*c* and the organic compound layer 113C is processed to form the organic compound layer 113*c*. At this time, the insulating layer 103*o* is prevented from being exposed to an etching gas or the like. In other words, a state where the insulating layer 103*o* is covered with at least the sacrificial layer 119C or the sacrificial layer 118C is maintained. In this manner, unintended processing of the insulating layer 103*o* can be prevented.

Figure 14A:
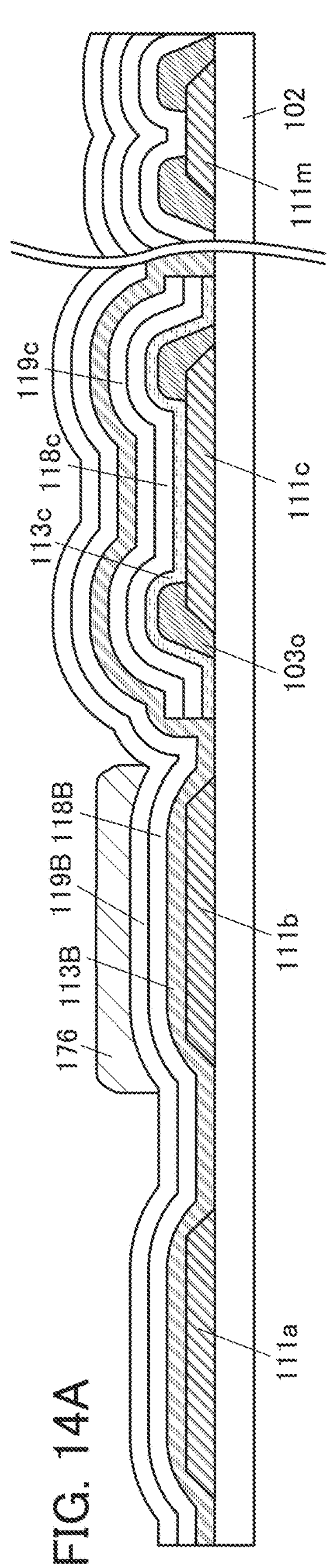
FIG. 14A and FIG. 14B are diagrams illustrating a method for manufacturing a display apparatus of one embodiment of the present invention.

As illustrated in FIG. 14A, in a step similar to that in FIG. 10A, the organic compound layer 113B, the sacrificial layer 118B, and the sacrificial layer 119B are formed. The sacrificial layer 118B and the sacrificial layer 119B are formed also in the connection portion 140. The mask 176 is provided so as to overlap with a region where the light-emitting device 130*b* is to be formed. The connection portion 140 is not provided with a mask.

Figure 14B:
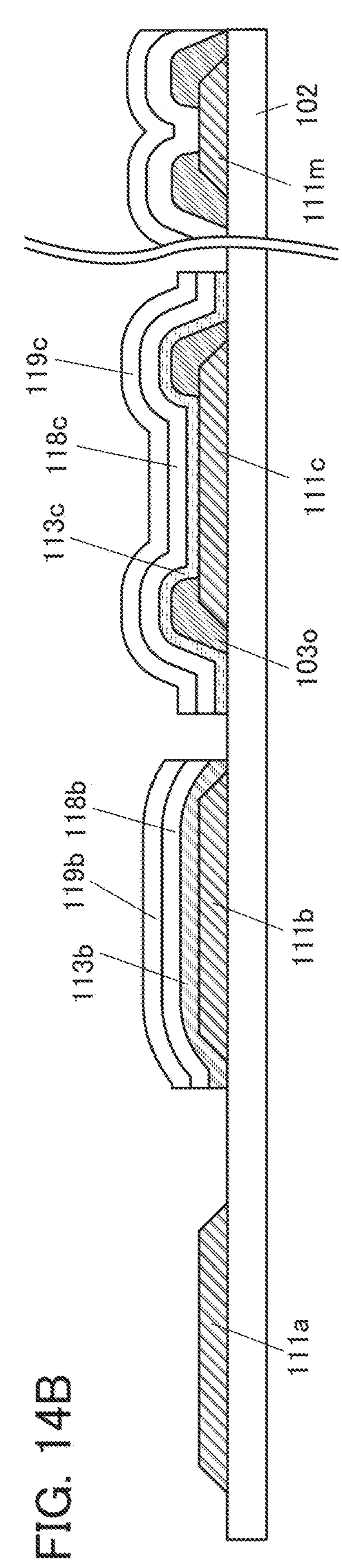

As illustrated in FIG. 14B, through steps similar to those in FIG. 8C to FIG. 9C, the sacrificial layer 119B is processed using the mask 176 to form the sacrificial layer 119*b*. The sacrificial layer 119B is removed also in the connection portion 140. After that, the mask 176 is removed. Then, using the sacrificial layer 119*b* as a hard mask, the sacrificial layer 118B is processed to form the sacrificial layer 118*b* and the organic compound layer 113B is processed to form the organic compound layer 113*b*. Also in the connection portion 140, the sacrificial layer 118B is removed and the sacrificial layer 119*c* is exposed.

Figures 15A, 15B:
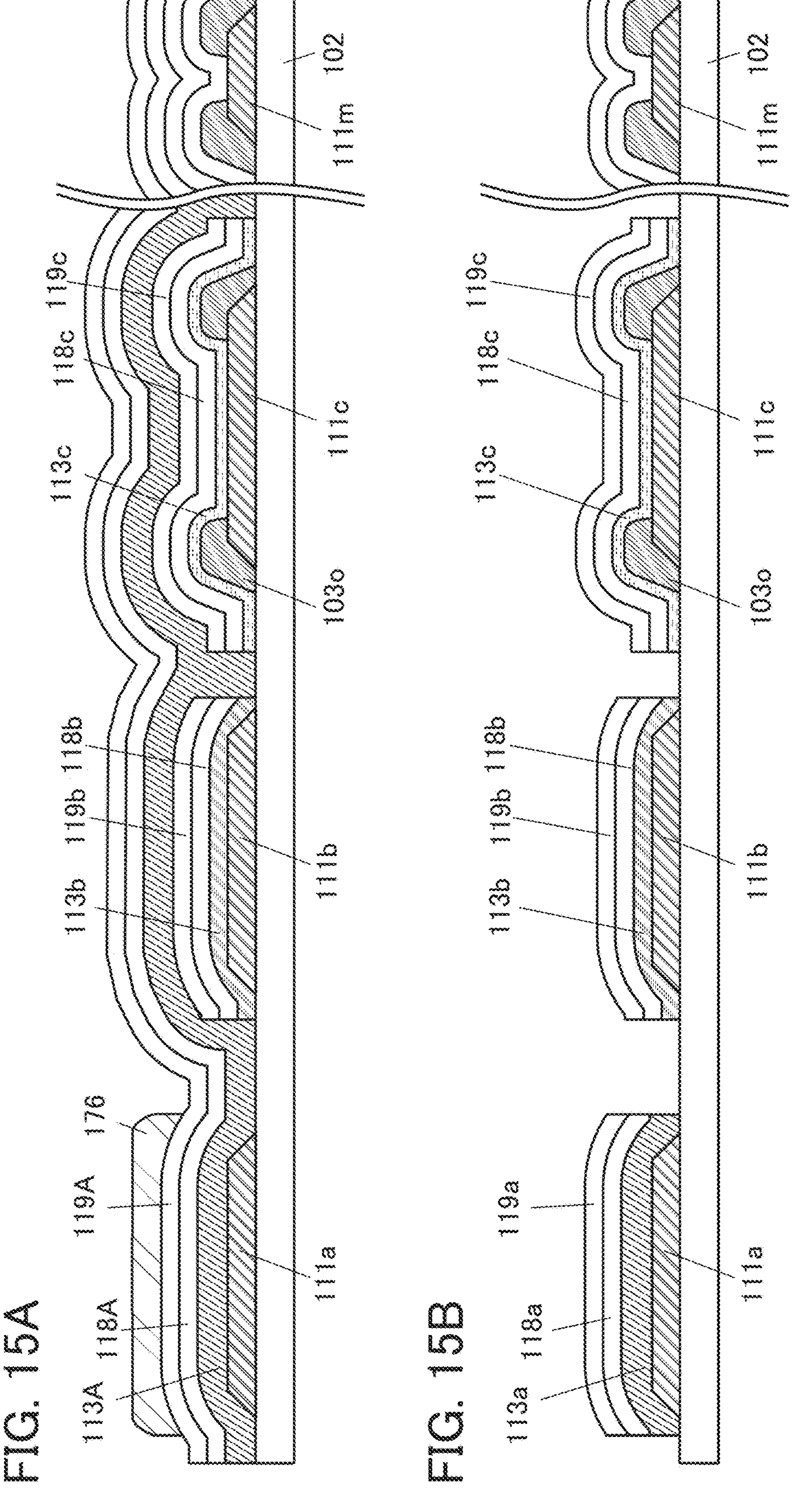
FIG. 15A and FIG. 15B are diagrams illustrating a method for manufacturing a display apparatus of one embodiment of the present invention.

As illustrated in FIG. 15A, in a step similar to that in FIG. 8B, the organic compound layer 113A, the sacrificial layer 118A, and the sacrificial layer 119A are formed. The sacrificial layer 118A and the sacrificial layer 119A are formed also in the connection portion 140. The mask 176 is provided so as to overlap with a region where the light-emitting device 130*a* is to be formed. The connection portion 140 is not provided with a mask.

As illustrated in FIG. 15B, through steps similar to those in FIG. 8C to FIG. 9C, the sacrificial layer 119A is processed using the mask 176 to form the sacrificial layer 119*a*. The sacrificial layer 119A is removed also in the connection portion 140. After that, the mask 176 is removed. Then, using the sacrificial layer 119*a* as a hard mask, the sacrificial layer 118A is processed to form the sacrificial layer 118*a* and the organic compound layer 113A is processed to form the organic compound layer 113*a*. Also in the connection portion 140, the sacrificial layer 118A is removed and the sacrificial layer 119*c* is exposed.

Figures 16A, 16B:
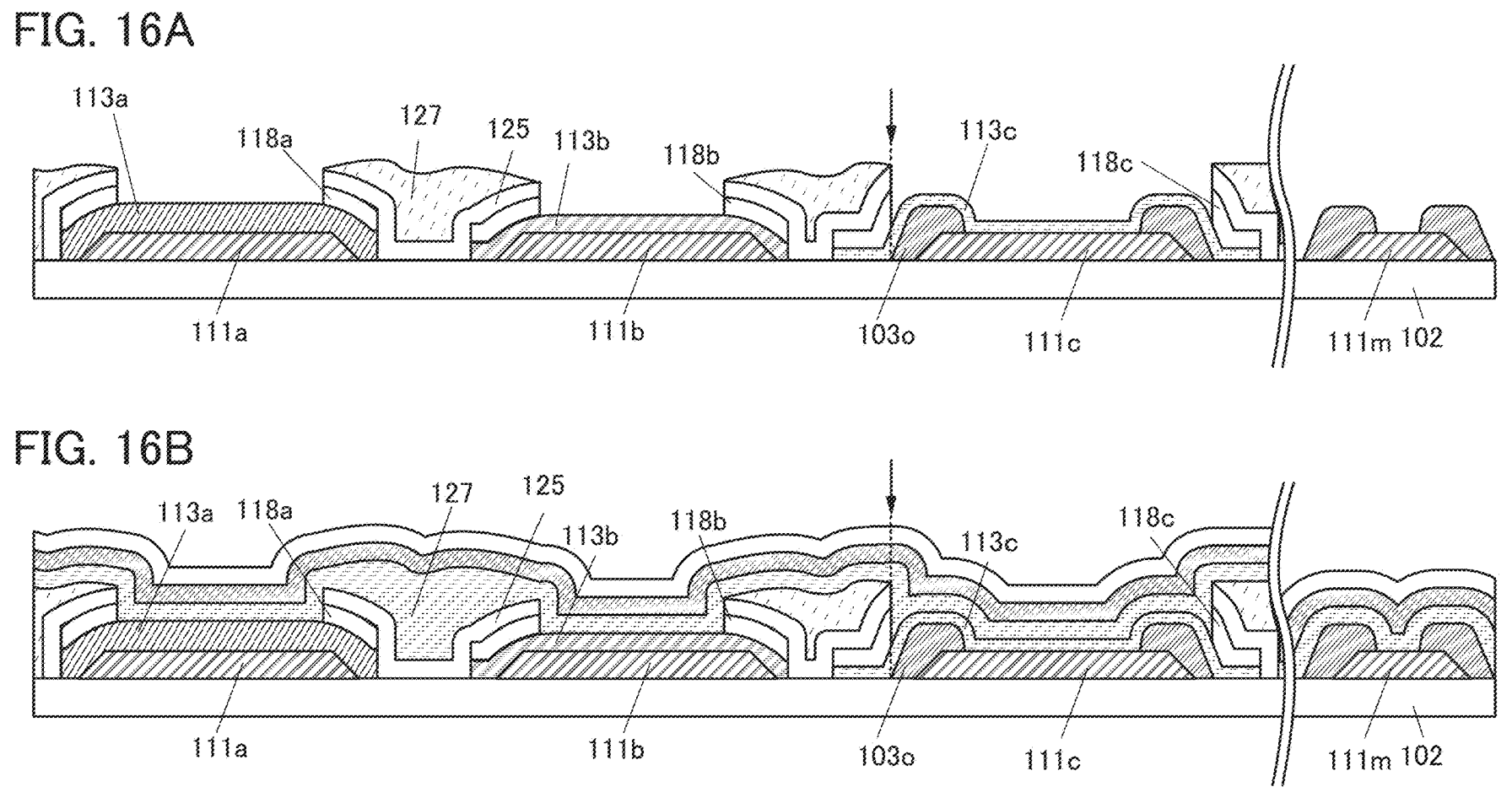

As illustrated in FIG. 16A, through steps similar to those in FIG. 11B and FIG. 1C, the sacrificial layer 119*a*, the sacrificial layer 119*b*, and the sacrificial layer 119*c* are removed and then the insulating layer 125 and the insulating layer 127 are formed. The insulating layer 127 is preferably formed in a region not overlapping with the insulating layer 103*o* in a top view. In a region denoted by the arrow and a region in the vicinity thereof in FIG. 16A, a boundary between the insulating layer 127 and the insulating layer 103*o* can be observed. For example, the light-emitting device 130*c* including the insulating layer 103*o* is configured not to include the insulating layer 127. Therefore, the light-emitting device 130*c* is less likely to be affected by the defect of the insulating layer 127, which is preferable. Note that an end portion of the organic compound layer 113*c* is covered with the insulating layer 125 and thus deterioration can be suppressed.

As illustrated in FIG. 16B, through steps similar to those in FIG. 12A and FIG. 12B, the electron-injection layer 114 is formed and the conductive layer 115 is formed over the electron-injection layer. The electron-injection layer and the conductive layer 115 are formed also in the connection portion 140. The conductive layer 115 in the connection portion 140 may be referred to as a conductive layer 115*m*. The protective layer 131 is formed over the conductive layer 115 and the conductive layer 115*m*.

Figure 17:
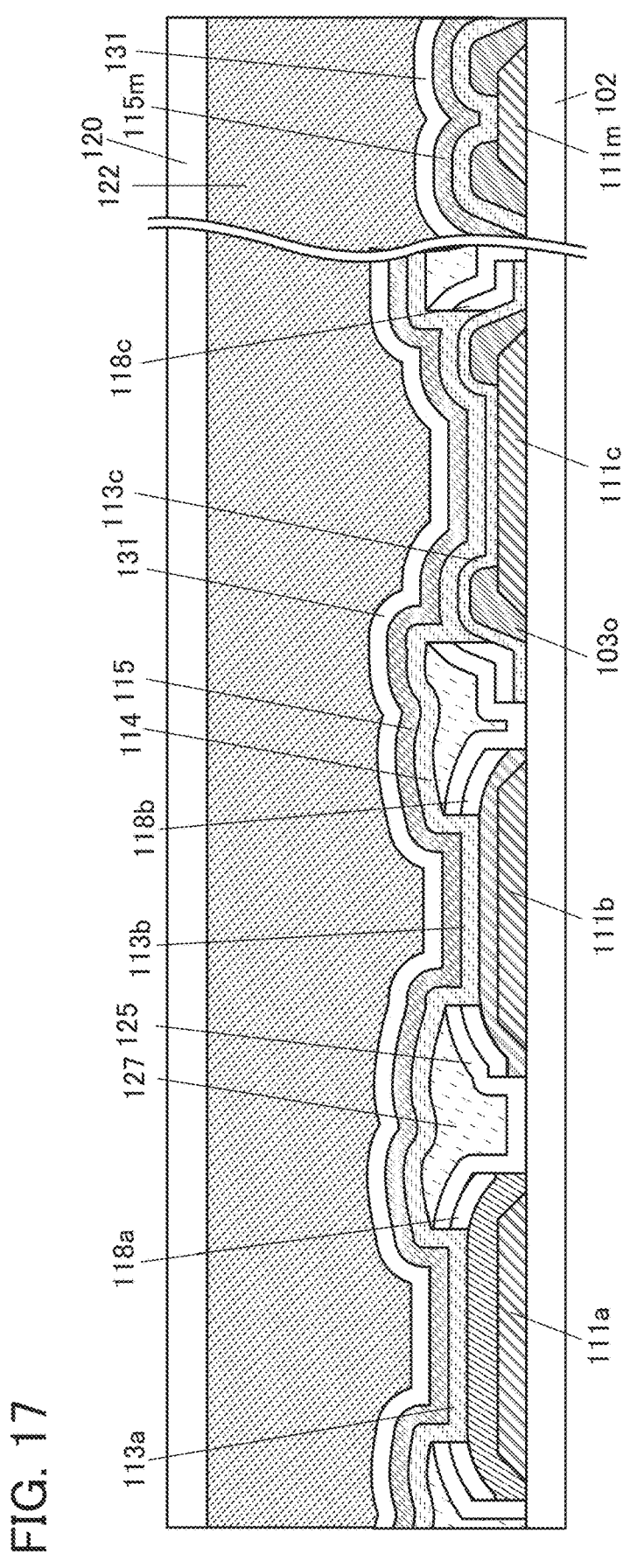

As illustrated in FIG. 17, in a step similar to that in FIG. 12B, the protective layer 131 is bonded to the substrate 120 with the resin layer 122.

In this manner, the display apparatus 100 can be manufactured.

[Pixel Layout]

Next, pixel layouts different from those in FIG. 6A will be described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of the top surface shape of the subpixel include polygons such as a triangle, a tetragon (including a rectangle and a square), and a pentagon; polygons with rounded corners; an ellipse; and a circle. Here, the top surface shape of the subpixel corresponds to the top surface shape of a light-emitting region of the light-emitting device.

Figures 18A, 18B, 18C, 18D, 18E:
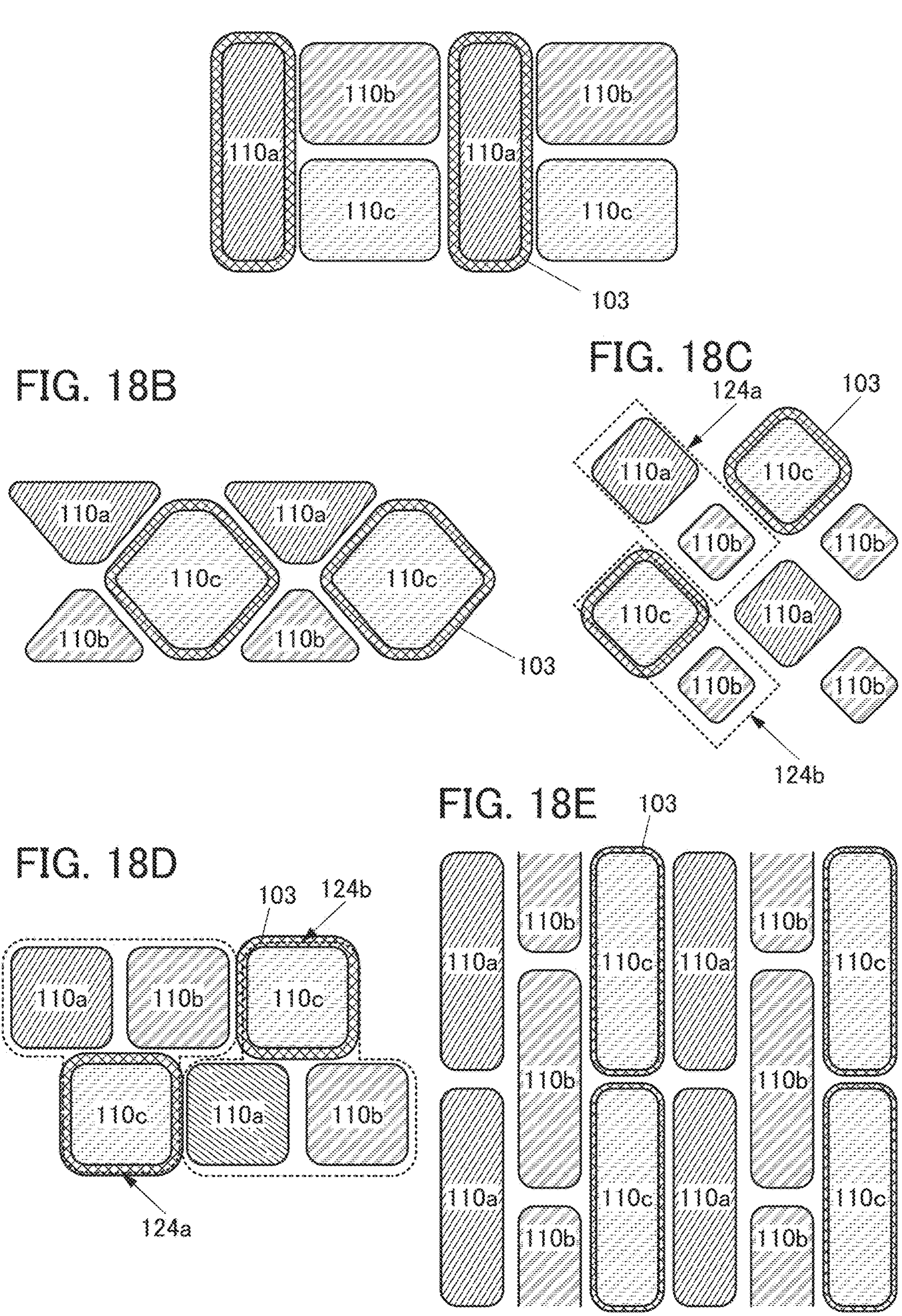
FIG. 18A to FIG. 18E are plan views of a display apparatus of one embodiment of the present invention.

The pixel 110 illustrated in FIG. 18A employs S-stripe arrangement. The pixel 110 illustrated in FIG. 18A consists of three subpixels: the subpixel 110*a*, the subpixel 110*b*, and the subpixel 110*c*. For example, the subpixel 110*b* is positioned next to the subpixel 110*a* and the subpixel 110*c* is positioned next to 110*b*. For example, the subpixel 110*a* may be a blue subpixel B, the subpixel 110*b* may be a red subpixel R, and the subpixel 110*c* may be a green subpixel G. In the subpixel 110*c*, the insulating layer 103 is illustrated. The insulating layer 103 may be provided in a component other than the subpixel 110*c*. The insulating layer 103 can be rephrased as the insulating layer 103*o*.

The pixel 110 illustrated in FIG. 18B includes the subpixel 110*a* whose top surface has a rough trapezoidal shape with rounded corners, the subpixel 110*b* whose top surface has a rough triangle shape with rounded corners, and the subpixel 110*c* whose top surface has a rough tetragonal or rough hexagonal shape with rounded corners. For example, the subpixel 110*b* is positioned next to the subpixel 110*a* and the subpixel 110*c* is positioned next to 110*b*. The subpixel 110*a* has a larger light-emitting area than the subpixel 110*b*. In this manner, the shapes and sizes of the subpixels can be determined independently. For example, the size of a subpixel including a light-emitting device with higher reliability can be smaller. For example, the subpixel 110*a* may be the green subpixel G, the subpixel 110*b* may be the red subpixel R, and the subpixel 110*c* may be the blue subpixel B. In the subpixel 110*c*, the insulating layer 103 is illustrated. The insulating layer 103 may be provided in a component other than the subpixel 110*c*. The insulating layer 103 can be rephrased as the insulating layer 103*o*.

Pixels 124*a* and 124*b* illustrated in FIG. 18C employ pentile arrangement. FIG. 18C illustrates an example in which the pixels 124*a* each including the subpixel 110*a* and the subpixel 110*b* and the pixels 124*b* each including the subpixel 110*b* and the subpixel 110*c* are alternately arranged. For example, the subpixel 110*b* is positioned next to the subpixel 110*a* and the subpixel 110*c* is positioned next to 110*b*. For example, the subpixel 110*a* may be the red subpixel R, the subpixel 110*b* may be the green subpixel G, and the subpixel 110*c* may be the blue subpixel B. In the subpixel 110*c*, the insulating layer 103 is illustrated. The insulating layer 103 may be provided in a component other than the subpixel 110*c*. The insulating layer 103 can be rephrased as the insulating layer 103*o*.

The pixels 124*a* and 124*b* illustrated in FIG. 18D employ delta arrangement. The pixel 124*a* includes two subpixels (the subpixels 110*a* and 110*b*) in the upper row (first row) and one subpixel (the subpixel 110*c*) in the lower row (second row). For example, the subpixel 110*b* is positioned next to the subpixel 110*a* and the subpixel 110*c* is positioned next to 110*b*. The pixel 124*b* includes one subpixel (the subpixel 110*c*) in the upper row (first row) and two subpixels (the subpixels 110*a* and 110*b*) in the lower row (second row). For example, the subpixel 110*a* may be the red subpixel R, the subpixel 110*b* may be the green subpixel G, and the subpixel 110*c* may be the blue subpixel B. In the subpixel 110*c*, the insulating layer 103 is illustrated. The insulating layer 103 may be provided in a component other than the subpixel 110*c*. The insulating layer 103 can be rephrased as the insulating layer 103*o*.

FIG. 18E shows an example in which subpixels of different colors are arranged in a zigzag manner. Specifically, the positions of the top sides of two subpixels arranged in the column direction (e.g., the subpixel 110*a* and the subpixel 110*b* or the subpixel 110*b* and the subpixel 110*c*) are not aligned in a top view. For example, the subpixel 110*b* is positioned next to the subpixel 110*a* and the subpixel 110*c* is positioned next to 110*b*. For example, the subpixel 110*a* may be the red subpixel R, the subpixel 110*b* may be the green subpixel G, and the subpixel 110*c* may be the blue subpixel B. In the subpixel 110*c*, the insulating layer 103 is illustrated. The insulating layer 103 may be provided in a component other than the subpixel 110*c*. The insulating layer 103 can be rephrased as the insulating layer 103*o*.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface shape of a subpixel may be a polygonal shape with rounded corners, an elliptical shape, a circular shape, or the like.

Furthermore, in the method of manufacturing the display apparatus of one embodiment of the present invention, the organic compound layer is processed by a lithography method. A mask formed over the organic compound layer needs to be cured at a temperature lower than the upper temperature limit of the organic compound layer. Therefore, the mask is insufficiently cured in some cases depending on the upper temperature limit of the material of the organic compound layer and the curing temperature of the mask material. An insufficiently cured mask may have a shape different from a desired shape by processing. As a result, the top surface shape of the organic compound layer may be a polygonal shape with rounded corners, an elliptical shape, a circular shape, or the like. For example, when a resist mask whose top surface shape is square is intended to be formed, a resist mask whose top surface shape is circular may be formed, and the top surface shape of the organic compound layer may be circular.

To obtain a desired top surface shape of the organic compound layer, a technique of correcting a mask pattern in advance so that a transferred pattern agrees with a design pattern (OPC (Optical Proximity Correction) technique) may be used. Specifically, with the OPC technique, a pattern for correction is added to a corner portion or the like of a figure on a mask pattern.

As illustrated in FIG. 19A to FIG. 19H, the pixel can include four types of subpixels.

Figures 19A, 19B, 19C, 19D, 19E, 19F, 19G, 19H:
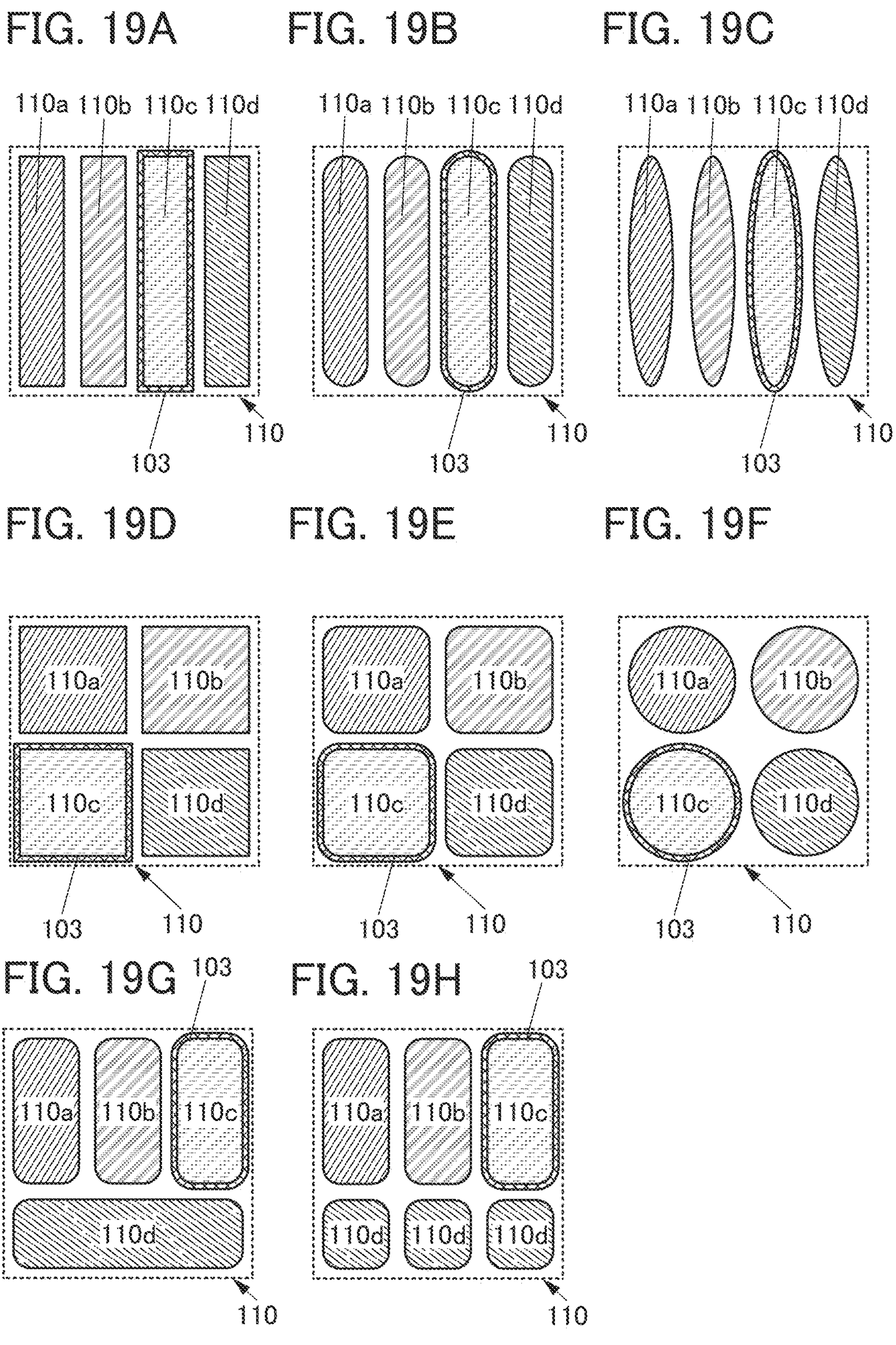
FIG. 19A to FIG. 19H are plan views of a display apparatus of one embodiment of the present invention.

The pixels 110 illustrated in FIG. 19A to FIG. 19C each employ stripe arrangement. In FIG. 19A to FIG. 19C, the insulating layer 103 is illustrated in the subpixel 110*c*. The insulating layer 103 may be provided in a component other than the subpixel 110*c*. The insulating layer 103 can be rephrased as the insulating layer 103*o*.

FIG. 19A illustrates an example in which each subpixel has a rectangular top surface shape. FIG. 19B illustrates an example in which each subpixel has a top surface shape formed by combining two half circles and a rectangle. FIG. 19C illustrates an example in which each subpixel has an elliptical top surface shape. In FIG. 19A to FIG. 19C, the subpixel 110*b* is positioned next to the subpixel 110*a*, the subpixel 110*c* is positioned next to 110*b*, and a subpixel 110*d* is positioned next to the subpixel 110*c*.

The pixels 110 illustrated in FIG. 19D to 19F each employ matrix arrangement. In FIG. 19D to FIG. 19F, the insulating layer 103 is illustrated in the subpixel 110*c*. In FIG. 19D to FIG. 19F, the subpixel 110*b* is positioned next to the subpixel 110*a*, the subpixel 110*c* is positioned next to 110*b*, and the subpixel 110*d* is positioned next to the subpixel 110*c*. The insulating layer 103 may be provided in a component other than the subpixel 110*c*. The insulating layer 103 can be rephrased as the insulating layer 103*o*.

FIG. 19D illustrates an example in which each subpixel has a square top surface shape. FIG. 19E illustrates an example in which each subpixel has a substantially square top surface shape with rounded corners. FIG. 19F illustrates an example in which each subpixel has a circular top surface shape.

FIG. 19G and FIG. 19H each illustrate an example in which one pixel 110 is composed of two rows and three columns. In FIG. 19G and FIG. 19H, the subpixel 110*b* is positioned next to the subpixel 110*a*, the subpixel 110*c* is positioned next to 110*b*, and the subpixel 110*d* is positioned next to the subpixel 110*a*, the subpixel 110*b*, and the subpixel 110*c*. In FIG. 19G and FIG. 19H, the insulating layer 103 is illustrated in the subpixel 110*c*. The insulating layer 103 may be provided in a component other than the subpixel 110*c*. The insulating layer 103 can be rephrased as the insulating layer 103*o*.

The pixel 110 illustrated in FIG. 19G includes three subpixels (the subpixels 110*a*, 110*b*, and 110*c*) in the upper row (first row) and one subpixel (the subpixel 110*d*) in the lower row (second row). In other words, the pixel 110 includes the subpixel 110*a* in the left column (first column), the subpixel 110*b* in the center column (second column), the subpixel 110*c* in the right column (third column), and the subpixel 110*d* across these three columns.

The pixel 110 illustrated in FIG. 19H includes three subpixels (the subpixels 110*a*, 110*b*, and 110*c*) in the upper row (first row) and three of the subpixels 110*d* in the lower row (second row). In other words, the pixel 110 includes the subpixel 110*a* and the subpixel 110*d* in the left column (first column), the subpixel 110*b* and the subpixel 110*d* in the center column (second column), and the subpixel 110*c* and the subpixel 110*d* in the right column (third column). Aligning the positions of the subpixels in the upper row and the lower row as illustrated in FIG. 19H enables dust and the like that would be produced in the manufacturing process to be removed efficiently. Thus, a display apparatus having high display quality can be provided.

The pixels 110 illustrated in FIG. 19A to FIG. 19H each consist of the four subpixels 110*a*, 110*b*, 110*c*, and 110*d*. The subpixels 110*a*, 110*b*, 110*c*, and 110*d* include light-emitting devices that emit light of different colors. Subpixels of four colors of R, G, B, and Y, subpixels of red, green, blue, and infrared light, and the like are given.

The display apparatus of one embodiment of the present invention may include a light-receiving device in the pixel.

Three of the four subpixels included in the pixel 110 illustrated in FIG. 19A to FIG. 19H may include a light-emitting device and the other one may include a light-receiving device.

For example, a pn or pin photodiode can be used as the light-receiving device. The light-receiving device functions as a photoelectric conversion device (also referred to as a photoelectric conversion element) that senses light entering the light-receiving device and generates charge. The amount of charge generated from the light-receiving device depends on the amount of light entering the light-receiving device.

It is particularly preferable to use an organic photodiode including a layer containing an organic compound layer, as the light-receiving device. An organic photodiode, which is easily made thin, lightweight, and large in area and has a high degree of freedom for shape and design, can be used in a variety of display apparatuses.

In one embodiment of the present invention, an organic EL device is used as the light-emitting device, and an organic photodiode is used as the light-receiving device. The organic EL device and the organic photodiode can be formed over the same substrate. Thus, the organic photodiode can be incorporated in the display apparatus including the organic EL device.

The light-receiving device includes at least an active layer that functions as a photoelectric conversion layer between a pair of electrodes. In this specification and the like, one of the pair of electrodes may be referred to as a pixel electrode and the other may be referred to as a common electrode.

For example, the subpixels 110*a*, 110*b*, and 110*c* may be subpixels for three colors of R, G, and B, and the subpixel 110*d* may be a subpixel including the light-receiving device.

One of the pair of electrodes of the light-receiving device functions as an anode, and the other electrode functions as a cathode. The case where the pixel electrode functions as an anode and the common electrode functions as a cathode is described below as an example. When the light-receiving device is driven by application of reverse bias between the pixel electrode and the common electrode, light entering the light-receiving device can be sensed and charge can be generated and extracted as current. Alternatively, the pixel electrode may function as a cathode and the common electrode may function as an anode.

A manufacturing method similar to that of the light-emitting device can be employed for the light-receiving device. A photoelectric conversion layer (also referred to as an active layer) included in the light-receiving device is formed by processing a film that is deposited on the entire surface and to be the active layer, not by performing patterning with use of a metal mask. Thus, the active layer can be formed to have a uniform thickness. In addition, a sacrificial layer provided over the active layer can reduce damage to the active layer in the manufacturing process of the display apparatus, increasing the reliability of the light-receiving device.

Here, a layer shared by the light-receiving device and the light-emitting device might have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device might have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

The active layer included in the light-receiving device includes a semiconductor. Examples of the semiconductor include an inorganic semiconductor such as silicon and an organic semiconductor including an organic compound layer. This embodiment shows an example in which an organic semiconductor is used as the semiconductor contained in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electron conjugation widely spreads in fullerene having a spherical shape, its electron-accepting property is high. The high electron-accepting property efficiently causes rapid charge separation and is useful for the light-receiving device. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-Phenyl-C71-butyric acid methyl ester (abbreviation: PC70BM), [6,6]-Phenyl-C61-butyric acid methyl ester (abbreviation: PC60BM), and 1',1",4',4"-Tetrahydro-di[1,4]methanonaphthaleno[1,2:2',3',56,60:2",3"][5,6]fullerene-C60 (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing any of a substance having a high hole-transport property, a substance having a high electron-transport property, a substance having a bipolar property (a substance having a high electron-transport property and a high hole-transport property), and the like. Without limitation to the above, the light-receiving device may further include a layer containing any of a substance having a high hole-injection property, a hole-blocking material, a material having a high electron-injection property, an electron-blocking material, and the like.

Either a low molecular compound or a high molecular compound can be used in the light-receiving device, and an inorganic compound may also be included. Each layer included in the light-receiving device can be formed by an evaporation method (including a vacuum evaporation method), a transfer method, a printing method, an inkjet method, a coating method, or the like.

As the hole-transport material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material, an inorganic compound such as zinc oxide (ZnO) can be used.

For the active layer, a high molecular compound such as Poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the wavelength range. The third material may be a low molecular compound or a high molecular compound.

The display apparatus can sense the touch or approach of an object while displaying an image because the pixel included in the display apparatus includes the light-emitting device and the light-receiving device and thus has a light-receiving function. For example, all the subpixels included in the display apparatus can display an image; alternatively, some of the subpixels can emit light as a light source, and the rest of the subpixels can display an image.

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by sensing light with the display portion, an image can be captured or an approach or touch of an object (e.g., a finger, a hand, or a pen) can be sensed. Furthermore, in the display apparatus of one embodiment of the present invention, the light-emitting device can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted from the light-emitting device included in the display portion, the light-receiving device can sense reflected light (or scattered light); thus, image capturing or touch sensing is possible even in a dark place.

In the case where the light-receiving device is used as the image sensor, the display apparatus can capture an image with the use of the light-receiving device. For example, the display apparatus of this embodiment can be used as a scanner.

For example, data on biological information such as a fingerprint or a palm print can be obtained with the use of the image sensor. That is, a biometric authentication sensor can be incorporated in the display apparatus. When the display apparatus incorporates a biometric authentication sensor, the number of components of an electronic device can be reduced as compared to the case where a biometric authentication sensor is provided separately from the display apparatus; thus, the size and weight of the electronic device can be reduced.

In the case where the light-receiving device is used as the touch sensor, the display apparatus can sense an approach or touch of an object with the use of the light-receiving device.

Figure 20A:
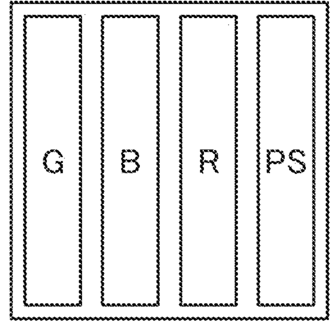
FIG. 20A to FIG. 20D are plan views of a display apparatus of one embodiment of the present invention.
Figure 20B:
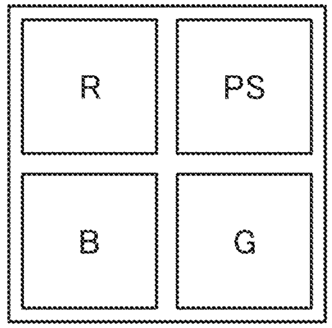

Pixels illustrated in FIG. 20A and FIG. 20B each include the subpixel G, the subpixel B, the subpixel R, and a subpixel PS. The insulating layer 103 can be provided in a component other than the subpixel PS. The insulating layer 103 can be rephrased as the insulating layer 103*o*.

The pixel illustrated in FIG. 20A employs stripe arrangement. The pixel illustrated in FIG. 20B employs matrix arrangement.

Figure 20C:
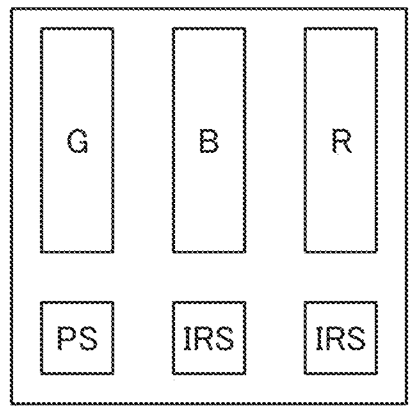
Figure 20D:
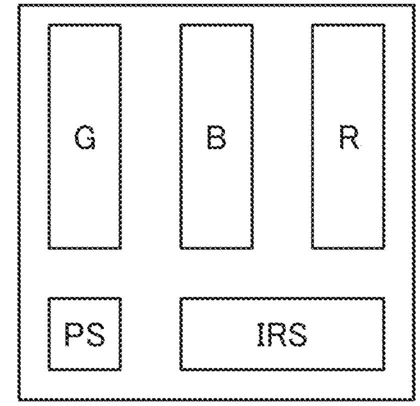

Pixels illustrated in FIG. 20C and FIG. 20D each include the subpixel G, the subpixel B, the subpixel R, the subpixel PS, and a subpixel IRS. The insulating layer 103 can be provided in a component other than the subpixel PS and the subpixel IRS. The insulating layer 103 can be rephrased as the insulating layer 103*o*.

FIG. 20C and FIG. 20D illustrate an example in which one pixel is provided in two rows and three columns. Three subpixels (the subpixel G, the subpixel B, and the subpixel R) are provided in the upper row (first row). In FIG. 20C, three subpixels (one subpixel PS and two subpixels IRS) are provided in the lower row (second row). In FIG. 20D, two subpixels (one subpixel PS and one subpixel IRS) are provided in the lower row (second row). Aligning the positions of the subpixels in the upper row and the lower row as illustrated in FIG. 20C enables dust and the like that would be produced in the manufacturing process to be removed efficiently. Thus, a display apparatus having high display quality can be provided. Note that the layout of the subpixels is not limited to the structures illustrated in FIG. 20A to FIG. 20D.

The subpixel R includes a light-emitting device that emits red light. The subpixel G includes a light-emitting device that emits green light. The subpixel B includes a light-emitting device that emits blue light.

Each of the subpixel PS and the subpixel IRS includes a light-receiving device. The wavelength of light sensed by the subpixel PS and the subpixel IRS is not particularly limited.

In FIG. 20C, the two subpixels IRS can each independently include a light-receiving device or can include one light-receiving device in common. That is, the pixel 110 illustrated in FIG. 20C can include one light-receiving device for the subpixel PS and one or two light-receiving devices for the subpixels IRS.

The light-receiving area of the subpixel PS is smaller than the light-receiving area of the subpixel IRS. A smaller light-receiving area leads to a narrower image-capturing range, inhibits a blur in a captured image, and improves the definition. Thus, the use of the subpixel PS enables higher-resolution or higher-definition image capturing than the use of the subpixel IRS. For example, image capturing for personal authentication with the use of a fingerprint, a palm print, the iris, the shape of a blood vessel (including the shape of a vein and the shape of an artery), a face, or the like is possible by using the subpixel PS.

The light-receiving device included in the subpixel PS preferably senses visible light, and preferably senses one or more of colors such as blue, violet, bluish violet, green, yellowish green, yellow, orange, and red. The light-receiving device included in the subpixel PS may sense infrared light.

The subpixel IRS can be used in a touch sensor (also referred to as a direct touch sensor), a near touch sensor (also referred to as a hover sensor, a hover touch sensor, a contactless sensor, or a touchless sensor), or the like. The wavelength of light sensed by the subpixel IRS can be determined depending on the application purpose. For example, the subpixel IRS preferably senses infrared light. Thus, a touch can be sensed even in a dark place.

Here, the touch sensor or the near touch sensor can sense an approach or contact of an object (e.g., a finger, a hand, or a pen).

The touch sensor can sense the object when the display apparatus and the object come in direct contact with each other. Furthermore, even when an object is not in contact with the display apparatus, the near touch sensor can sense the object. For example, the display apparatus is preferably capable of sensing an object positioned in the range of 0.1 mm to 300 mm inclusive, further preferably 3 mm to 50 mm inclusive from the display apparatus. This structure enables the display apparatus to be operated without direct contact of an object, that is, enables the display apparatus to be operated in a contactless (touchless) manner. With the above-described structure, the display apparatus can have a reduced risk of being dirty or damaged, or can be operated without the object directly touching a dirt (e.g., dust or a virus) attached to the display apparatus.

The refresh rate of the display apparatus of one embodiment of the present invention can be variable. For example, the refresh rate is adjusted (adjusted in the range from 1 Hz to 240 Hz, for example) in accordance with contents displayed on the display apparatus, whereby power consumption can be reduced. The driving frequency of a touch sensor or a near touch sensor may be changed in accordance with the refresh rate. In the case where the refresh rate of the display apparatus is 120 Hz, for example, the driving frequency of a touch sensor or a near touch sensor can be higher than 120 Hz (typically, 240 Hz). This structure can achieve low power consumption and can increase the response speed of a touch sensor or a near touch sensor.

Figure 20E:
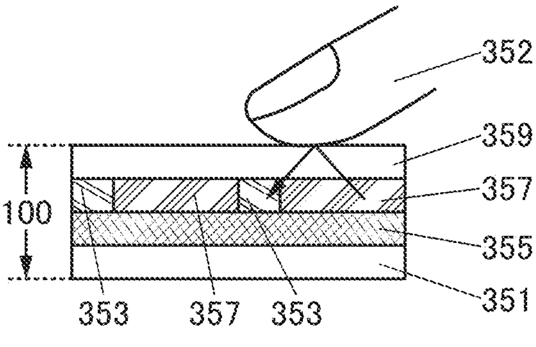
FIG. 20E to FIG. 20G are cross-sectional views of the display apparatus of one embodiment of the present invention.
Figure 20F:
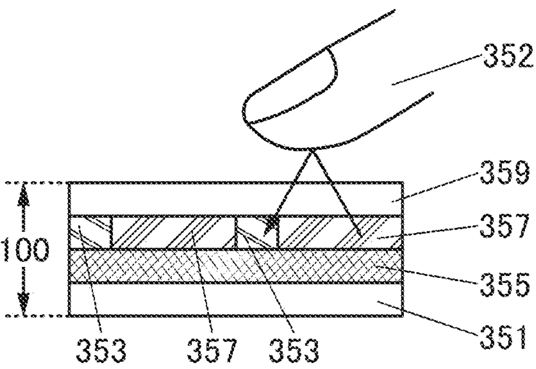
Figure 20G:
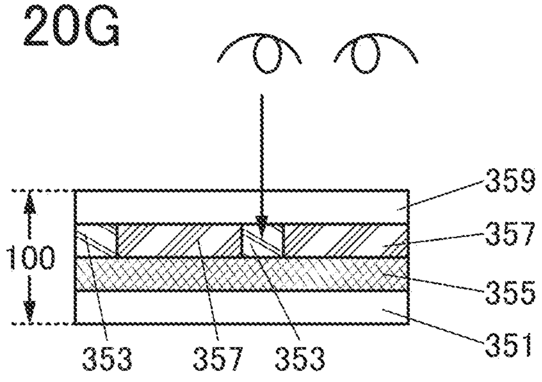

The display apparatus 100 illustrated in FIG. 20E to FIG. 20G includes a layer 353 including a light-receiving device, a functional layer 355, and a layer 357 including alight-emitting device, between a substrate 351 and a substrate 359.

The functional layer 355 includes a circuit for driving a light-receiving device and a circuit for driving a light-emitting device. A switch, a transistor, a capacitor, a resistor, a wiring, a terminal, and the like can be provided in the functional layer 355. Note that in the case where the light-emitting device and the light-receiving device are driven by a passive-matrix method, a structure not provided with a switch and a transistor may be employed.

For example, after light emitted from the light-emitting device in the layer 357 including light-emitting device is reflected by a finger 352 that touches the display apparatus 100 as illustrated in FIG. 20E, the light-receiving device in the layer 353 including light-receiving device senses the reflected light. Thus, the touch of the finger 352 on the display apparatus 100 can be sensed. The display apparatus may have a function of sensing an object that is close to (but is not touching) the display apparatus as illustrated in FIG. 20F and FIG. 20G or capturing an image of such an object. FIG. 20F illustrates an example in which a human finger is sensed, and FIG. 20G illustrates an example in which information on the surroundings, surface, or inside of the human eye (e.g., the number of blinks, the movement of an eyeball, and the movement of an eyelid) is sensed.

When one pixel includes two kinds of light-receiving devices, the display apparatus can have two additional functions as well as a display function, enabling a multifunctional display apparatus.

For high-resolution image capturing, the subpixel PS is preferably provided in all pixels included in the display apparatus. By contrast, the subpixel IRS used for a touch sensor, a near touch sensor, or the like only needs to be provided in some pixels included in the display apparatus because high detection accuracy is not required as compared to the subpixel PS. When the number of subpixels IRS included in the display apparatus is smaller than the number of subpixels PS, higher sensing speed can be achieved.

As described above, one pixel includes two kinds of light-receiving devices in the display apparatus of one embodiment of the present invention, whereby the display apparatus can have two additional functions as well as a display function, enabling a multifunctional display apparatus. For example, a high-resolution image capturing function and a sensing function of a touch sensor, a near touch sensor, or the like can be achieved. Furthermore, when a pixel including two kinds of light-receiving devices and a pixel having another structure are combined, the display apparatus can have more functions. For example, a pixel including a light-emitting device that emits infrared light, any of a variety of sensor devices, or the like can be used.

This embodiment can be combined with the other embodiments as appropriate. In the case where a plurality of structure examples are described in one embodiment in this specification, the structure examples can be combined as appropriate.

Embodiment 3

In this embodiment, a display apparatus of one embodiment of the present invention is described with reference to FIG. 21 to FIG. 25.

The display apparatus in this embodiment can be a high-definition display apparatus or large-sized display apparatus. Accordingly, the display apparatus of this embodiment can be used for display portions of a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Apparatus 100A]

Figure 21:
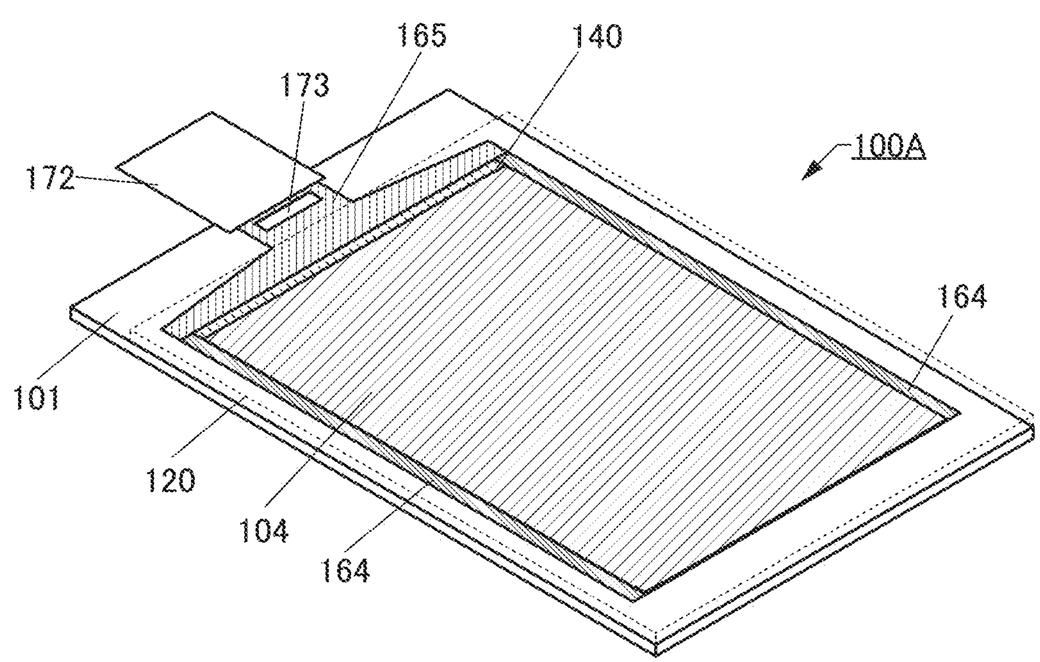
FIG. 21 is a perspective view of a display apparatus of one embodiment of the present invention.
Figures 22A, 22B, 22C:
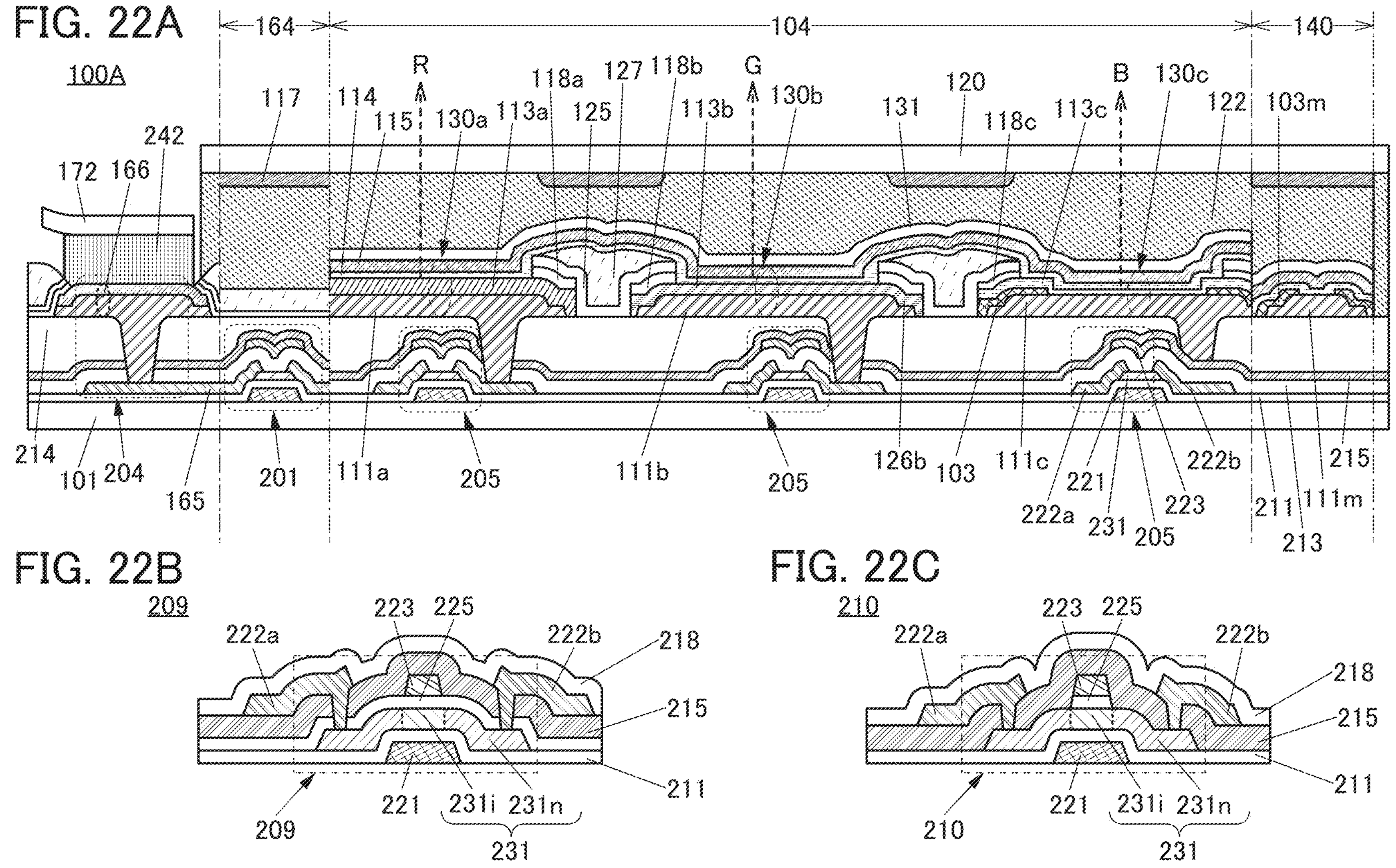
FIG. 22A is a cross-sectional view of a display apparatus of one embodiment of the present invention.
FIG. 22B and FIG. 22C are cross-sectional views of transistors of embodiments of the present invention.

FIG. 21 illustrates a perspective view of a display apparatus 100A, and FIG. 22A illustrates a cross-sectional view of the display apparatus 100A.

The display apparatus 100A has a structure in which the substrate 120 and the substrate 101 are bonded to each other. In FIG. 21, the substrate 120 is denoted by a dashed line.

The display apparatus 100A includes the pixel portion 104, the connection portion 140, a circuit 164, a wiring 165, and the like. The wiring 165 is sometimes referred to as a lead wiring, which refers to a wiring extending from the pixel portion 104, the connection portion 140, and the circuit 164. FIG. 21 illustrates an example in which an IC 173 and an FPC 172 are mounted on the display apparatus 100A. Thus, the structure illustrated in FIG. 21 can be regarded as a display module including the display apparatus 100A, the IC (integrated circuit), and the FPC.

The connection portion 140 is provided outside the pixel portion 104. The connection portion 140 can be provided along one side or a plurality of sides of the pixel portion 104. The number of the connection portions 140 can be one or more. FIG. 21 illustrates an example in which the connection portion 140 is provided along one side of the pixel portion 104 on the wiring 165 side. A common electrode of a light-emitting device is electrically connected to a conductive layer or the like in the connection portion 140, and thus a predetermined potential can be supplied to the common electrode.

As the circuit 164, a scan line driver circuit can be used, for example.

The wiring 165 has a function of supplying a signal and power to the pixel portion 104, the circuit 164, and the like. The signal and power are input to the wiring 165 from the outside through the FPC 172 or from the IC 173.

FIG. 21 illustrates an example in which the IC 173 is provided by a COG (Chip On Glass) method, a COF (Chip on Film) method, or the like. An IC including a scan line driver circuit, a signal line driver circuit, or the like can be used as the IC 173, for example. Note that the display apparatus 100A and the display module are not necessarily provided with an IC. The IC may be mounted on the FPC by a COF method or the like.

FIG. 22A illustrates an example of cross sections of part of a region including the FPC 172, part of the circuit 164, part of the pixel portion 104, part of the connection portion 140, and part of a region including an end portion of the display apparatus 100A. The display apparatus 100A will be described with reference to Structure example 1 described above, but other structure examples can be applied thereto.

The display apparatus 100A illustrated in FIG. 22A includes a transistor 201, a transistor 205, the light-emitting device 130*a* which emits red light, the light-emitting device 130*b* which emits green light, the light-emitting device 130*c* which emits blue light, and the like between the substrate 101 and the substrate 120.

In the case where a pixel of the display apparatus includes three kinds of subpixels including light-emitting devices emitting different colors, the three subpixels can be subpixels of three colors of R, G, and B or subpixels of three colors of yellow (Y), cyan (C), and magenta (M). In the case where four subpixels are included, the four subpixels can be subpixels of four colors of R, G, B, and Y, for example.

The above embodiment can be referred to for the light-emitting device 130*a*, the light-emitting device 130*b*, and the light-emitting device 130*c*.

The light-emitting device 130*a* includes the conductive layer 111*a*. The conductive layer 111*a* is sometimes referred to as a pixel electrode. The conductive layer 111*a* is connected to a conductive layer 222*b* included in the transistor 205 through an opening provided in an insulating layer 214.

The conductive layer 111*b* of the light-emitting device 130*b* and the conductive layer 111*c* of the light-receiving device 130*c* are similar to the conductive layer 111*a* of the light-emitting device 130*a*. The insulating layer 103 is provided to cover part of the conductive layer 111*c* of the light-emitting device 130*c*. The insulating layer 103 can be rephrased as the insulating layer 103*o*.

Depressed portions are sometimes formed in the conductive layer 111*a*, the conductive layer 111*b*, and the conductive layer 111*c* to cover the openings provided in the insulating layer 214. In the case of imparting planarity to the top surface of the conductive layer 111, the depressed portions can be filled with the insulating layer or the conductive layer.

The side surfaces of the organic compound layer 113*a*, the organic compound layer 113*b*, and the organic compound layer 113*c* are covered with the insulating layers 125 and 127. The sacrificial layer 118*a* is positioned between the organic compound layer 113*a* and the insulating layer 125. The sacrificial layer 118*b* is positioned between the organic compound layer 113*b* and the insulating layer 125, and the sacrificial layer 118*c* is positioned between the organic compound layer 113*c* and the insulating layer 125. The electron-injection layer 114 is provided over the organic compound layer 113*a*, the organic compound layer 113*b*, the organic compound layer 113*c*, and the insulating layers 125 and 127. The conductive layer 115 is provided over the electron-injection layer 114. The protective layer 131 is provided over the light-emitting device 130*a*, the light-emitting device 130*b*, and the light-emitting device 130*c*.

The protective layer 131 and the substrate 120 are bonded to each other with the resin layer 122. A solid sealing structure, a hollow sealing structure, or the like can be employed to seal the light-emitting devices. In FIG. 22A, a solid sealing structure is employed in which a space between the substrate 120 and the substrate 101 is filled with the resin layer 122. Alternatively, a hollow sealing structure may be employed in which the space is filled with an inert gas (e.g., nitrogen or argon). The resin layer 122 may be provided not to overlap with the light-emitting device. The space may be filled with a resin different from the frame-like resin layer 122.

The conductive layer 111*m* is provided over the insulating layer 214 in the connection portion 140. In this example, the conductive layer 111*m* is a conductive layer obtained by processing the same conductive film as the conductive layers 111*a*, 111*b*, and 111*c*. The end portion of the conductive layer 111*m* is covered with at least the insulating layer 103. The end portion may further be covered with an insulating layer positioned over the insulating layer 103. For example, the end portion may be covered with the insulating layer 125, the insulating layer 127, or the like. The conductive layer 115 is provided over the conductive layer 111*m*. The electron-injection layer 114 may be positioned between the conductive layer 111*m* and the conductive layer 115.

The display apparatus 100A has atop emission structure. Light from the light-emitting device is emitted toward the substrate 120 side. For the substrate 120, a material having a high visible-light-transmitting property is preferably used.

A stacked-layer structure including the components up to the insulating layer 214 corresponds to the layer 102 in Embodiment 1 and the like.

The transistor 201 and the transistor 205 are formed over the substrate 101. These transistors can be fabricated using the same material in the same step.

An insulating layer 211, an insulating layer 213, an insulating layer 215, and the insulating layer 214 are provided in this order over the substrate 101. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of a display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. Alternatively, the insulating layer 214 may have a stacked-layer structure of an organic insulating film and an inorganic insulating film.

Each of the transistor 201 and the transistor 205 includes a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as agate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. A top-gate or a bottom-gate transistor structure may be employed. Alternatively, gates may be provided above and below a semiconductor layer where a channel is formed.

The structure in which the semiconductor layer where a channel is formed is provided between two gates is employed for the transistor 201 and the transistor 205. The two gates may be connected to each other and supplied with the same signal to operate the transistor. Alternatively, the threshold voltage of the transistor may be controlled by supplying a potential for controlling the threshold voltage to one of the two gates and a potential for driving to the other of the two gates.

There is no particular limitation on the crystallinity of a semiconductor material used for the transistors, and either an amorphous semiconductor or a semiconductor having crystallinity (a microcrystalline semiconductor, a polycrystalline semiconductor, a single crystal semiconductor, or a semiconductor partly including crystal regions) may be used. It is preferable to use a semiconductor having crystallinity, in which case deterioration of the transistor characteristics can be inhibited.

It is preferable that a semiconductor layer of a transistor contain a metal oxide (also referred to as an oxide semiconductor). That is, a transistor including a metal oxide in its channel formation region (hereinafter, an OS transistor) is preferably used for the display apparatus of this embodiment. Alternatively, a semiconductor layer of a transistor may contain silicon. Examples of silicon include amorphous silicon and crystalline silicon (e.g., low-temperature polysilicon or single crystal silicon).

The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin.

It is particularly preferable that an oxide containing indium (In), gallium (Ga), and zinc (Zn) (also referred to as IGZO) be used for the semiconductor layer. Alternatively, it is preferable to use an oxide containing indium, tin, and zinc. Further alternatively, it is preferable to use an oxide containing indium, gallium, tin, and zinc.

When the semiconductor layer is an In-M-Zn oxide, the atomic ratio of In is preferably greater than or equal to the atomic ratio of Min the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. When the atomic ratio is described as In:Ga:Zn=5:1:6 or a composition in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. When the atomic ratio is described as In:Ga:Zn=1:1:1 or a composition in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The transistor included in the circuit 164 and the transistor included in the pixel portion 104 may have the same structure or different structures. One structure or two or more kinds of structures may be employed for a plurality of transistors included in the circuit 164. Similarly, one structure or two or more kinds of structures may be employed for a plurality of transistors included in the pixel portion 104.

The structure of transistors used in a display panel may be selected as appropriate depending on the screen size of the display panel. For example, single crystal Si transistors can be used in a display panel with a screen size greater than or equal to 0.1 inches diagonal and less than or equal to 3 inches diagonal. In addition, LTPS transistors can be used in a display panel with a screen size greater than or equal to 0.1 inches diagonal and less than or equal to 30 inches diagonal, preferably greater than or equal to 1 inch diagonal and less than or equal to 30 inches diagonal. In addition, LTPO (a structure in which an LTPS transistor and an OS transistor are combined) can be used in a display panel with a screen size greater than or equal to 0.1 inches diagonal and less than or equal to 50 inches diagonal, preferably greater than or equal to 1 inch diagonal and less than or equal to 50 inches diagonal. In addition, OS transistors can be used in a display panel with a screen size greater than or equal to 0.1 inches diagonal and less than or equal to 200 inches diagonal, preferably greater than or equal to 50 inches diagonal and less than or equal to 100 inches diagonal.

Note that with single crystal Si transistors, a size increase is extremely difficult because of the size of a single crystal Si substrate. Furthermore, since a laser crystallization apparatus is used in the manufacturing process, LTPS transistors are unlikely to respond to a size increase (typically to a screen size greater than 30 inches diagonal). By contrast, since the manufacturing process does not necessarily require a laser crystallization apparatus or the like or can be performed at a relatively low process temperature (typically, lower than or equal to 450° C.), OS transistors are applicable to a display panel with a relatively large area (typically, a diagonal size greater than or equal to 50 inches and less than or equal to 100 inches). In addition, LTPO is applicable to a display panel with a size midway between the case of using LTPS transistors and the case of using OS transistors (typically, a diagonal size greater than or equal to 1 inch and less than or equal to 50 inches).

All of the transistors included in the pixel portion 104 may be OS transistors, all of the transistors included in the pixel portion 104 may be Si transistors, or some of the transistors included in the pixel portion 104 may be OS transistors and the others may be Si transistors.

For example, when both an LTPS transistor and an OS transistor are used in the pixel portion 104, the display panel with low power consumption and high drive capability can be achieved. A structure in which the LTPS transistor and the OS transistor are combined is referred to as LTPO in some cases. Note that as a more preferable example, it is preferable to use an OS transistor as, for example, a transistor functioning as a switch for controlling electrical continuity between wirings and an LTPS transistor as, for example, a transistor for controlling current.

For example, one of the transistors included in the pixel portion 104 functions as a transistor for controlling current flowing through the light-emitting device and can be referred to as a driving transistor. One of a source and a drain of the driving transistor is electrically connected to the pixel electrode of the light-emitting device. An LTPS transistor is preferably used as the driving transistor. In this case, the amount of current flowing through the light-emitting device can be increased in the pixel circuit.

Another transistor included in the pixel portion 104 functions as a switch for controlling selection and non-selection of the pixel and can be referred to as a selection transistor. A gate of the selection transistor is electrically connected to a gate line, and one of a source and a drain thereof is electrically connected to a source line (a signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

As described above, the display panel of one embodiment of the present invention can have all of a high aperture ratio, high resolution, high display quality, and low power consumption.

Note that the display panel of one embodiment of the present invention has a structure including the OS transistor and the light-emitting device having an MML (metal maskless) structure. This structure can significantly reduce the leakage current that might flow through the transistor and the leakage current that might flow between adjacent light-emitting devices (also referred to as a lateral leakage current, a side leakage current, or the like). With the structure, a viewer can notice any one or more of the image crispness, the image sharpness, a high chroma, and a high contrast ratio in an image displayed on the display panel. With the structure in which the leakage current that might flow through the transistor and the lateral leakage current between light-emitting devices are extremely low, display with, for example, little leakage of light at the time of black display can be achieved.

As other structure examples of transistors, FIG. 22B illustrates a transistor 209 and FIG. 22C illustrates a transistor 210.

The transistor 209 and the transistor 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the low-resistance regions 231*n*, the conductive layer 222*b* connected to the other of the low-resistance regions 231*n*, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned at least between the conductive layer 223 and the channel formation region 231*i*. Furthermore, an insulating layer 218 covering the transistor may be provided.

FIG. 22B illustrates an example of the transistor 209 in which the insulating layer 225 covers the top surface and the side surface of the semiconductor layer 231. The conductive layer 222*a* and the conductive layer 222*b* are connected to the corresponding low-resistance regions 231*n* through openings provided in the insulating layer 225 and the insulating layer 215. One of the conductive layer 222*a* and the conductive layer 222*b* functions as a source, and the other functions as a drain.

In the transistor 210 illustrated in FIG. 22C, the insulating layer 225 overlaps with the channel formation region 231*i* of the semiconductor layer 231 and does not overlap with the low-resistance regions 231*n*. The structure illustrated in FIG. 22C is obtained by processing the insulating layer 225 with the conductive layer 223 as a mask, for example. In FIG. 22C, the insulating layer 215 is provided to cover the insulating layer 225 and the conductive layer 223, and the conductive layer 222*a* and the conductive layer 222*b* are connected to the low-resistance regions 231*n* through the openings in the insulating layer 215.

A connection portion 204 is provided in a region of the substrate 101 where the substrate 120 does not overlap. In the connection portion 204, the wiring 165 is electrically connected to the FPC 172 through a conductive layer 166 and a connection layer 242. In this example, the conductive layer 166 is obtained by processing the same conductive film as the conductive layer 111*a*, the conductive layer 111*b*, and the conductive layer 111*c*. On the top surface of the connection portion 204, the conductive layer 166 is exposed. Thus, the connection portion 204 and the FPC 172 can be electrically connected to each other through the connection layer 242.

A light-blocking layer 117 is preferably provided on the surface of the substrate 120 on the substrate 101 side. The light-blocking layer 117 can be provided between adjacent light-emitting devices, in the connection portion 140, in the circuit 164, and the like. A variety of optical members can be arranged on the outer surface of the substrate 120. Examples of the optical members include a polarizing plate, a retardation plate, a light diffusion layer (e.g., a diffusion film), an anti-reflective layer, and a light-condensing film. Furthermore, an antistatic film suppressing the attachment of dust, a water repellent film suppressing the attachment of stain, a hard coat film suppressing generation of a scratch caused by the use, an impact-absorbing layer, or the like may be arranged on the outer surface of the substrate 120.

Provision of the protective layer 131 covering the light-emitting device can inhibit an impurity such as water from entering the light-emitting device, and increase the reliability of the light-emitting device.

For the substrate 101 and the substrate 120, glass, quartz, ceramics, sapphire, a resin, a metal, an alloy, a semiconductor, or the like can be used. The substrate on the side from which light from the light-emitting device is extracted is formed using a material that transmits the light. When a flexible material is used for the substrate 101 and the substrate 120, the flexibility of the display apparatus can be increased. Furthermore, a polarizing plate may be used as the substrate 101 or the substrate 120.

For the substrate 101 and the substrate 120, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a poly amide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 101 and the substrate 120.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefn polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the resin layer 122, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers such as a variety of wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display apparatus, and conductive layers (a conductive layer functioning as a pixel electrode or a common electrode) included in a light-emitting device.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

[Display Apparatus 100B]

Figure 23:
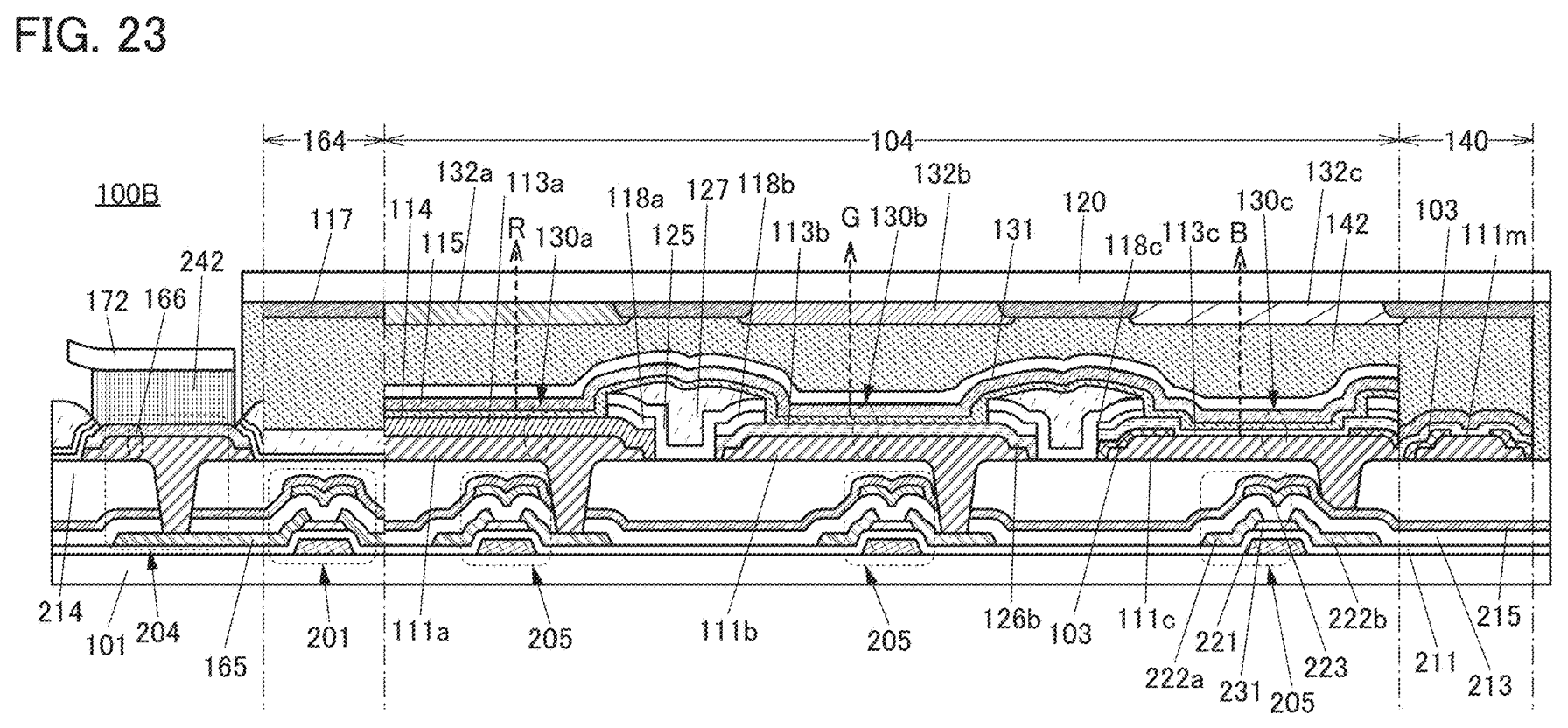

A display apparatus 100B illustrated in FIG. 23 is different from the display apparatus 100A mainly in that a light-emitting device and a color filter serving as a coloring layer are combined. The display apparatus 100B will be described with reference to Structure example 1 described above, but other structure examples can be applied thereto. Note that in the description of the display apparatus below, portions similar to those of the above-mentioned display apparatus are not described in some cases.

The light-emitting device 130*a* overlaps with a color filter 132*a*. The light-emitting device 130*a* can emit red and the color filter 132*a* is a red color filter. Light emitted from the light-emitting device 130*a* is extracted as red light through the color filter 132*a* to the outside of the display apparatus 100B.

Similarly, the light-emitting device 130*b* overlaps with a color filter 132*b*. The light-emitting device 130*b* can emit green and the color filter 132*b* is a green color filter. The light-emitting device 130*b* is extracted as green light through the color filter 132*b* to the outside of the display apparatus 100B.

Similarly, the light-emitting device 130*c* overlaps with a color filter 132*c*. The light-emitting device 130*c* can emit blue and the color filter 132*c* is a blue color filter. The light-emitting device 130*c* is extracted as blue light through the color filter 132*c* to the outside of the display apparatus 100B.

[Display Apparatus 100C]

Figure 24:
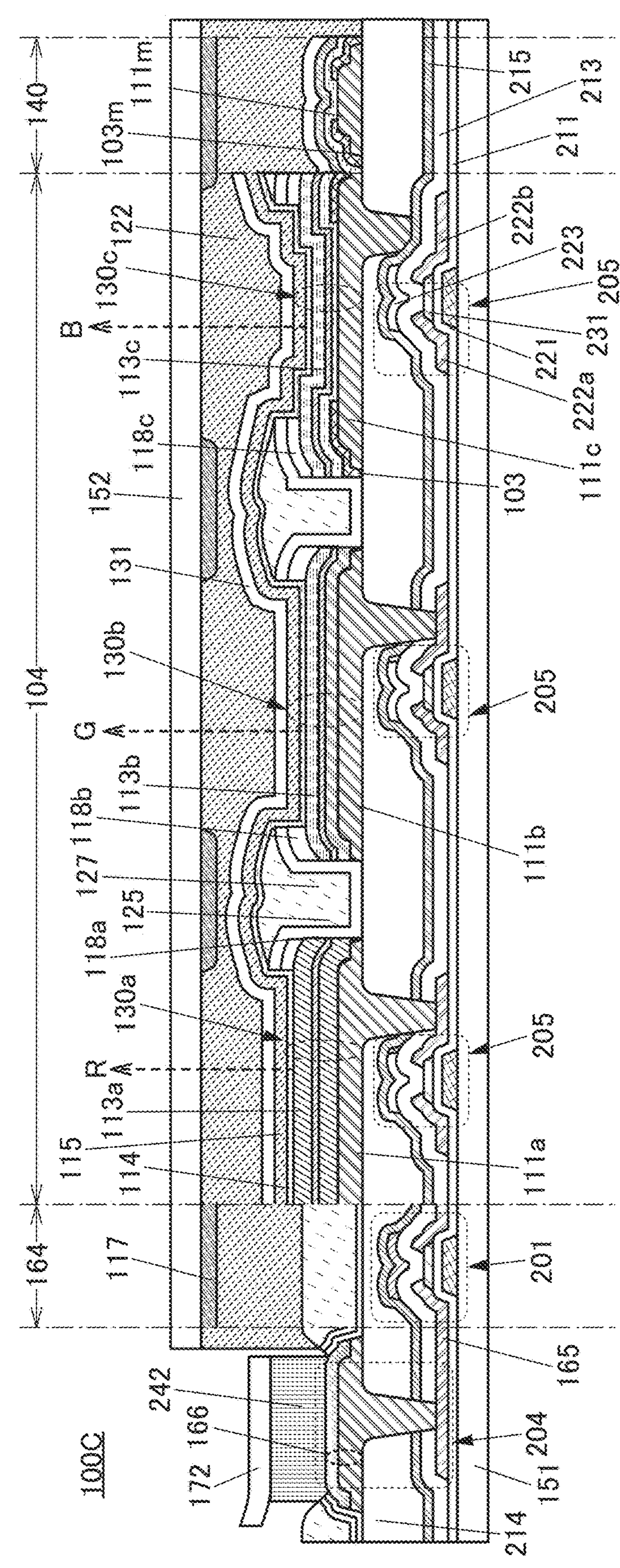
FIG. 24 is a cross-sectional view of a display apparatus of one embodiment of the present invention.

A display apparatus 100C illustrated in FIG. 24 is different from the display apparatus 100A mainly in including a light-emitting device with a tandem structure. The display apparatus 100C will be described with reference to the tandem structure in Structure example 1 described above, but tandem structures in other structure examples can be applied thereto.

Each of the organic compound layer 113*a*, the organic compound layer 113*b*, and the organic compound layer 113*c* is illustrated as three layers in FIG. 24 and can have, specifically, a stacked-layer structure including a first light-emitting unit, a charge-generation layer, and a second light-emitting unit.

In the display apparatus 100C, the organic compound layer 113*a* can have the structure in which the second light-emitting unit including a red light-emitting layer is stacked over the first light-emitting unit including a red light-emitting layer. Likewise, the organic compound layer 113*b* can have the structure in which the second light-emitting unit including a green light-emitting layer is stacked over the first light-emitting unit including a green light-emitting layer. The organic compound layer 113*c* can have the structure in which the second light-emitting unit including a blue light-emitting layer is stacked over the first light-emitting unit including a blue light-emitting layer.

The use of the light-emitting device having the tandem structure allows the display apparatus to have higher luminance. Alternatively, the current needed for obtaining the same luminance can be reduced, which can improve the reliability of the display apparatus.

A color filter may be provided in the display apparatus 100C.

[Display Apparatus 100D]

Figure 25:
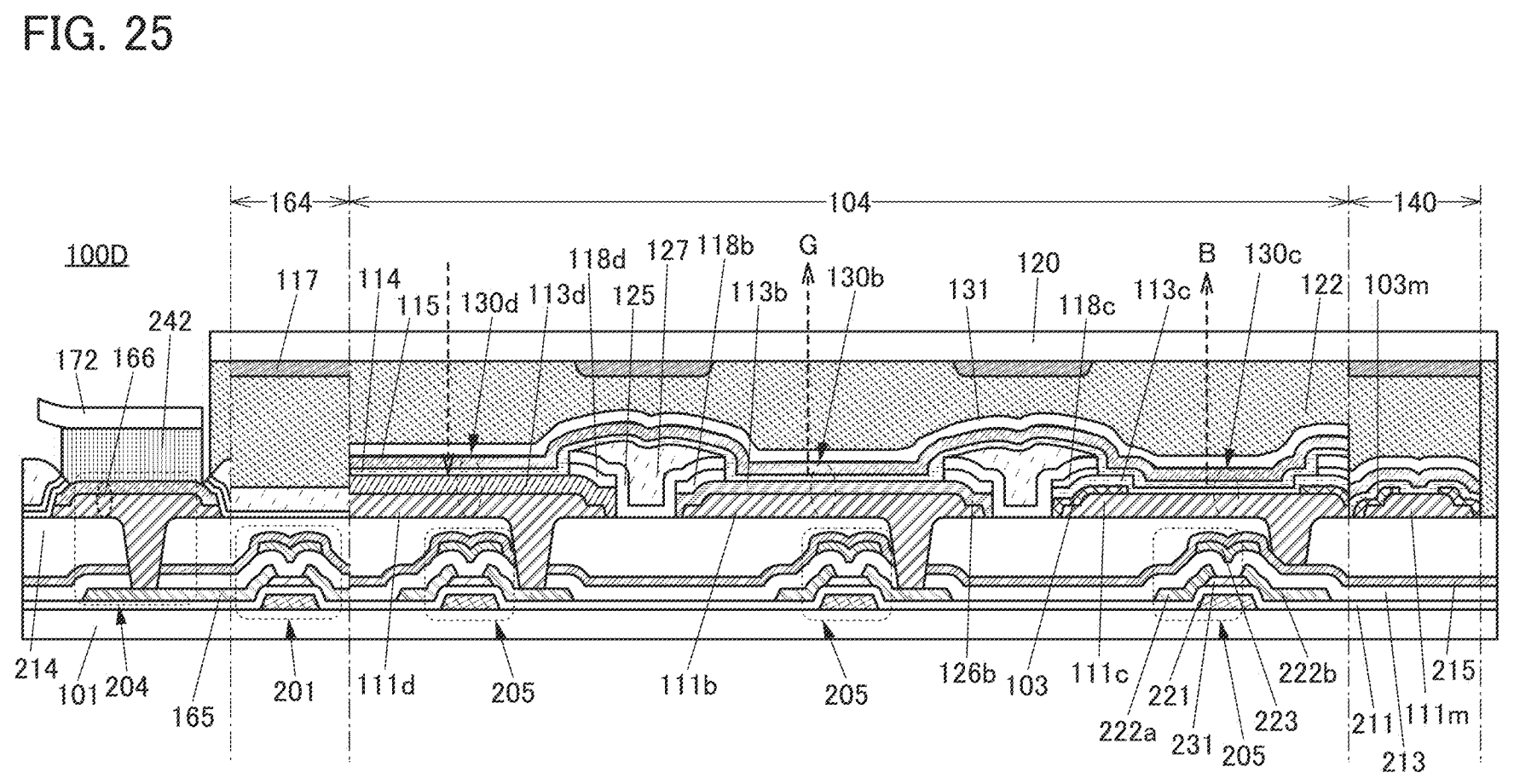

A display apparatus 100D illustrated in FIG. 25 is different from the display apparatus 100A mainly in including a light-receiving device 130*d*. The display apparatus 100D will be described with reference to Structure example 1 described above, but other structure examples can be applied thereto.

The light-receiving device 130*d* includes a conductive layer 111*d*.

The conductive layer 111*d* is connected to the conductive layer 222*b* included in the transistor 205 through an opening provided in the insulating layer 214.

The side surface of a fifth layer 113*d* is covered with the insulating layers 125 and 127. A sacrificial layer 118*d* is positioned between the fifth layer 113*d* and the insulating layer 125. The electron-injection layer 114 is provided over the fifth layer 113*d* and the insulating layers 125 and 127, and the conductive layer 115 is provided over the electron-injection layer 114. The electron-injection layer 114 is a continuous film shared by the light-receiving device and the light-emitting devices.

The display apparatus 100D can employ any of the pixel layouts that are described in the above embodiment. The light-receiving device 130*d* can be provided in the subpixel PS or the subpixel IRS. Embodiment 1 can be referred to for the details of the display apparatus including the light-receiving device.

This embodiment can be combined with the other embodiments as appropriate. In the case where a plurality of structure examples are described in one embodiment in this specification, the structure examples can be combined as appropriate.

Embodiment 4

In this embodiment, a display apparatus of one embodiment of the present invention is described with reference to FIG. 26 to FIG. 31.

The display apparatus in this embodiment can be a high-resolution display apparatus. Accordingly, the display apparatus in this embodiment can be used for display portions of information terminals (wearable devices) such as watch-type and bracelet-type information terminals and display portions of wearable devices capable of being worn on a head, such as a VR device like a head mounted display and a glasses-type AR device.

[Display Module]

Figure 26A:
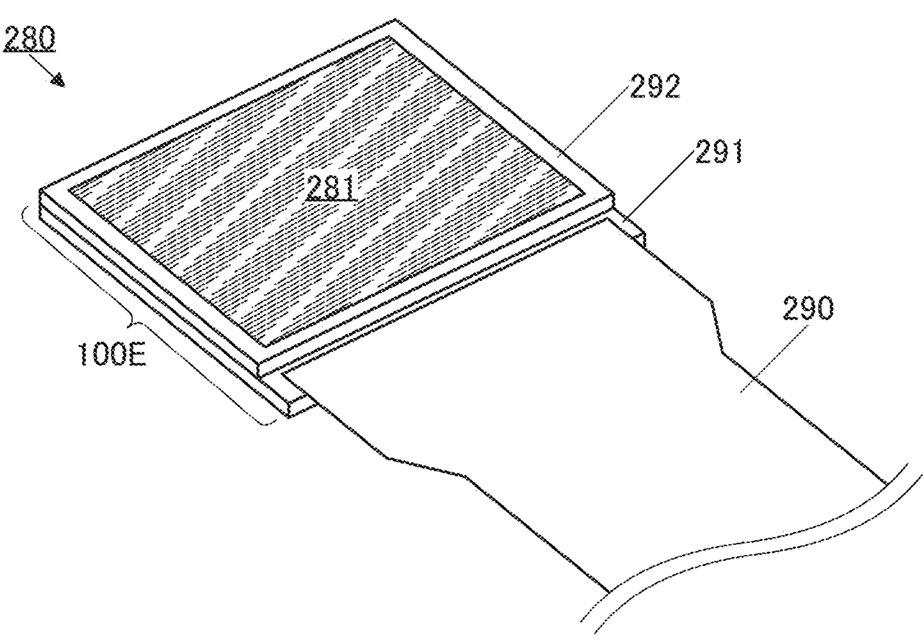
FIG. 26A and FIG. 26B are perspective views of a display apparatus of one embodiment of the present invention.

FIG. 26A illustrates a perspective view of a display module 280. The display module 280 includes a display apparatus 100E and an FPC 290.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 26B:
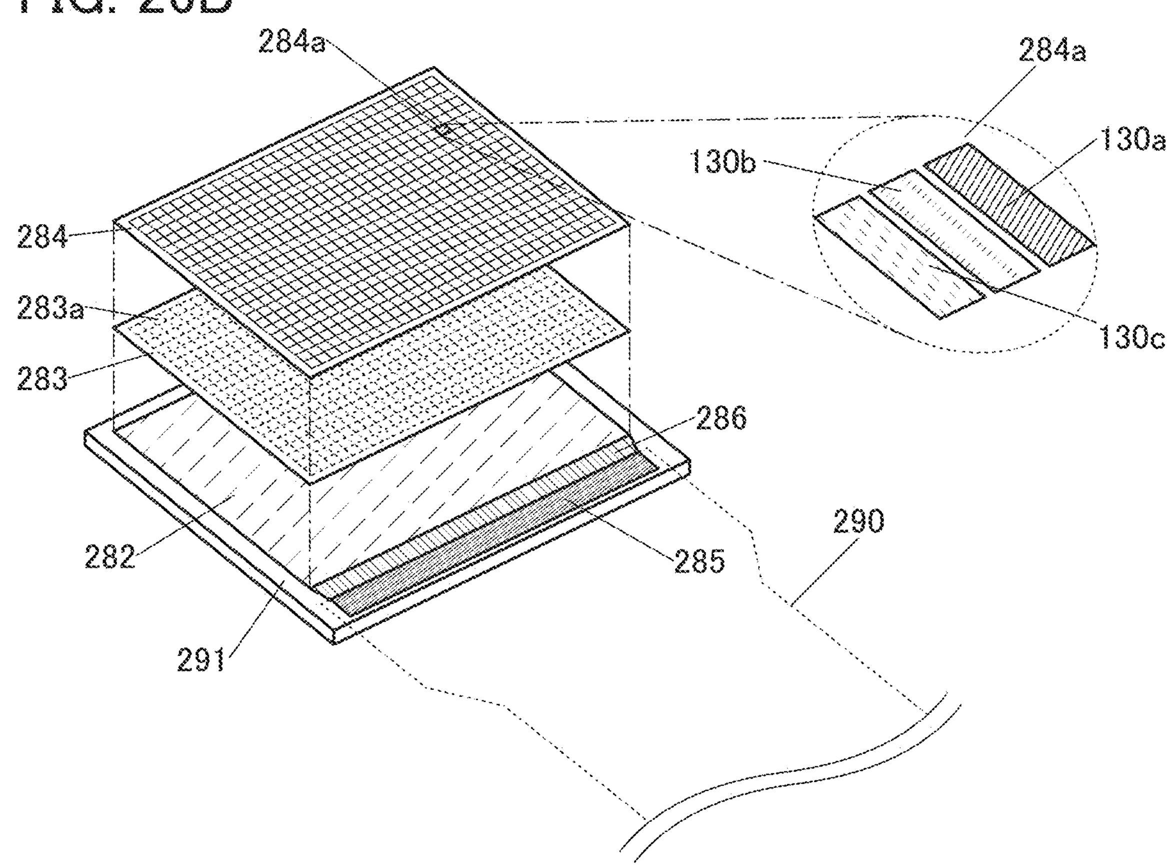

FIG. 26B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 26B. The pixel 284*a* includes the light-emitting device 130*a*, the light-emitting device 130*b*, and the light-emitting device 130*c* that emit light of different colors from each other. The plurality of light-emitting devices can be arranged in a stripe pattern as illustrated in FIG. 26B. Alternatively, a variety of arrangement methods of light-emitting devices, such as delta arrangement and pentile arrangement, can be employed.

The pixel circuit portion 283 includes a plurality of pixel circuits 283*a* arranged periodically.

One pixel circuit 283*a* is a circuit that controls light emission of three light-emitting devices included in one pixel 284*a*. One pixel circuit 283*a* may be provided with three circuits each of which controls light emission of one light-emitting device. For example, the pixel circuit 283*a* can include at least one selection transistor, one current control transistor (driving transistor), and a capacitor for one light-emitting device. In this case, a gate signal is input to a gate of the selection transistor, and a source signal is input to one of a source and a drain of the selection transistor. Thus, an active-matrix display apparatus is achieved.

The circuit portion 282 includes a circuit for driving the pixel circuits 283*a* in the pixel circuit portion 283. For example, one or both of agate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have extremely high resolution. For example, the pixels 284*a* are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a VR device such as ahead mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a wrist watch.

[Structure Example of Display Apparatus]

Figure 27A:
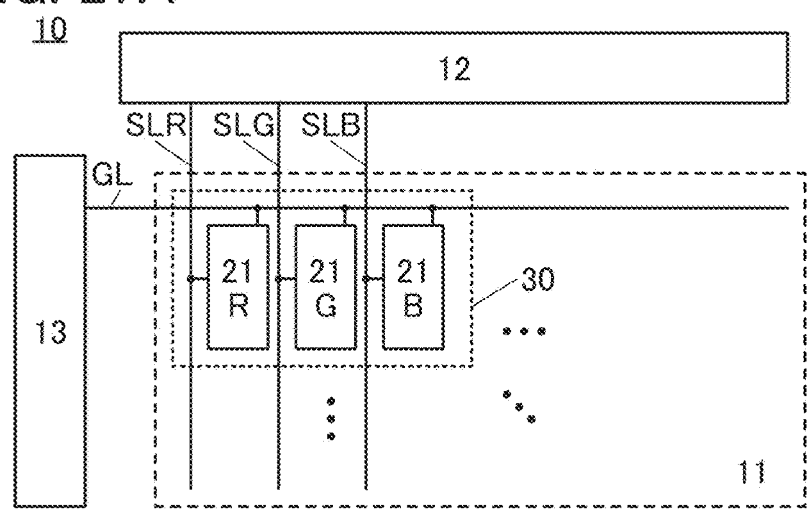
FIG. 27A to FIG. 27D are circuit diagrams of a display apparatus of one embodiment of the present invention.

FIG. 27A illustrates a block diagram of a display apparatus 10. The display apparatus 10 includes a display portion 11, a driver circuit portion 12, a driver circuit portion 13, and the like.

The display portion 11 includes a plurality of pixels 30 arranged in a matrix. The pixels 30 each include a subpixel 21R, a subpixel 21G, and a subpixel 21B. The subpixel 21R, the subpixel 21G, and the subpixel 21B each include a light-emitting device functioning as a display device.

The pixel 30 is electrically connected to a wiring GL, a wiring SLR, a wiring SLG, and a wiring SLB. The wiring SLR, the wiring SLG, and the wiring SLB are electrically connected to the driver circuit portion 12. The wiring GL is electrically connected to the driver circuit portion 13. The driver circuit portion 12 functions as a source line driver circuit (also referred to as a source driver), and the driver circuit portion 13 functions as a gate line driver circuit (also referred to as a gate driver). The wiring GL functions as a gate line, and the wiring SLR, the wiring SLG, and the wiring SLB each function as a source line.

The subpixel 21R includes a light-emitting device that emits red light. The subpixel 21G includes a light-emitting device that emits green light. The subpixel 21B includes a light-emitting device that emits blue light. Thus, the display apparatus 10 can perform full-color display. Note that the pixel 30 may include a subpixel including a light-emitting device that emits light of another color. For example, the pixel 30 may include, in addition to the three subpixels, a subpixel including a light-emitting device that emits white light, a subpixel including a light-emitting device that emits yellow light, or the like.

The wiring GL is electrically connected to the subpixel 21R, the subpixel 21G, and the subpixel 21B arranged in a row direction (an extending direction of the wiring GL). The wiring SLR, the wiring SLG, and the wiring SLB are electrically connected to the subpixels 21R, the subpixels 21G, and the subpixels 21B (not illustrated) arranged in a column direction (an extending direction of the wiring SLR and the like), respectively.

[Structure Example of Pixel Circuit]

Figure 27B:
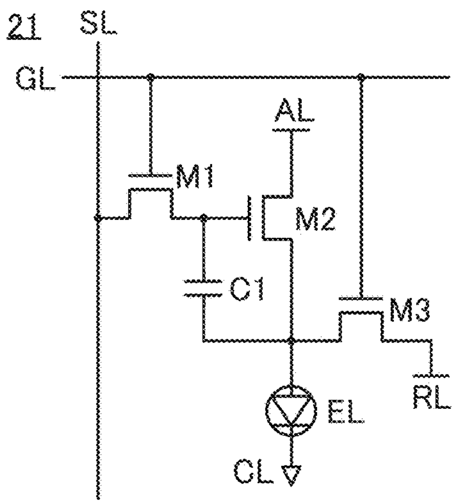

FIG. 27B illustrates an example of a circuit diagram of a pixel 21 that can be used as the subpixel 21R, the subpixel 21G, and the subpixel 21B. The pixel 21 includes a transistor M1, a transistor M2, a transistor M3, a capacitor C1, and a light-emitting device EL. The wiring GL and a wiring SL are electrically connected to the pixel 21. The wiring SL corresponds to any of the wiring SLR, the wiring SLG, and the wiring SLB illustrated in FIG. 27A.

A gate of the transistor M1 is electrically connected to the wiring GL, one of a source and a drain of the transistor M1 is electrically connected to the wiring SL, and the other thereof is electrically connected to one electrode of the capacitor C1 and a gate of the transistor M2. One of a source and a drain of the transistor M2 is electrically connected to a wiring AL, and the other of the source and the drain of the transistor M2 is electrically connected to one electrode of the light-emitting device EL, the other electrode of the capacitor C1, and one of a source and a drain of the transistor M3. A gate of the transistor M3 is electrically connected to the wiring GL, and the other of the source and the drain of the transistor M3 is electrically connected to a wiring RL. The other electrode of the light-emitting device EL is electrically connected to a wiring CL.

A data potential is supplied to the wiring SL. A selection signal is supplied to the wiring GL. The selection signal includes a potential for bringing a transistor into a conducting state and a potential for bringing a transistor into a non-conducting state.

A reset potential is supplied to the wiring RL. An anode potential is supplied to the wiring AL. A cathode potential is supplied to the wiring CL. In the pixel 21, the anode potential is a potential higher than the cathode potential. The reset potential supplied to the wiring RL can be set such that a potential difference between the reset potential and the cathode potential is lower than the threshold voltage of the light-emitting device EL. The reset potential can be a potential higher than the cathode potential, a potential equal to the cathode potential, or a potential lower than the cathode potential.

The transistor M1 and the transistor M3 each function as a switch. The transistor M2 functions as a transistor for controlling current flowing through the light-emitting device EL. For example, it can be said that the transistor M1 functions as a selection transistor and the transistor M2 functions as a driving transistor.

Here, it is preferable to use LTPS transistors as all of the transistor M1 to the transistor M3. Alternatively, it is preferable to use OS transistors as the transistor M1 and the transistor M3 and to use an LTPS transistor as the transistor M2.

Alternatively, OS transistors may be used as all of the transistor M1 to the transistor M3. In this case, an LTPS transistor can be used as at least one of a plurality of transistors included in the driver circuit portion 12 and a plurality of transistors included in the driver circuit portion 13, and OS transistors can be used as the other transistors. For example, OS transistors can be used as the transistors provided in the display portion 11, and LTPS transistors can be used as the transistors provided in the driver circuit portion 12 and the driver circuit portion 13.

As the OS transistor, a transistor including an oxide semiconductor in its semiconductor layer where a channel is formed can be used. The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin. It is particularly preferable to use an oxide containing indium, gallium, and zinc (also referred to as IGZO) for the semiconductor layer of the OS transistor. Alternatively, it is preferable to use an oxide containing indium, tin, and zinc. Further alternatively, it is preferable to use an oxide containing indium, gallium, tin, and zinc.

A transistor using an oxide semiconductor having a wider band gap and a lower carrier density than silicon can achieve an extremely low off-state current. Thus, such a low off-state current enables long-term retention of charge accumulated in a capacitor that is connected to the transistor in series. Therefore, it is particularly preferable to use a transistor including an oxide semiconductor as the transistor M1 and the transistor M3 each of which is connected to the capacitor C1 in series. The use of the transistor including an oxide semiconductor as each of the transistor M1 and the transistor M3 can prevent leakage of charge retained in the capacitor C1 through the transistor M1 or the transistor M3. Furthermore, since charge retained in the capacitor C1 can be retained for a long time, a still image can be displayed for a long time without rewriting data in the pixel 21.

Note that although the transistor is illustrated as an n-channel transistor in FIG. 27B, a p-channel transistor can also be used.

The transistors included in the pixel 21 are preferably formed to be arranged over the same substrate.

Transistors each including a pair of gates overlapping with each other with a semiconductor layer therebetween can be used as the transistors included in the pixel 21.

In the transistor including a pair of gates, the same potential is supplied to the pair of gates electrically connected to each other, which brings advantage that the transistor can have a higher on-state current and improved saturation characteristics. A potential for controlling the threshold voltage of the transistor may be supplied to one of the pair of gates. Furthermore, when a constant potential is supplied to one of the pair of gates, the stability of the electrical characteristics of the transistor can be improved. For example, one of the gates of the transistor may be electrically connected to a wiring to which a constant potential is supplied or may be electrically connected to a source or a drain of the transistor.

Figure 27C:
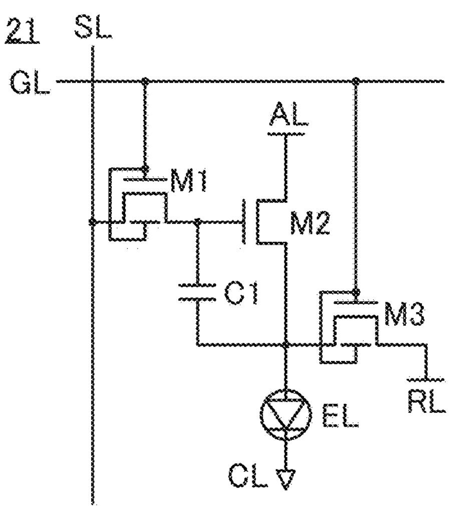

The pixel 21 illustrated in FIG. 27C is an example in which a transistor including a pair of gates is used as each of the transistor M1 and the transistor M3. The pair of gates of each of the transistor M1 and the transistor M3 are electrically connected each other. Such a structure can shorten the period in which data is written to the pixel 21.

Figure 27D:
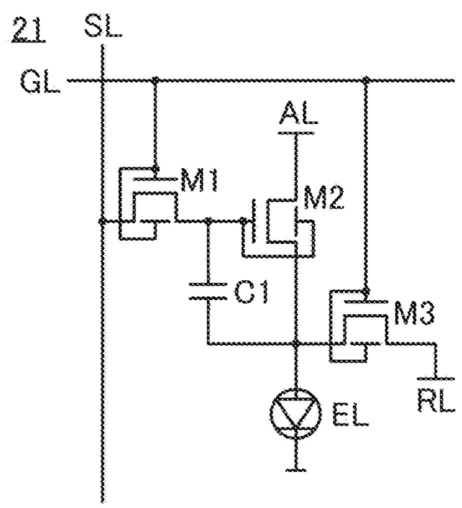

The pixel 21 illustrated in FIG. 27D is an example in which a transistor including a pair of gates is used as the transistor M2 in addition to the transistor M1 and the transistor M3. A pair of gates of the transistor M2 are electrically connected to each other. When such a transistor is used as the transistor M2, the saturation characteristics are improved, whereby emission luminance of the light-emitting device EL can be controlled easily and the display quality can be increased.

[Structure Example of Transistor]

Cross-sectional structure examples of a transistor that can be used in the aforementioned display apparatus are described below.

Structure Example 1

Figure 28A:
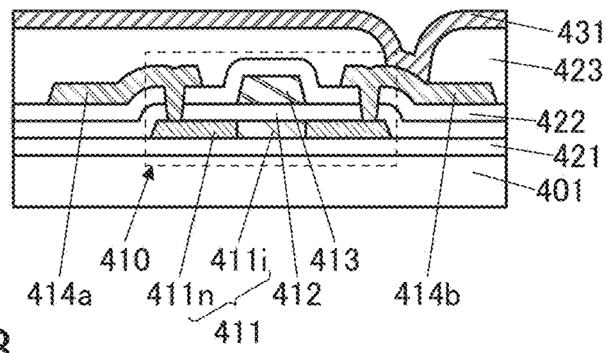
FIG. 28A to FIG. 28D are cross-sectional views of transistors of embodiments of the present invention.

FIG. 28A is a cross-sectional view including a transistor 410.

The transistor 410 is a transistor provided over a substrate 401 and containing polycrystalline silicon in its semiconductor layer. For example, the transistor 410 corresponds to the transistor M2 in the pixel 21. In other words, FIG. 28A illustrates an example in which one of a source and a drain of the transistor 410 is electrically connected to a conductive layer 431 of the light-emitting device.

The transistor 410 includes a semiconductor layer 411, an insulating layer 412, a conductive layer 413, and the like. The semiconductor layer 411 includes a channel formation region 411*i* and low-resistance regions 411*n*. The semiconductor layer 411 contains silicon. The semiconductor layer 411 preferably contains polycrystalline silicon. Part of the insulating layer 412 functions as agate insulating layer. Part of the conductive layer 413 functions as agate electrode.

Note that the semiconductor layer 411 can include a metal oxide exhibiting semiconductor characteristics (also referred to as an oxide semiconductor). In this case, the transistor 410 can be referred to as an OS transistor.

The low-resistance regions 411*n* are each a region containing an impurity element. For example, in the case where the transistor 410 is an n-channel transistor, phosphorus, arsenic, or the like is added to the low-resistance regions 411*n*. Meanwhile, in the case where the transistor 410 is a p-channel transistor, boron, aluminum, or the like is added to the low-resistance regions 411*n*. In addition, in order to control the threshold voltage of the transistor 410, the above-described impurity may be added to the channel formation region 411*i*.

An insulating layer 421 is provided over the substrate 401. The semiconductor layer 411 is provided over the insulating layer 421. The insulating layer 412 is provided to cover the semiconductor layer 411 and the insulating layer 421. The conductive layer 413 is provided at a position that is over the insulating layer 412 and overlaps with the semiconductor layer 411.

An insulating layer 422 is provided to cover the conductive layer 413 and the insulating layer 412. A conductive layer 414*a* and a conductive layer 414*b* are provided over the insulating layer 422. The conductive layer 414*a* and the conductive layer 414*b* are electrically connected to the low-resistance regions 411*n* in opening portions provided in the insulating layer 422 and the insulating layer 412. Part of the conductive layer 414*a* functions as one of a source electrode and a drain electrode and part of the conductive layer 414*b* functions as the other of the source electrode and the drain electrode. An insulating layer 423 is provided to cover the conductive layer 414*a*, the conductive layer 414*b*, and the insulating layer 422.

The conductive layer 431 functioning as a pixel electrode is provided over the insulating layer 423. The conductive layer 431 is provided over the insulating layer 423 and is electrically connected to the conductive layer 414*b* through an opening provided in the insulating layer 423. Although not illustrated here, an EL layer and a common electrode can be stacked over the conductive layer 431.

Structure Example 2

Figure 28B:
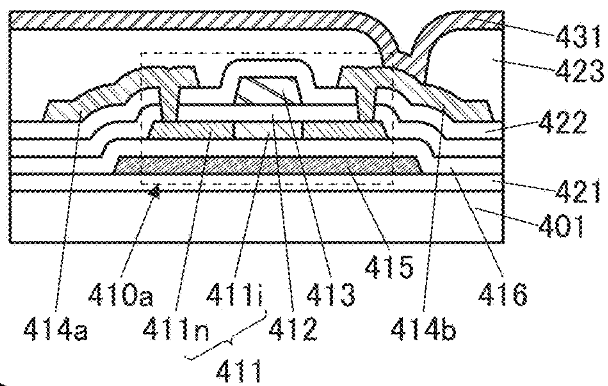

FIG. 28B illustrates a transistor 410*a* including a pair of gate electrodes. The transistor 410*a* illustrated in FIG. 28B is different from that in FIG. 28A mainly in including a conductive layer 415 and an insulating layer 416.

The conductive layer 415 is provided over the insulating layer 421. The insulating layer 416 is provided to cover the conductive layer 415 and the insulating layer 421. The semiconductor layer 411 is provided such that at least the channel formation region 411*i* overlaps with the conductive layer 415 with the insulating layer 416 therebetween.

In the transistor 410*a* illustrated in FIG. 28B, part of the conductive layer 413 functions as a first gate electrode, and part of the conductive layer 415 functions as a second gate electrode. At this time, part of the insulating layer 412 functions as a first gate insulating layer, and part of the insulating layer 416 functions as a second gate insulating layer.

Here, to electrically connect the first gate electrode to the second gate electrode, the conductive layer 413 is electrically connected to the conductive layer 415 through an opening portion provided in the insulating layer 412 and the insulating layer 416 in a region not illustrated. To electrically connect the second gate electrode to a source or a drain, the conductive layer 415 is electrically connected to the conductive layer 414*a* or the conductive layer 414*b* through an opening portion provided in the insulating layer 422, the insulating layer 412, and the insulating layer 416 in a region not illustrated.

In the case where LTPS transistors are used as all of the transistors included in the pixel 21, the transistor 410 illustrated in FIG. 28A as an example or the transistor 410*a* illustrated in FIG. 28B as an example can be used. In this case, the transistors 410*a* may be used as all of the transistors included in the pixels 21, the transistors 410 may be used as all of the transistors, or the transistors 410*a* and the transistors 410 may be used in combination.

Structure Example 3

Described below is an example of a structure including both a transistor containing silicon in its semiconductor layer and a transistor containing a metal oxide in its semiconductor layer.

Figure 28C:
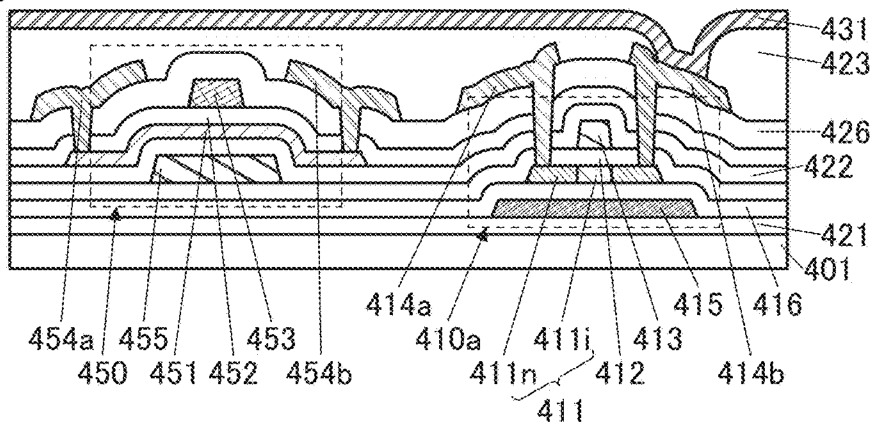

FIG. 28C is a schematic cross-sectional view including the transistor 410*a* and a transistor 450.

Structure example 1 described above can be referred to for the transistor 410*a*. Although an example using the transistor 410*a* is illustrated here, a structure including the transistor 410 and the transistor 450 or a structure including all the transistor 410, the transistor 410*a*, and the transistor 450 may alternatively be employed.

The transistor 450 is a transistor including metal oxide in its semiconductor layer. The structure in FIG. 28C illustrates an example in which the transistor 450 corresponds to the transistor M1 in the pixel 21 and the transistor 410*a* corresponds to the transistor M2. That is, FIG. 28C illustrates an example in which one of a source and a drain of the transistor 410*a* is electrically connected to the conductive layer 431.

Moreover, FIG. 28C illustrates an example in which the transistor 450 includes a pair of gates.

The transistor 450 includes a conductive layer 455, the insulating layer 422, a semiconductor layer 451, an insulating layer 452, a conductive layer 453, and the like. Part of the conductive layer 453 functions as a first gate of the transistor 450, and part of the conductive layer 455 functions as a second gate of the transistor 450. In this case, part of the insulating layer 452 functions as a first gate insulating layer of the transistor 450, and part of the insulating layer 422 functions as a second gate insulating layer of the transistor 450.

The conductive layer 455 is provided over the insulating layer 412. The insulating layer 422 is provided to cover the conductive layer 455. The semiconductor layer 451 is provided over the insulating layer 422. The insulating layer 452 is provided to cover the semiconductor layer 451 and the insulating layer 422. The conductive layer 453 is provided over the insulating layer 452 and includes a region overlapping with the semiconductor layer 451 and the conductive layer 455.

An insulating layer 426 is provided to cover the insulating layer 452 and the conductive layer 453. A conductive layer 454*a* and a conductive layer 454*b* are provided over the insulating layer 426. The conductive layer 454*a* and the conductive layer 454*b* are electrically connected to the semiconductor layer 451 in opening portions provided in the insulating layer 426 and the insulating layer 452. Part of the conductive layer 454*a* functions as one of a source electrode and a drain electrode and part of the conductive layer 454*b* functions as the other of the source electrode and the drain electrode. The insulating layer 423 is provided to cover the conductive layer 454*a*, the conductive layer 454*b*, and the insulating layer 426.

Here, the conductive layer 414*a* and the conductive layer 414*b* electrically connected to the transistor 410*a* are preferably formed by processing the same conductive film as the conductive layer 454*a* and the conductive layer 454*b*. FIG. 28C illustrates a structure in which the conductive layer 414*a*, the conductive layer 414*b*, the conductive layer 454*a*, and the conductive layer 454*b* are formed on the same plane (i.e., in contact with the top surface of the insulating layer 426) and contain the same metal element. In this case, the conductive layer 414*a* and the conductive layer 414*b* are electrically connected to the low-resistance regions 411*n* through openings provided in the insulating layer 426, the insulating layer 452, the insulating layer 422, and the insulating layer 412. This is preferable because the manufacturing process can be simplified.

Moreover, the conductive layer 413 functioning as the first gate electrode of the transistor 410*a* and the conductive layer 455 functioning as the second gate electrode of the transistor 450 are preferably formed by processing the same conductive film. FIG. 28C illustrates a structure in which the conductive layer 413 and the conductive layer 455 are formed on the same plane (i.e., in contact with the top surface of the insulating layer 412) and contain the same metal element. This is preferable because the manufacturing process can be simplified.

Figure 28D:
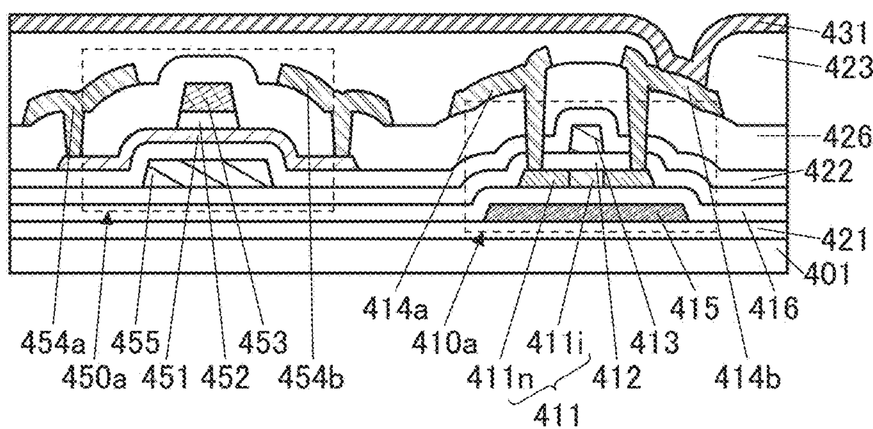

In the structure in FIG. 28C, the insulating layer 452 functioning as the first gate insulating layer of the transistor 450 covers an end portion of the semiconductor layer 451; however, the insulating layer 452 may be processed to have the same or substantially the same top surface shape as the conductive layer 453 as in the transistor 450*a* illustrated in FIG. 28D.

Note that in this specification and the like, the expression "top surface shapes are substantially the same" means that at least outlines of stacked layers partly overlap with each other. For example, the case of processing the upper layer and the lower layer with the use of the same mask pattern or mask patterns that are partly the same is included. However, in some cases, the outlines do not completely overlap with each other and the upper layer is positioned inward from the lower layer or the upper layer is positioned outward from the lower layer; such cases are also represented by the expression "top surface shapes are substantially the same".

Although the example in which the transistor 410*a* corresponds to the transistor M2 and is electrically connected to the pixel electrode is shown here, one embodiment of the present invention is not limited thereto. For example, a structure in which the transistor 450 or the transistor 450*a* corresponds to the transistor M2 may be employed. In that case, the transistor 410*a* corresponds to the transistor M1, the transistor M3, or another transistor.

This embodiment can be combined with the other embodiments as appropriate. In the case where a plurality of structure examples are described in one embodiment in this specification, the structure examples can be combined as appropriate.

Embodiment 5

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single crystal, and polycrystalline (poly crystal) can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a plurality of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state where one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region is a region containing indium oxide, indium zinc oxide, or the like as its main component. The second region is a region containing gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region is a region having a higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

On the other hand, the second region is a region having a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

A transistor using the CAC-OS has high reliability. Thus, the CAC-OS is most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/$cm^3$, preferably lower than or equal to $2\times10^{16}$ atoms/$cm^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

This embodiment can be combined with the other embodiments as appropriate. In the case where a plurality of structure examples are described in one embodiment in this specification, the structure examples can be combined as appropriate.

Embodiment 6

In this embodiment, electronic devices of embodiments of the present invention are described with reference to FIG. 29 to FIG. 33.

An electronic device of this embodiment is provided with the display apparatus of one embodiment of the present invention in a display portion. The display apparatus of one embodiment of the present invention can be easily increased in resolution and definition. Thus, the display apparatus of one embodiment of the present invention can be used for a display portion of a variety of electronic devices.

Examples of electronic devices include a digital camera, a digital video camera, a digital photo frame, a mobile phone, a portable game console, a portable information terminal, and an audio reproducing device in addition to electronic devices with a relatively large screen, such as a television device, a desktop or laptop personal computer, a monitor of a computer or the like, digital signage, and a large game machine like a pachinko machine.

In particular, a display apparatus of one embodiment of the present invention can have high resolution, and thus can be favorably used for an electronic device having a relatively small display portion. Examples of such an electronic device include a watch-type or a bracelet-type information terminal device (wearable device), and a wearable device capable of being worn on a head, such as a VR device such as a head mounted display, a glasses-type AR device, and an MR device.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the definition is preferably 4K, 8K, or higher. Furthermore, the pixel density (resolution) of the display apparatus of one embodiment of the present invention is preferably higher than or equal to 100 ppi, higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With the use of such a display apparatus with one or both of high definition and high resolution, the electronic device can have higher realistic sensation, sense of depth, and the like in personal use such as portable use and home use. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of wearable devices capable of being worn on a head are described with reference to FIG. 29A, FIG. 29B, FIG. 30A, and FIG. 30B. These wearable devices have one or both of a function of displaying AR contents and a function of displaying VR contents. Note that these wearable devices may have a function of displaying SR or MR contents, in addition to AR and VR contents. The electronic device having a function of displaying contents of AR, VR, SR, MR, or the like enables the user to reach a higher level of immersion.

Figure 29A:
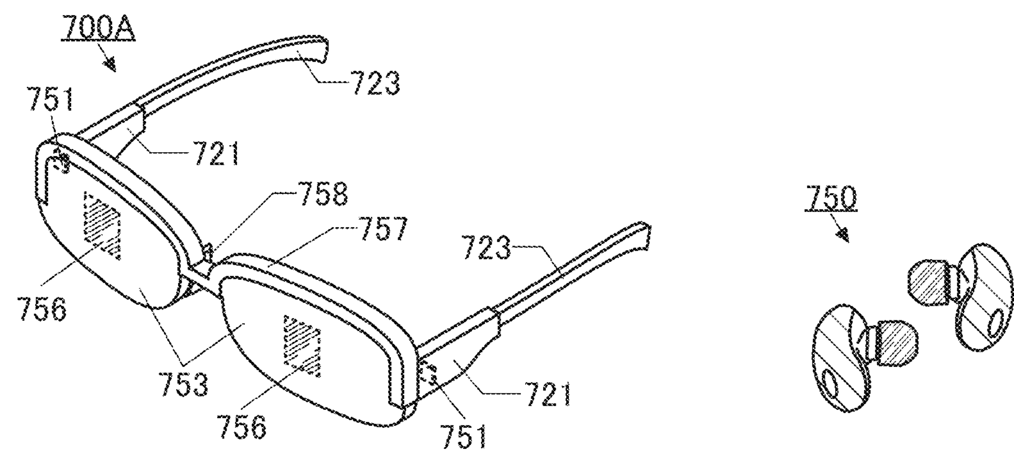
FIG. 29A and FIG. 29B are perspective views of electronic devices of embodiments of the present invention.
Figure 29B:
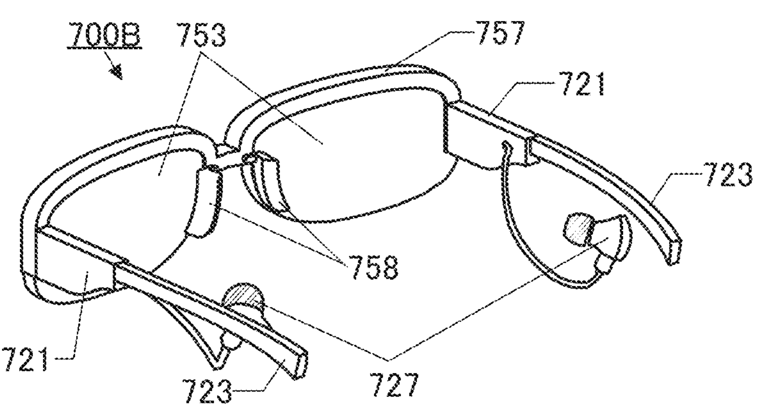

An electronic device 700A illustrated in FIG. 29A and an electronic device 700B illustrated in FIG. 29B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display apparatus of one embodiment of the present invention can be used for the display panel 751. Thus, the electronic device can perform display with extremely high resolution.

The electronic device 700A and the electronic device 700B can each project an image displayed on the display panel 751 onto display regions 756 of the optical members 753. Since the optical members 753 have a light-transmitting property, a user can see images displayed on the display regions, which are superimposed on transmission images seen through the optical members 753. Accordingly, the electronic device 700A and the electronic device 700B are electronic devices capable of AR display.

In the electronic device 700A and the electronic device 700B, a camera capable of capturing images of the front side may be provided as the image capturing portion. Furthermore, when the electronic device 700A and the electronic device 700B are provided with an acceleration sensor such as a gyroscope sensor, the orientation of the user's head can be sensed and an image corresponding to the orientation can be displayed on the display region 756.

The communication portion includes a wireless communication device, and a video signal and the like can be supplied by the wireless communication device. Note that instead of the wireless communication device or in addition to the wireless communication device, a connector to which a cable for supplying a video signal and a power supply potential can be connected may be provided.

The electronic device 700A and the electronic device 700B are provided with a battery so that they can be charged wirelessly and/or by wire.

A touch sensor module may be provided in the housing 721. The touch sensor module has a function of detecting a touch on the outer surface of the housing 721. A tap operation or a slide operation, for example, by the user can be detected with the touch sensor module, whereby a variety of processing can be executed. For example, processing such as a pause or a restart of a moving image can be executed by a tap operation, and processing such as fast forward and fast rewind can be executed by a slide operation. The touch sensor module is provided in each of the two housings 721, whereby the range of the operation can be increased.

A variety of touch sensors can be applied to the touch sensor module. Any of touch sensors of various types such as a capacitive type, a resistive type, an infrared type, an electromagnetic induction type, a surface acoustic wave type, and an optical type can be employed. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

Figure 30A:
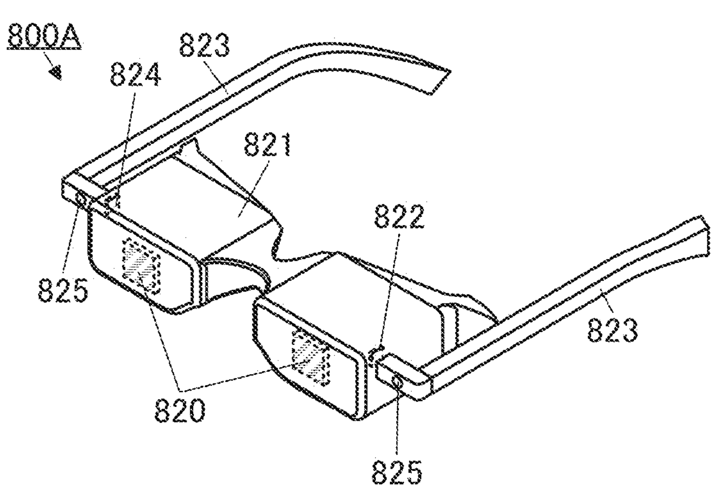
FIG. 30A and FIG. 30B are perspective views of electronic devices of embodiments of the present invention.
Figure 30A:
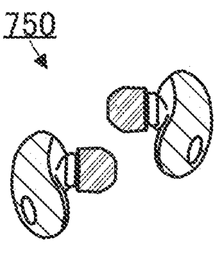
Figure 30B:
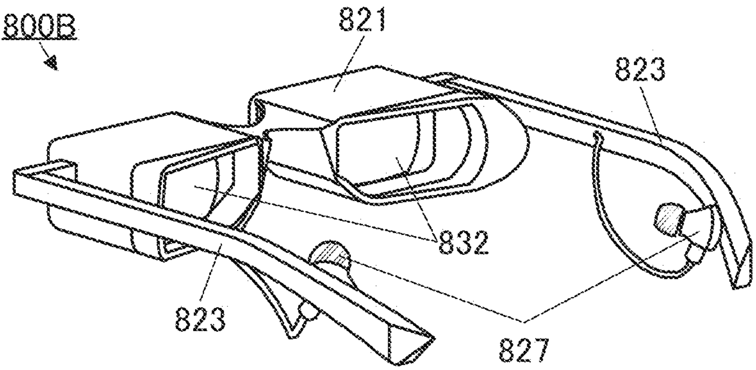

An electronic device 800A illustrated in FIG. 30A and an electronic device 800B illustrated in FIG. 30B each include a pair of display portions 820, a housing 821, a communication portion 822, a pair of wearing portions 823, a control portion 824, a pair of image capturing portions 825, and a pair of lenses 832.

A display apparatus of one embodiment of the present invention can be used in the display portions 820. Thus, the electronic device can perform display with extremely high resolution. This enables a user to feel high sense of immersion.

The display portions 820 are positioned inside the housing 821 so as to be seen through the lenses 832. When the pair of display portions 820 display different images, three-dimensional display using parallax can be performed.

The electronic device 800A and the electronic device 800B can be regarded as VR electronic devices. The user who wears the electronic device 800A or the electronic device 800B can see images displayed on the display portions 820 through the lenses 832.

The electronic device 800A and the electronic device 800B preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B preferably include a mechanism for adjusting focus by changing the distance between the lenses 832 and the display portions 820.

The electronic device 800A or the electronic device 800B can be mounted on the user's head with the wearing portions 823. FIG. 30A or the like illustrates an example in which the wearing portion 823 has a shape like a temple (also referred to as a joint or the like) of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example of including the image capturing portion 825 is described here, a range sensor (hereinafter, also referred to as a sensing portion) that is capable of measuring a distance from an object just needs to be provided. That is, the image capturing portion 825 is one embodiment of the sensing portion. As the sensing portion, an image sensor or a distance image sensor such as LIDAR (Light Detection and Ranging) can be used, for example. With the use of images obtained by the camera and images obtained by the distance image sensor, more pieces of information can be obtained and a gesture operation with higher accuracy is possible.

The electronic device 800A may include a vibration mechanism that functions as bone-conduction earphones. For example, a structure including the vibration mechanism can be applied to any one or more of the display portion 820, the housing 821, and the wearing portion 823. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a video signal from a video output device or the like, electric power for charging a battery provided in the electronic device, and the like can be connected.

The electronic device of one embodiment of the present invention may have a function of performing wireless communication with earphones 750. The earphones 750 include a communication portion (not illustrated) and have a wireless communication function. The earphones 750 can receive information (e.g., audio data) from the electronic device with the wireless communication function. For example, the electronic device 700A illustrated in FIG. 29A has a function of transmitting information to the earphones 750 with the wireless communication function. As another example, the electronic device 800A illustrated in FIG. 30A has a function of transmitting information to the earphones 750 with the wireless communication function.

The electronic device may include an earphone portion. The electronic device 700B illustrated in FIG. 29B includes earphone portions 727. For example, a structure in which the earphone portions 727 and the control portion are connected to each other by wire may be employed. Part of a wiring that connects the earphone portions 727 and the control portion may be positioned inside the housing 721 or the wearing portion 723.

Similarly, the electronic device 800B illustrated in FIG. 30B includes earphone portions 827. For example, a structure in which the earphone portions 827 and the control portion 824 are connected to each other by wire may be employed. Part of a wiring that connects the earphone portions 827 and the control portion 824 may be positioned inside the housing 821 or the wearing portion 823. The earphone portions 827 and the wearing portion 823 may include magnets. This is preferable because the earphone portions 827 can be fixed to the wearing portion 823 with magnetic force and thus can be easily housed.

Note that the electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a so-called headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

Figure 31A:
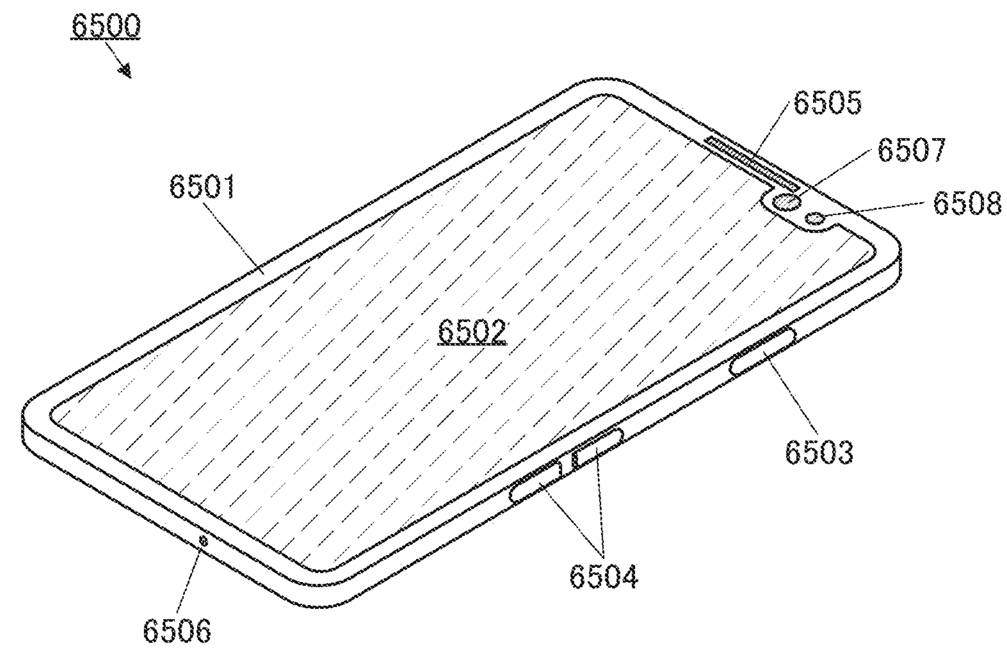
FIG. 31A is a perspective view of an electronic device of one embodiment of the present invention.

An electronic device 6500 illustrated in FIG. 31A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 31B:
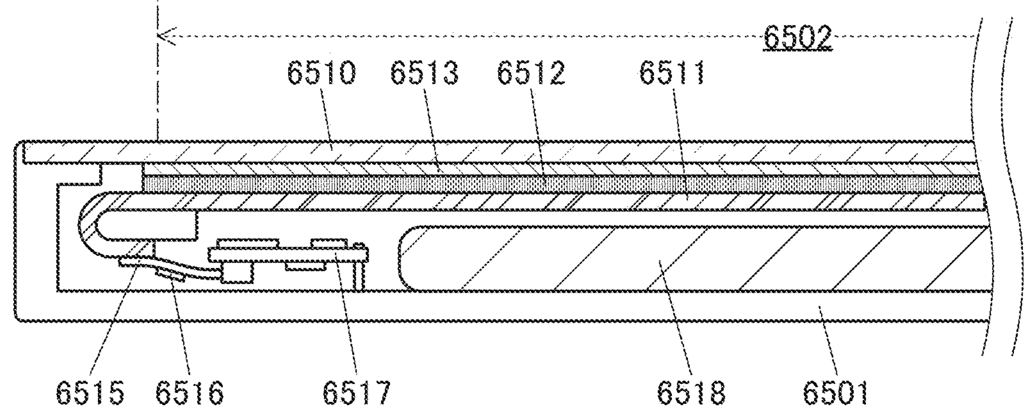
FIG. 31B is a cross-sectional view of the electronic device of one embodiment of the present invention.

FIG. 31B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is reduced. Moreover, part of the display panel 6511 is folded back so that a connection portion with the FPC 6515 is provided on the back side of the pixel portion, whereby an electronic device with a narrow bezel can be achieved.

FIG. 32A illustrates an example of a television device. In a television device 7100, a display portion 7000 is incorporated in a housing 7101. Here, the housing 7101 is supported by a stand 7103.

The display apparatus of one embodiment of the present invention can be used for the display portion 7000.

Operation of the television device 7100 illustrated in FIG. 32A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 32B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000.

FIG. 32C and FIG. 32D illustrate examples of digital signage.

Digital signage 7300 illustrated in FIG. 32C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 32D is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 32C and FIG. 32D.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of an image or a moving image on the display portion 7000, intuitive operation by a user is possible. Moreover, for an application for providing information such as route information or traffic information, usability can be enhanced by intuitive operation.

As illustrated in FIG. 32C and FIG. 32D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 33A to FIG. 33G each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 33A to FIG. 33G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The electronic devices illustrated in FIG. 33A to FIG. 33G are described in detail below.

FIG. 33A is a perspective view showing a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 33A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

FIG. 33B is a perspective view showing a portable information terminal 9102. The portable information terminal 9102 has a function of displaying information on three or more surfaces of the display portion 9001. Shown here is an example in which information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

FIG. 33C is a perspective view of a tablet terminal 9103. The tablet terminal 9103 is capable of executing a variety of applications such as mobile phone calls, e-mailing, viewing and editing texts, music reproduction, Internet communication, and a computer game. The tablet terminal 9103 includes the display portion 9001, a camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

FIG. 33D is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

FIG. 33E to FIG. 33G are perspective views illustrating a foldable portable information terminal 9201. FIG. 33E is a perspective view of an opened state of the portable information terminal 9201, FIG. 33G is a perspective view of a folded state thereof, and FIG. 33F is a perspective view of a state in the middle of change from one of FIG. 33E and FIG. 33G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined with the other embodiments as appropriate. In the case where a plurality of structure examples are described in one embodiment in this specification, the structure examples can be combined as appropriate.

REFERENCE NUMERALS

100: display apparatus, 101: substrate, 102: layer, 103: insulating layer, 104: pixel portion, 111: conductive layer, 113: organic compound layer, 114: electron-injection layer, 115: conductive layer, 118: sacrificial layer, 120: substrate, 122: resin layer, 125: insulating layer, 127: insulating layer, 130: light-emitting device, 131: protective layer, 140: connection portion, Da: thickness, db: thickness, Dc: thickness

The invention claimed is:

1. A display apparatus comprising:
- a first light-emitting device;
- a second light-emitting device positioned next to the first light-emitting device;
- a third light-emitting device positioned next to the second light-emitting device;
- a first insulating layer; and
- a second insulating layer,
- wherein the first light-emitting device to the third light-emitting device each comprise a lower electrode, an organic compound layer over the lower electrode, and an upper electrode over the organic compound layer,
- wherein in a cross-sectional view, the first insulating layer comprises a first region between the first light-emitting device and the second light-emitting device and a second region between the second light-emitting device and the third light-emitting device,
- wherein the second insulating layer comprises a region positioned over the lower electrode of the third light-emitting device,
- wherein a thickness of the organic compound layer of the third light-emitting device is different from a thickness of the organic compound layer of the first light-emitting device,
- wherein the thickness of the organic compound layer of the third light-emitting device is different from a thickness of the organic compound layer of the second light-emitting device, and
- wherein in the cross-sectional view, the first insulating layer is provided so that a height from a bottom surface of the lower electrode of the third light-emitting device is equal to a height from a bottom surface of the lower electrode of the second light-emitting device.

2. The display apparatus according to claim 1, further comprising:
- a first sacrificial layer selectively provided over the organic compound layer of the first light-emitting device;
- a second sacrificial layer selectively provided over the organic compound layer of the second light-emitting device; and
- a third sacrificial layer selectively provided over the organic compound layer of the third light-emitting device.

3. A display apparatus comprising:
- a first light-emitting device;
- a second light-emitting device positioned next to the first light-emitting device;
- a third light-emitting device positioned next to the second light-emitting device;
- a first insulating layer; and
- a second insulating layer,
- wherein the first light-emitting device to the third light-emitting device each comprise a lower electrode, an organic compound layer over the lower electrode, and an upper electrode over the organic compound layer,
- wherein in a cross-sectional view, the first insulating layer comprises a first region between the first light-emitting device and the second light-emitting device and a second region between the second light-emitting device and the third light-emitting device,
- wherein the second insulating layer comprises a region overlapping with the lower electrode of the third light-emitting device,
- wherein a thickness of the organic compound layer of the third light-emitting device is smaller than a thickness of the organic compound layer of the first light-emitting device, wherein the thickness of the organic compound layer of the third light-emitting device is smaller than a thickness of the organic compound layer of the second light-emitting device, and wherein in the cross-sectional view, the first insulating layer is provided so that a height from a bottom surface of the lower electrode of the third light-emitting device is equal to a height from a bottom surface of the lower electrode of the second light-emitting device.

4. The display apparatus according to claim 3, further comprising:

a first sacrificial layer selectively provided over the organic compound layer of the first light-emitting device;

a second sacrificial layer selectively provided over the organic compound layer of the second light-emitting device; and a third sacrificial layer selectively provided over the organic compound layer of the third light-emitting device.

5. A display apparatus comprising:

a first conductive layer and a second conductive layer each provided over a first layer;

a first organic compound layer comprising a region overlapping with the first conductive layer;

a first insulating layer comprising a region overlapping with the second conductive layer;

a second organic compound layer comprising a region overlapping with the second conductive layer and the first insulating layer;

a first sacrificial layer comprising a region overlapping with the first organic compound layer;

a second sacrificial layer comprising a region overlapping with the second organic compound layer;

a second insulating layer comprising a region overlapping with the first sacrificial layer and the second sacrificial layer; and a third conductive layer comprising a region overlapping with the second insulating layer, wherein a distance between the second conductive layer and the third conductive layer is different from a distance between the first conductive layer and the third conductive layer, wherein between the first conductive layer and the second conductive layer, the first layer comprises a first depressed portion and a second depressed portion deeper than the first depressed portion, wherein the first insulating layer overlaps with the second depressed portion, and wherein the second insulating layer overlaps with the first depressed portion and the second depressed portion.

6. The display apparatus according to claim 5, further comprising a protective layer over the third conductive layer.

7. A display apparatus comprising:

a first conductive layer and a second conductive layer each provided over a first layer;

a first organic compound layer comprising a region overlapping with the first conductive layer;

a first insulating layer comprising a region overlapping with the second conductive layer;

a second organic compound layer comprising a region overlapping with the second conductive layer and the first insulating layer;

a first sacrificial layer comprising a region overlapping with the first organic compound layer;

a second sacrificial layer comprising a region overlapping with the second organic compound layer;

a second insulating layer comprising a region overlapping with the first sacrificial layer and the second sacrificial layer; and a third conductive layer comprising a region overlapping with the second insulating layer, wherein a distance between the second conductive layer and the third conductive layer is shorter than a distance between the first conductive layer and the third conductive layer, wherein between the first conductive layer and the second conductive layer, the first layer comprises a first depressed portion and a second depressed portion deeper than the first depressed portion, wherein the first insulating layer overlaps with the second depressed portion, and wherein the second insulating layer overlaps with the first depressed portion and the second depressed portion.

8. The display apparatus according to claim 7, further comprising a protective layer over the third conductive layer.

* * * * *